US012707890B2

(12) United States Patent
Niikura et al.

(10) Patent No.: US 12,707,890 B2
(45) Date of Patent: Aug. 11, 2026

(54) PHOTOELECTRIC CONVERSION DEVICE AND DISPLAY DEVICE

(71) Applicant: SEMICONDUCTOR ENERGY LABORATORY CO., LTD., Atsugi (JP)

(72) Inventors: Yasuhiro Niikura, Tokyo (JP); Daisuke Kubota, Atsugi (JP); Taisuke Kamada, Niiza (JP); Sachiko Kawakami, Atsugi (JP); Anna Tada, Isehara (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 370 days.

(21) Appl. No.: 18/682,365

(22) PCT Filed: Aug. 3, 2022

(86) PCT No.: PCT/IB2022/057180
§ 371 (c)(1),
(2) Date: Feb. 8, 2024

(87) PCT Pub. No.: WO2023/017365
PCT Pub. Date: Feb. 16, 2023

(65) Prior Publication Data

US 2024/0357929 A1 Oct. 24, 2024

(30) Foreign Application Priority Data

Aug. 12, 2021 (JP) ................................ 2021-131599

(51) Int. Cl.
*H10K 85/60* (2023.01)
*H10K 30/40* (2023.01)
(Continued)

(52) U.S. Cl.
CPC ......... *H10K 85/6572* (2023.02); *H10K 30/40* (2023.02); *H10K 39/34* (2023.02);
(Continued)

(58) Field of Classification Search
CPC .... H10K 85/6572; H10K 30/40; H10K 39/34; H10K 85/636; H10K 85/6576;
(Continued)

(56) References Cited

U.S. PATENT DOCUMENTS 10,224,494 B2 3/2019 Watabe et al.
10,333,078 B2 6/2019 Tanabe et al.
(Continued)

FOREIGN PATENT DOCUMENTS

CN 106687561 A 5/2017
CN 113793905 A 12/2021
(Continued)

OTHER PUBLICATIONS

Lundberg.P et al., "Thermally activated delayed fluorescence with 7% external quantum efficiency from a light-emitting electrochemical cell", Nature Communications, Nov. 22, 2019, vol. 10, pp. 5307-1-5307-11.

(Continued)

*Primary Examiner* — Victor A Mandala
(74) *Attorney, Agent, or Firm* — Fish & Richardson P.C.

(57) ABSTRACT

A novel photoelectric conversion device that is highly convenient, useful, or reliable is provided. A photoelectric conversion device (550S) includes a first electrode (551S), a second electrode (552S), and a unit (103S); the unit (103S) is interposed between the first electrode (551S) and the second electrode (552S); the unit (103S) includes a first layer (113) and a second layer (114S); and the first layer (113) is interposed between the second electrode (552S) and the second layer (114S). The first layer (113) contains a first
(Continued)

organic compound ETM, the first organic compound ETM has an electron-transport property, and the first organic compound ETM has a LUMO level in a first level LUMO1. The second layer (114S) contains a second organic compound CTM, the second organic compound CTM emits delayed fluorescent light at room temperature, and the second organic compound CTM has a LUMO level in a second level LUMO2. A difference between the second level LUMO2 and the first level LUMO1 is less than or equal to 1.0 eV.

18 Claims, 16 Drawing Sheets

(51) Int. Cl.
*H10K 39/34* (2026.01)
*H10K 101/30* (2023.01)

(52) U.S. Cl.
CPC ....... *H10K 85/636* (2023.02); *H10K 85/6576* (2023.02); *H10K 2101/30* (2023.02)

(58) Field of Classification Search
CPC .... H10K 2101/30; H10K 30/60; H10K 39/32; H10K 50/00; H10K 59/00; H10K 85/649; H10K 30/81; H10K 30/85; H10K 50/15; H10K 59/1213; H10K 59/1216; H10K 59/123; H10K 59/805; H10K 85/631; H10K 85/657; G09F 9/00; G09F 9/30; Y02E 10/549
See application file for complete search history.

(56) References Cited

U.S. PATENT DOCUMENTS

| | | | | |
|---|---|---|---|---|
| 10,535,830 | B2 | 1/2020 | Sasaki et al. | |
| 11,610,529 | B2 | 3/2023 | Watanabe et al. | |
| 11,871,641 | B2 | 1/2024 | Yamazaki et al. | |
| 2017/0069852 | A1* | 3/2017 | Kanamoto | C09K 11/06 |
| 2017/0092889 | A1* | 3/2017 | Seo | C07D 241/38 |
| 2017/0309828 | A1 | 10/2017 | Tanabe et al. | |
| 2020/0343469 | A1* | 10/2020 | Ohsawa | C09K 11/06 |
| 2021/0028376 | A1* | 1/2021 | Thompson | H10K 85/6574 |
| 2021/0193943 | A1* | 6/2021 | Ohsawa | C09K 11/06 |
| 2022/0013731 | A1* | 1/2022 | Lin | H10K 85/324 |
| 2022/0109106 | A1* | 4/2022 | Thompson | C07F 15/008 |
| 2022/0181572 | A1 | 6/2022 | Ohsawa et al. | |
| 2022/0216445 | A1 | 7/2022 | Seo et al. | |
| 2022/0376182 | A1* | 11/2022 | Kubota | C07D 333/76 |
| 2024/0074308 | A1* | 2/2024 | Lee | H10K 85/6572 |
| 2024/0357845 | A1* | 10/2024 | Seo | H10K 50/11 |
| 2026/0042958 | A1* | 2/2026 | Margulies | C09K 11/06 |

FOREIGN PATENT DOCUMENTS

| | | |
|---|---|---|
| JP | 2012-037703 A | 2/2012 |
| TW | 201500359 | 1/2015 |
| WO | WO-2014/156771 | 10/2014 |
| WO | WO-2016/046350 | 3/2016 |
| WO | WO-2020/152556 | 7/2020 |

OTHER PUBLICATIONS

International Search Report (Application No. PCT/IB2022/057180) Dated Nov. 8, 2022.
Written Opinion (Application No. PCT/IB2022/057180) Dated Nov. 8, 2022.

* cited by examiner

FIG. 3A
FIG. 3B
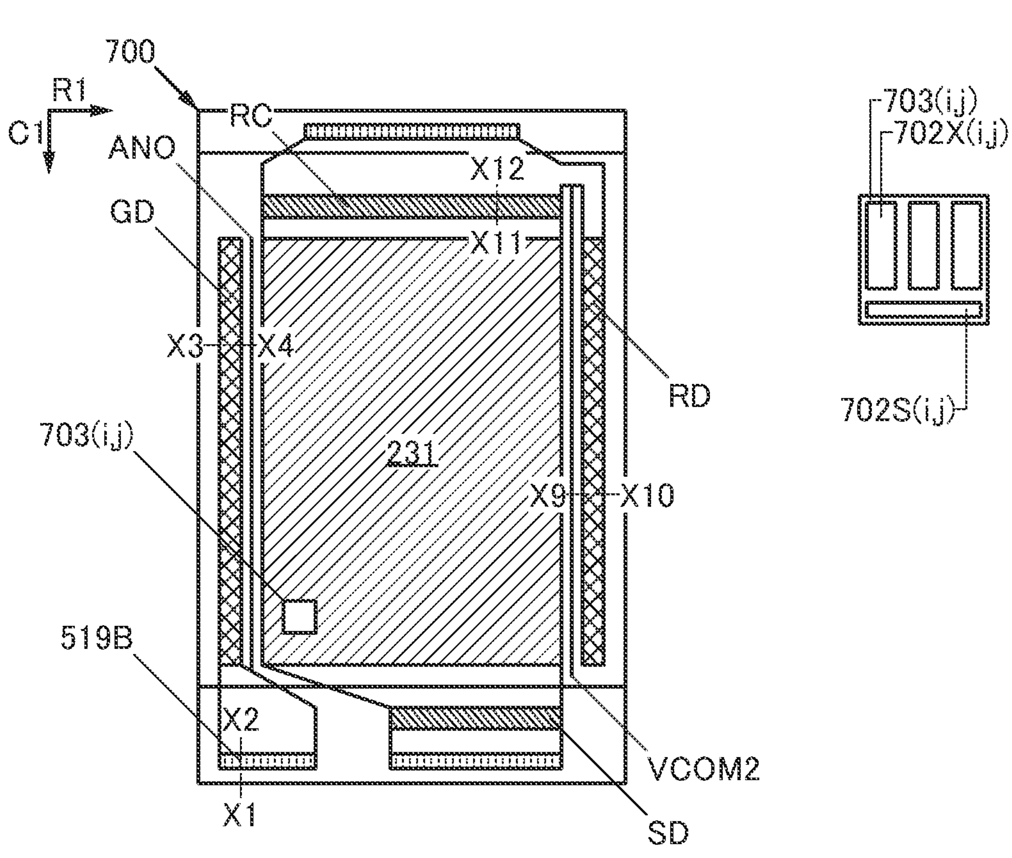
FIG. 3C
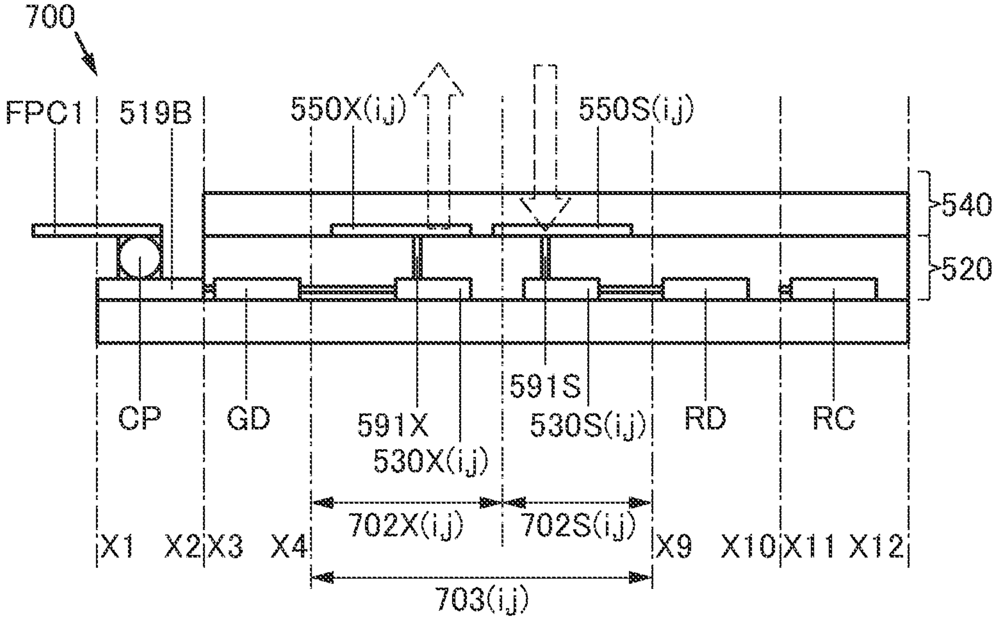

FIG. 10A
FIG. 10D
FIG. 10B
FIG. 10E
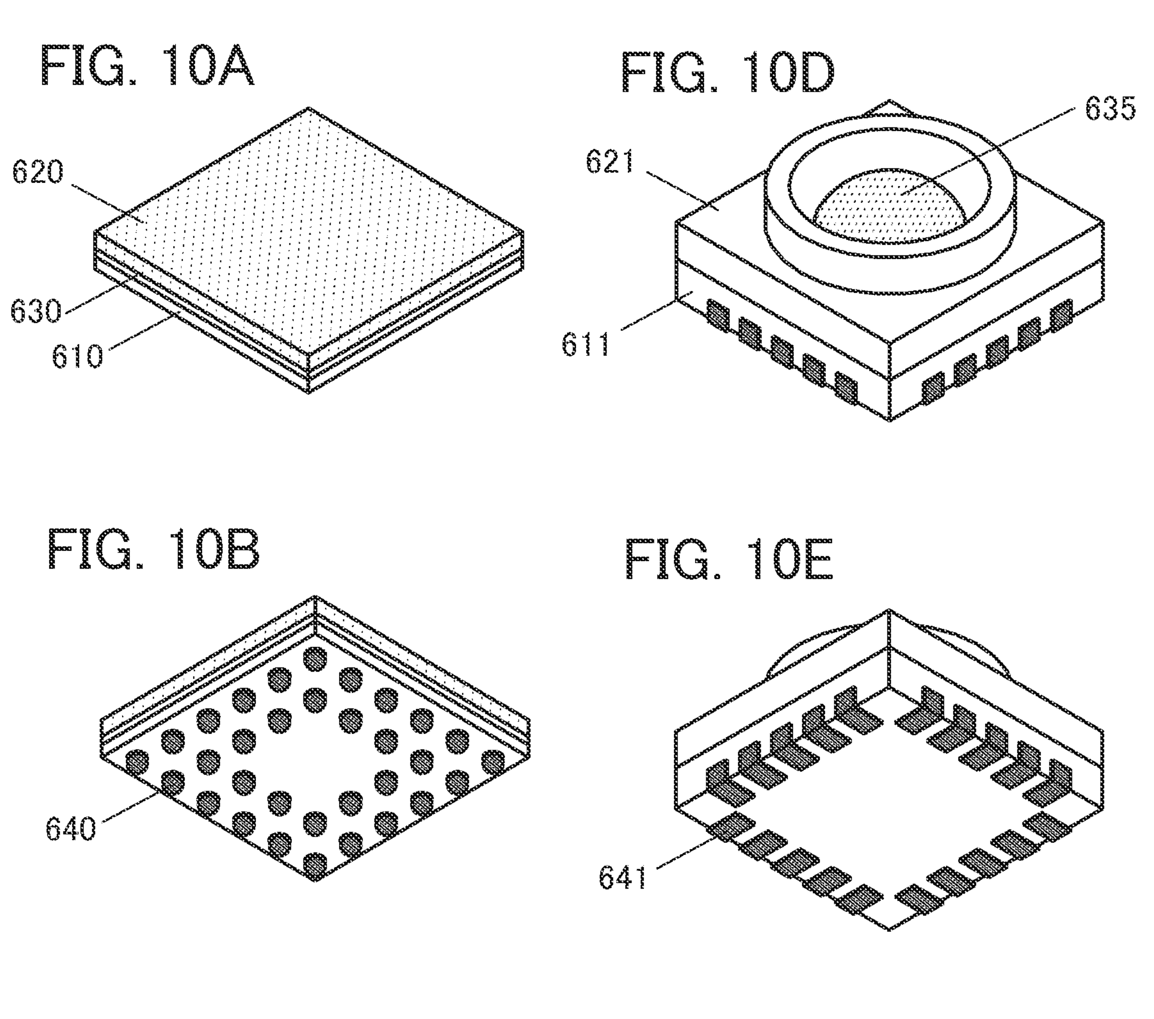
FIG. 10C
FIG. 10F
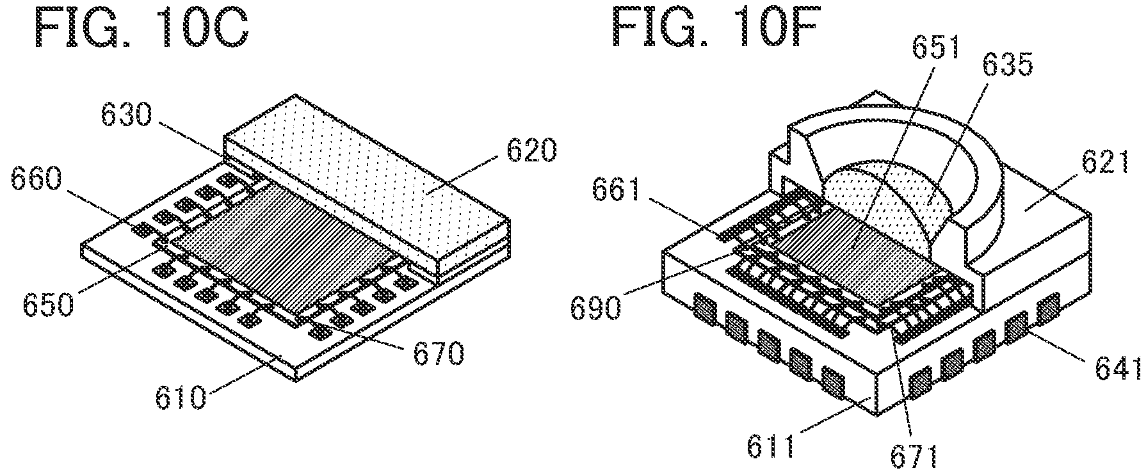

PHOTOELECTRIC CONVERSION DEVICE AND DISPLAY DEVICE

CROSS REFERENCE TO RELATED APPLICATIONS

This application is a U.S. National Phase Application under 35 U.S.C. § 371 of International Application PCT/IB2022/057180, filed on Aug. 3, 2022, which is incorporated by reference and claims the benefit of a foreign priority application filed in Japan on Aug. 12, 2021, as Application No. 2021-131599.

TECHNICAL FIELD

One embodiment of the present invention relates to a photoelectric conversion device, a display device, or a semiconductor device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, specific examples of the technical field of one embodiment of the present invention disclosed in this specification include a photoelectric conversion device, a display device, a semiconductor device, a method for driving any of them, and a method for manufacturing any of them.

BACKGROUND ART

A functional panel in which a pixel provided in a display region includes a light-emitting element and a photoelectric conversion element is known (Patent Document 1). For example, the functional panel includes a first driver circuit, a second driver circuit, and a region, the first driver circuit supplies a first selection signal, the second driver circuit supplies a second selection signal and a third selection signal, and the region includes a pixel. The pixel includes a first pixel circuit, a light-emitting element, a second pixel circuit, and a photoelectric conversion element. The first pixel circuit is supplied with the first selection signal, the first pixel circuit obtains an image signal on the basis of the first selection signal, the light-emitting element is electrically connected to the first pixel circuit, and the light-emitting element emits light on the basis of the image signal. The second pixel circuit is supplied with the second selection signal and the third selection signal in a period during which the first selection signal is not supplied, the second pixel circuit obtains an imaging signal on the basis of the second selection signal and supplies the imaging signal on the basis of the third selection signal, and the photoelectric conversion element is electrically connected to the second pixel circuit and the photoelectric conversion element generates the imaging signal.

REFERENCE

Patent Document

[Patent Document 1] WO2020/152556

SUMMARY OF THE INVENTION

Problems to be Solved by the Invention

An object of one embodiment of the present invention is to provide a novel photoelectric conversion device that is highly convenient, useful, or reliable. Another object is to provide a novel display device that is highly convenient, useful, or reliable. Another object is to provide a novel electronic device that is highly convenient, useful, or reliable. Another object is to provide a novel photoelectric conversion device, a novel display device, a novel electronic device, or a novel semiconductor device.

Note that the description of these objects does not preclude the existence of other objects. Note that in one embodiment of the present invention, there is no need to achieve all of these objects. Note that other objects will be apparent from the description of the specification, the drawings, the claims, and the like, and other objects can be derived from the description of the specification, the drawings, the claims, and the like.

Means for Solving the Problems (1) One embodiment of the present invention is a photoelectric conversion device including a first electrode, a second electrode, and a first unit.

The first unit is interposed between the first electrode and the second electrode, the first unit includes a first layer and a second layer, and the first layer is interposed between the second electrode and the second layer.

The first layer contains a first organic compound ETM, and the first organic compound ETM has an electron-transport property. The first organic compound ETM has a LUMO level in a first level LUMO1.

The second layer contains a second organic compound CTM, the second organic compound CTM emits delayed fluorescent light at room temperature, and the second organic compound CTM has a LUMO level in a second level LUMO2. A difference between the second level LUMO2 and the first level LUMO1 is less than or equal to 1.0 eV.

Thus, intramolecular charge transfer can be induced in the second organic compound CTM which is brought into an excited state by absorbing light. The excited state lifetime can be long. The efficiency of charge separation can be increased. Photocurrent derived from intramolecular charge transfer can be obtained. The efficiency of converting irradiated light into current can be increased. The organic compound CTM can be deposited by evaporation at a lower temperature than fullerene, for example. Electron transfer from the second layer to the first layer can be facilitated. The operation voltage of the photoelectric conversion device can be reduced. Consequently, a novel photoelectric conversion device that is highly convenient, useful, or reliable can be provided.

(2) Another embodiment of the present invention is the photoelectric conversion device in which the second layer contains a third organic compound AM and the third organic compound AM has an electron-accepting property with respect to the second organic compound.

(3) Another embodiment of the present invention is the photoelectric conversion device in which the second layer includes a third layer and a fourth layer.

The third layer is interposed between the first layer and the fourth layer, the third layer is in contact with the fourth layer, and the third layer contains the third organic compound AM. The fourth layer contains the second organic compound CTM.

Thus, charge transfer from the second organic compound CTM which is brought into an excited state by absorbing light to the third organic compound AM can be promoted. Generation of excitons due to charge transfer can be promoted. The efficiency of charge separation can be increased.

The efficiency of converting irradiated light into current can be increased. A wavelength band of light absorbed by the second layer can be widened. The spectral sensitivity characteristic can be adjusted. Irradiated light can be converted into current. Consequently, a novel photoelectric conversion device that is highly convenient, useful, or reliable can be provided.

(4) Another embodiment of the present invention is the photoelectric conversion device in which the second organic compound CTM has a structure represented by General Formula (G0) below.

[Chemical Formula 1]

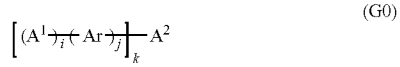

(G0)

Note that in General Formula (G0) above, $A^1$ represents an amine skeleton or a carbazolyl group, and the amine skeleton includes an aryl group or a heteroaryl group. The amine skeleton may include only a plurality of aryl groups, only a plurality of heteroaryl groups, or both an aryl group and a heteroaryl group, in which case the aryl groups may be bonded to each other, the heteroaryl groups may be bonded to each other, or the aryl group and the heteroaryl group may be bonded to each other to form a condensed ring. The aryl group is substituted or unsubstituted, and the heteroaryl group is substituted or unsubstituted. The carbazolyl group is substituted or unsubstituted.

In addition, Ar represents a substituted or unsubstituted arylene group having 6 to 25 carbon atoms or a substituted or unsubstituted heteroarylene group having 2 to 25 carbon atoms. The Ar may be formed of a plurality of aromatic rings, in which case the plurality of aromatic rings may be bonded to each other to form a condensed ring.

Furthermore, $A^2$ represents an arylene group having 6 to 25 carbon atoms. The arylene group includes at least one substituent, and the substituent is a cyano group, a substituted or unsubstituted acyl group, a substituted or unsubstituted alkoxy group, a substituted or unsubstituted haloalkyl group, a substituted or unsubstituted cycloalkoxy group, or a substituted or unsubstituted cycloalkyl group. Note that the alkoxy group has 1 to 6 carbon atoms, the haloalkyl group has 1 to 6 carbon atoms, and the cycloalkoxy group has 3 to 8 carbon atoms.

Note that i is an integer greater than or equal to 1 and less than or equal to 5, j is an integer greater than or equal to 0 and less than or equal to 2, and k is an integer greater than or equal to 1 and less than or equal to 6.

(5) Another embodiment of the present invention is the photoelectric conversion device in which the second organic compound CTM has a structure represented by General Formula (G0) below.

[Chemical Formula 2]

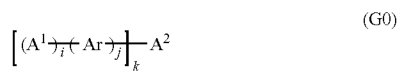

(G0)

Note that in General Formula (G0) above, $A^1$ represents an amine skeleton or a carbazolyl group, and the amine skeleton includes an aryl group or a heteroaryl group. The amine skeleton may include only a plurality of aryl groups, only a plurality of heteroaryl groups, or an aryl group and a heteroaryl group, in which case the aryl groups may be bonded to each other, the heteroaryl groups may be bonded to each other, or the aryl group and the heteroaryl group may be bonded to each other to form a condensed ring. The aryl group is substituted or unsubstituted, and the heteroaryl group is substituted or unsubstituted. The carbazolyl group is substituted or unsubstituted.

In addition, Ar represents a substituted or unsubstituted arylene group having 6 to 25 carbon atoms or a substituted or unsubstituted heteroarylene group having 2 to 25 carbon atoms. The Ar may be formed of a plurality of aromatic rings, in which case the plurality of aromatic rings may be bonded to each other to form a condensed ring.

Furthermore, $A^2$ represents a substituted or unsubstituted heteroaryl group having 2 to 25 carbon atoms or a substituted or unsubstituted heteroarylene group having 2 to 25 carbon atoms.

Note that i is an integer greater than or equal to 1 and less than or equal to 5, j is an integer greater than or equal to 0 and less than or equal to 2, and k is an integer greater than or equal to 1 and less than or equal to 6.

Thus, intramolecular charge transfer can be induced in the organic compound CTM which is brought into an excited state by absorbing light. The efficiency of charge separation can be increased. Photocurrent derived from intramolecular charge transfer can be obtained. The efficiency of converting irradiated light into current can be increased. The organic compound CTM can be deposited by evaporation at a lower temperature than fullerene, for example. Irradiated light can be converted into current. Consequently, a novel photoelectric conversion device that is highly convenient, useful, or reliable can be provided.

(6) Another embodiment of the present invention is a display device including a pixel set.

The pixel set includes a first pixel and a second pixel, the first pixel includes a light-emitting device, and the second pixel includes the photoelectric conversion device. The light-emitting device is adjacent to the photoelectric conversion device.

(7) Another embodiment of the present invention is the display device including a first functional layer and a second functional layer. Note that the first functional layer overlaps with the second functional layer.

The first pixel includes a first pixel circuit, and the first pixel circuit is electrically connected to the light-emitting device. The second pixel includes a second pixel circuit, and the second pixel circuit is electrically connected to the photoelectric conversion device.

The first functional layer includes the photoelectric conversion device and the light-emitting device, and the second functional layer includes the first pixel circuit and the second pixel circuit.

(8) Another embodiment of the present invention is the display device in which the light-emitting device includes a third electrode, a fourth electrode, and a second unit.

The second unit is interposed between the third electrode and the fourth electrode, and the second unit includes a fifth layer, a sixth layer, and the first layer.

The fifth layer is interposed between the sixth layer and the first layer, and the fifth layer contains a light-emitting material.

The sixth layer is interposed between the fifth layer and the third electrode, and the sixth layer contains a material with a hole-transport property.

The first layer is interposed between the fourth electrode and the fifth layer.

Thus, light can be emitted. An image can be displayed. Irradiated light can be converted into current. An image can be captured. Consequently, a novel device that is highly convenient, useful, or reliable can be provided.

Although a block diagram in which components are classified by their functions and shown as independent blocks is shown in the drawing attached to this specification, it is difficult to completely separate actual components according to their functions and one component can relate to a plurality of functions.

Effect of the Invention

According to one embodiment of the present invention, a novel photoelectric conversion device that is highly convenient, useful, or reliable can be provided. Alternatively, a novel display device that is highly convenient, useful, or reliable can be provided. Alternatively, a novel electronic device that is highly convenient, useful, or reliable can be provided. Alternatively, a novel photoelectric conversion device, a novel display device, a novel electronic device, or a novel semiconductor device can be provided.

Note that the description of these effects does not preclude the presence of other effects. Note that one embodiment of the present invention does not need to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 3A to FIG. 3C are diagrams illustrating a structure of a device of one embodiment of the present invention.

FIG. 10A to FIG. 10F are perspective views of a package and a module each including an image capturing device.

MODE FOR CARRYING OUT THE INVENTION

Figure 1A:
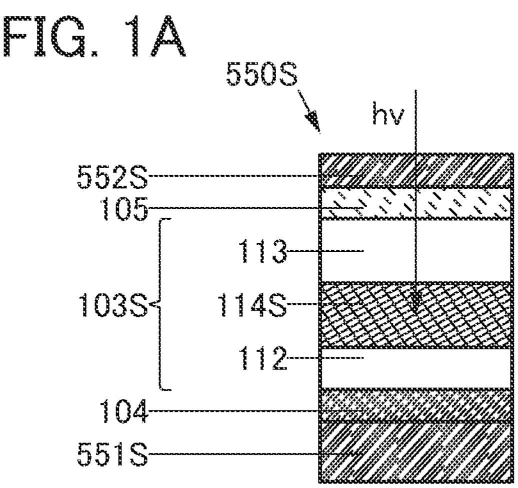
FIG. 1A and FIG. 1B are diagrams illustrating structures of a photoelectric conversion device of one embodiment of the present invention.

The photoelectric conversion device of one embodiment of the present invention includes the first electrode, the second electrode, and the unit. The unit is interposed between the first electrode and the second electrode, the unit includes the first layer and the second layer, and the first layer is interposed between the second electrode and the second layer. The first layer contains the first organic compound ETM, the first organic compound ETM has an electron-transport property, and the first organic compound ETM has the LUMO level in the first level LUMO1. The second layer contains the second organic compound CTM, the second organic compound CTM emits delayed fluorescent light at room temperature, and the second organic compound CTM has the LUMO level in the second level LUMO2. A difference between the second level LUMO2 and the first level LUMO1 is less than or equal to 1.0 eV.

Thus, intramolecular charge transfer can be induced in the second organic compound CTM which is brought into an excited state by absorbing light. The excited state lifetime can be long. The efficiency of charge separation can be increased. Photocurrent derived from intramolecular charge transfer can be obtained. The efficiency of converting irradiated light into current can be increased. Electron transfer from the second layer to the first layer can be facilitated. The operation voltage of the photoelectric conversion device can be reduced. Consequently, a novel photoelectric conversion device that is highly convenient, useful, or reliable can be provided.

Embodiments will be described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in structures of the invention described below, the same reference numerals are commonly used for the same portions or portions having similar functions in different drawings, and a repeated description thereof is omitted.

Embodiment 1

In this embodiment, a structure of a photoelectric conversion device 550S of one embodiment of the present invention will described with reference to FIG. 1A to FIG. 1C.

Figure 1B:
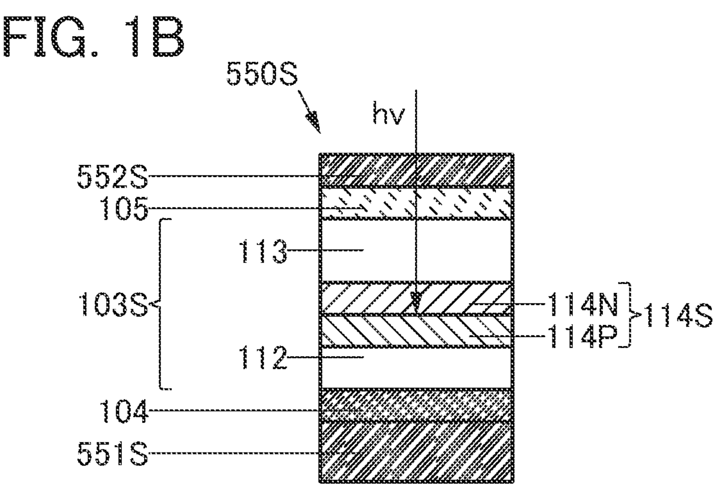
Figure 1C:
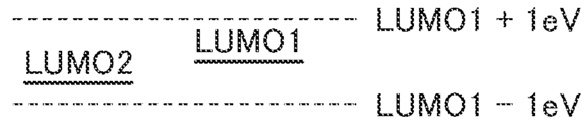
FIG. 1C is a diagram illustrating energy levels of a material used for the photoelectric conversion device of one embodiment of the present invention.

FIG. 1A is a cross-sectional view illustrating a structure of a photoelectric conversion device of one embodiment of the present invention, and FIG. 1B is a cross-sectional view illustrating a structure of the photoelectric conversion device of one embodiment of the present invention which is different from the structure in FIG. 1A. FIG. 1C is a diagram illustrating the energy levels of a material used for the photoelectric conversion device of one embodiment of the present invention.

Structure Example of Photoelectric Conversion Device 550S

The photoelectric conversion device 550S described in this embodiment includes an electrode 551S, an electrode 552S, and a unit 103S (see FIG. 1A). The electrode 552S overlaps with the electrode 551S, and the unit 103S is interposed between the electrode 552S and the electrode 551S.

Structure Example of Unit 103S

The unit 103S absorbs light hν, supplies electrons to one electrode, and supplies holes to the other electrode. For example, the unit 103S supplies holes to the electrode 551S and supplies electrons to the electrode 552S.

The unit 103S has a single-layer structure or a stacked-layer structure. For example, the unit 103S includes a layer 114S, a layer 112, and a layer 113. The layer 114S is interposed between the layer 112 and the layer 113. The layer 113 is interposed between the electrode 552S and the layer 114S, and the layer 112 is interposed between the layer 114S and the electrode 551S.

For example, a layer selected from functional layers such as a photoelectric conversion layer, an electron-transport layer, a hole-transport layer, and a carrier-blocking layer can be used in the unit 103S.

Structure Example of Layer 113

The layer 113 contains an organic compound ETM. The organic compound ETM has an electron-transport property and has the lowest unoccupied molecular orbital (LUMO) level in the level LUMO1 (see FIG. 1C). Note that the organic compound ETM has a LUMO level of less than or equal to −2 eV. In this manner, the organic compound ETM has an electron-transport property.

The LUMO level and the HOMO level of the organic compound can be derived from the electrochemical characteristics (the reduction potential and the oxidation potential) or the optical characteristics (the ionization potential and the optical band gap). Specifically, the reduction potential and the oxidation potential can be measured by cyclic voltammetry (CV). It is known that the reduction potential corresponds to the LUMO level and the oxidation potential corresponds to the HOMO level. The ionization potential and the optical band gap can be measured by a photoelectron spectroscopy measurement and ultraviolet-visible spectroscopy. The value of the ionization potential (a positive value) that is converted into a negative value can be regarded as the HOMO level. The LUMO level can be estimated by adding the value of the optical band gap (eV) to the HOMO level. Note that cyclic voltammetry (CV) is suitable for an organic compound in which absorption from the ground state to the triplet excited state is observed, and a photoelectron spectroscopy measurement and ultraviolet-visible spectroscopy are suitable for an organic compound which is less likely to be dissolved in a solvent. In the case where the LUMO levels of a plurality of organic compounds are compared, the values derived using the same measurement method are used.

A material having an electron-transport property, a material having an anthracene skeleton, and a mixed material can be used for the layer 113, for example. The layer 113 can be referred to as an electron-transport layer.

[Material Having Electron-Transport Property]

For example, a metal complex or an organic compound having a π-electron deficient heteroaromatic ring skeleton can be used as the material having an electron-transport property.

As the metal complex, bis(10-hydroxybenzo[h]quinolinato)beryllium(II) (abbreviation: BeBq2), bis(2-methyl-8-quinolinolato) (4-phenylphenolato)aluminum(II) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), or the like can be used, for example.

As the organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus is preferable. Furthermore, the heterocyclic compound having a diazine (pyrimidine or pyrazine) skeleton has a high electron-transport property and can contribute to a reduction in driving voltage.

As the heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or the like can be used, for example.

As the heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,8-bis[3-(dibenzothiophen-4-yl)phenyl]benzo[h]quinazoline (abbreviation: 4,8mDBtP2Bqn), or the like can be used, for example.

As the heterocyclic compound having a pyridine skeleton, 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), or the like can be used, for example.

As the heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), or the like can be used, for example.

[Material Having Anthracene Skeleton]

An organic compound having an anthracene skeleton can be used for the layer 113. In particular, an organic compound having both an anthracene skeleton and a heterocyclic skeleton can be suitably used.

For example, an organic compound having both an anthracene skeleton and a nitrogen-containing five-membered ring skeleton can be used. Alternatively, an organic compound having both an anthracene skeleton and a nitrogen-containing five-membered ring skeleton where two heteroatoms are included in a ring can be used. Specifically, a pyrazole ring, an imidazole ring, an oxazole ring, a thiazole ring, or the like can be suitably used as the heterocyclic skeleton.

For example, an organic compound having both an anthracene skeleton and a nitrogen-containing six-membered ring skeleton can be used. Alternatively, an organic compound having both an anthracene skeleton and a nitrogen-containing six-membered ring skeleton where two heteroatoms are included in a ring can be used. Specifically, a pyrazine ring, a pyrimidine ring, a pyridazine ring, or the like can be suitably used as the heterocyclic skeleton.

Structure Example of Mixed Material

A material in which a plurality of kinds of substances are mixed can be used for the layer 113. Specifically, a mixed material that contains a substance having an electron-transport property and any of an alkali metal, an alkali metal compound, and an alkali metal complex can be used for the layer 113.

The concentration of the alkali metal, the alkali metal compound, or the alkali metal complex preferably differs in the thickness direction of the layer 113 (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used, for example. In particular, a complex of a monovalent metal ion, especially a complex of lithium is preferable, and Liq is further preferable.

Structure Example 1 of Layer 114S

The layer 114S contains an organic compound CTM. The organic compound CTM emits delayed fluorescent light at room temperature and has the LUMO level in the level LUMO2 (see FIG. 1C). A difference between the level LUMO2 and the level LUMO1 is less than or equal to 1.0 eV.

Thus, intramolecular charge transfer can be induced in the organic compound CTM which is brought into an excited state by absorbing light. The excited state lifetime can be long. The efficiency of charge separation can be increased. Photocurrent derived from intramolecular charge transfer can be obtained. The efficiency of converting irradiated light into current can be increased. Electron transfer from the layer 114S to the layer 113 can be facilitated. The operation voltage of the photoelectric conversion device can be reduced. Consequently, a novel photoelectric conversion device that is highly convenient, useful, or reliable can be provided.

Structure Example of Organic Compound CTM

The organic compound CTM has a structure represented by General Formula (G0) below.

[Chemical Formula 3]

(G0)

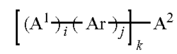

Example of $A^1$

In General Formula (G0) above, $A^1$ represents an amine skeleton or a carbazolyl group.

In the case where $A^1$ is an amine skeleton, the amine skeleton includes an aryl group or a heteroaryl group. The amine skeleton may include only a plurality of aryl groups, only a plurality of heteroaryl groups, or an aryl group and a heteroaryl group. Note that in the case, the aryl groups may be bonded to each other, the heteroaryl groups may be bonded to each other, or the aryl group and the heteroaryl group may be bonded to each other to form a condensed ring.

Note that the aryl group bonded to the amine skeleton is substituted or unsubstituted, and the heteroaryl group bonded to the amine skeleton is substituted or unsubstituted.

In the case where $A^1$ is an amine skeleton, an aryl group having any of structures shown below can be used as the substituent bonded to the amine skeleton, for example.

[Chemical Formulae 4]

(01)

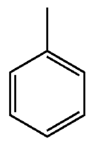

(02)

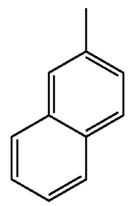

(03)

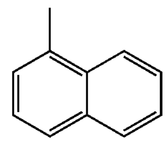

(04)

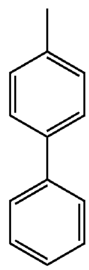

-continued
(05)
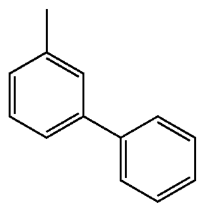
(06)
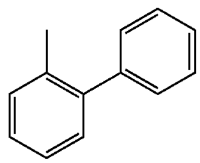
(07)
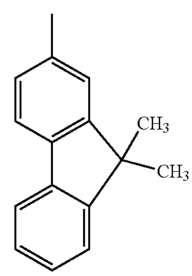
(08)
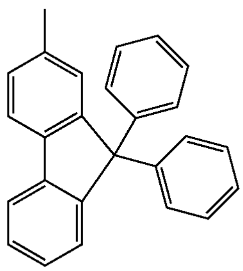
(09)
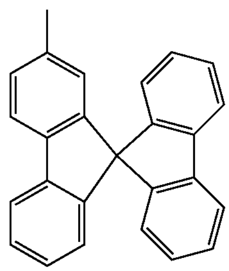
(10)
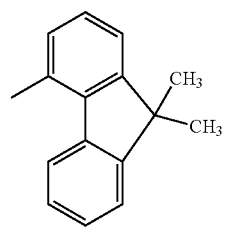
-continued
(11)
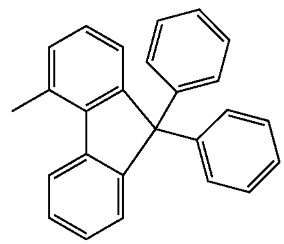
(12)
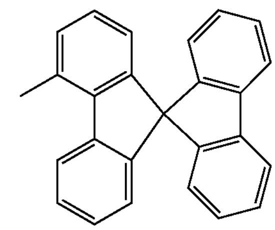
In the case where $A^1$ is an amine skeleton, a heteroaryl group having any of structures shown below can be used as the substituent bonded to the amine skeleton, for example.
[Chemical Formulae 5]
(13)
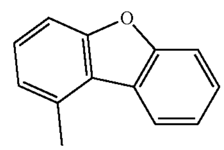
(14)
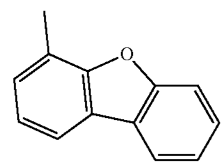
(15)
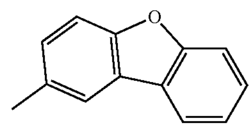
(16)
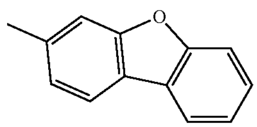
(17)
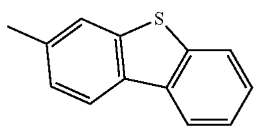
(18)
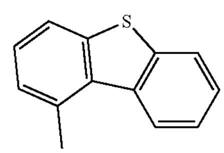

-continued
(19)
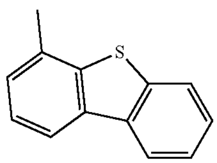
(20)
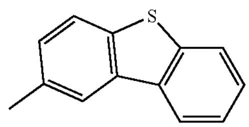
(21)
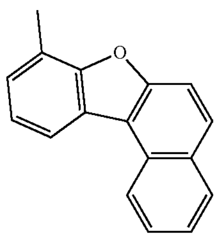
(22)
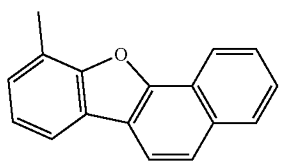
(23)
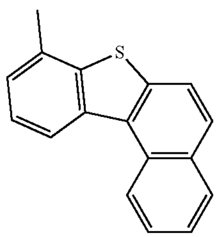
(24)
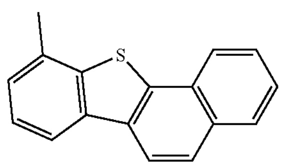
(25)
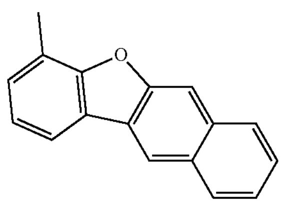
(26)
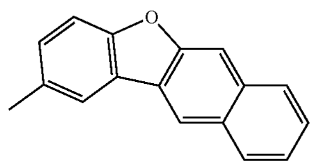
-continued
(27)
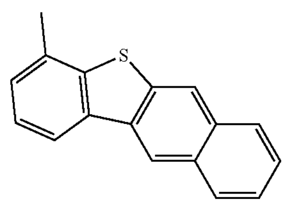
(28)
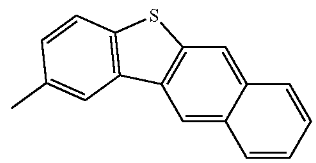
(29)
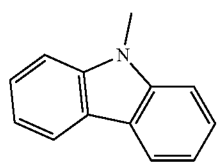
(30)
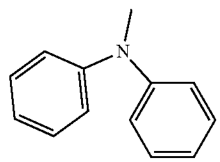
For example, any of substituents including amine skeletons having structures shown below can be used as $A^1$.
[Chemical Formulae 6]
(A1-01)
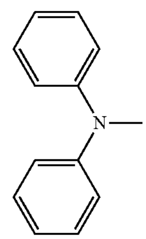
(A1-02)
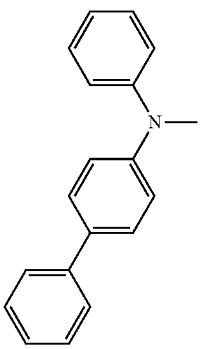

-continued
(A1-03)
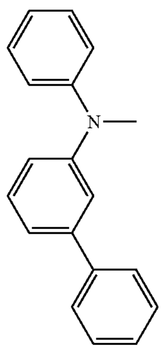
(A1-04)
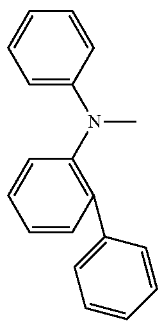
(A1-05)
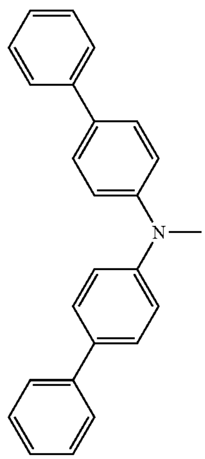
(A1-06)
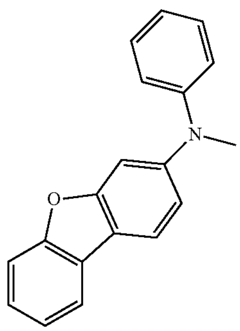
-continued
(A1-07)
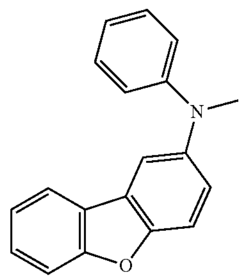
(A1-08)
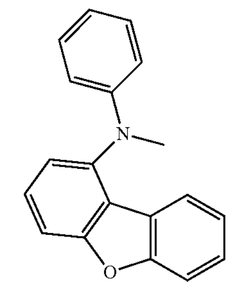
(A1-09)
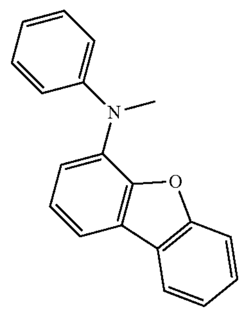
(A1-10)
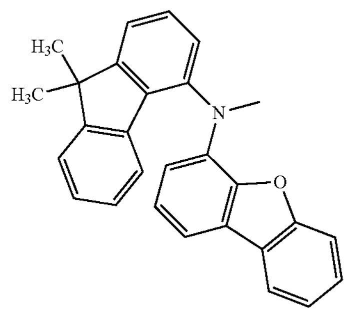
(A1-11)
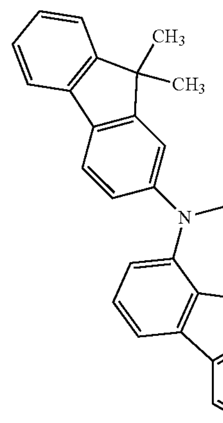

-continued
(A1-12)
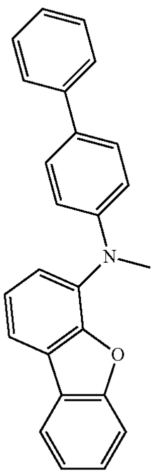
(A1-13)
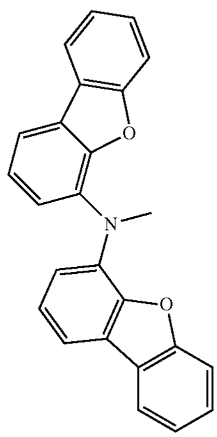
(A1-14)
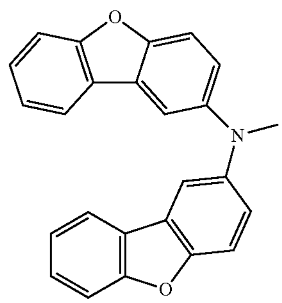
(A1-15)
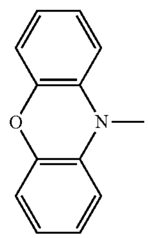
-continued
(A1-16)
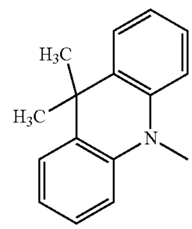
(A1-17)
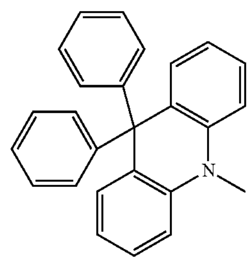
(A1-18)
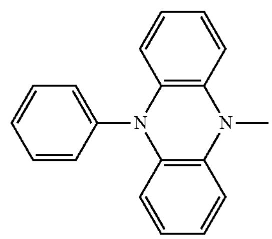
(A1-19)
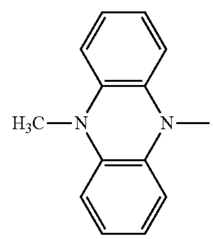
[Chemical Formulae 7]
(A1-20)
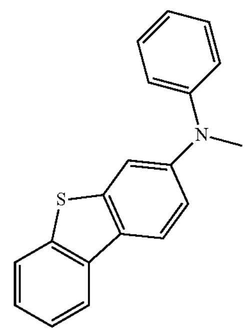
(A1-21)
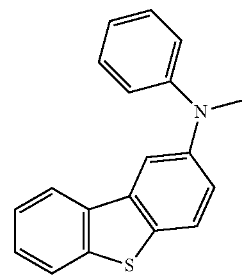

-continued
(A1-22)
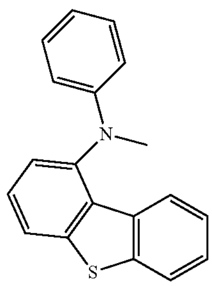
(A1-23)
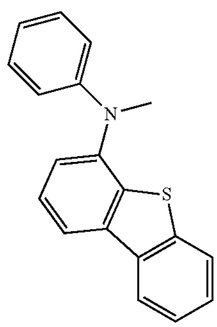
(A1-24)
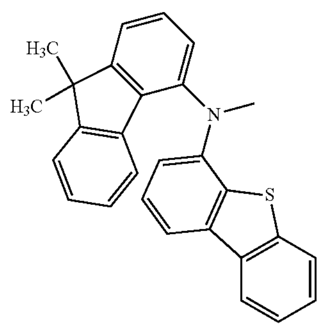
(A1-25)
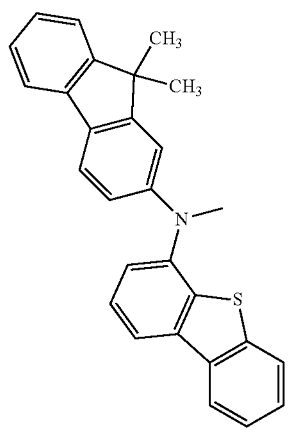
-continued
(A1-26)
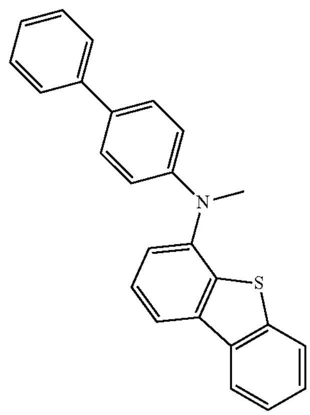
(A1-27)
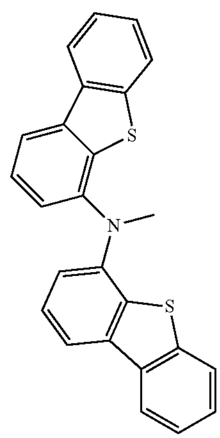
(A1-28)
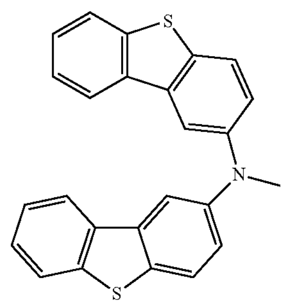
In the case where $A^1$ is a carbazolyl group, the carbazolyl group is substituted or unsubstituted.
For example, a carbazolyl group having any of structures shown below can be used as $A^1$.
[Chemical Formulae 8]
(A1-29)
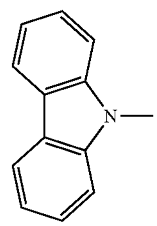

-continued
(A1-30)
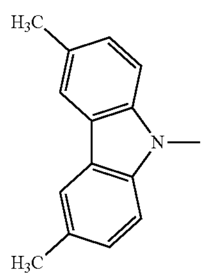
(A1-31)
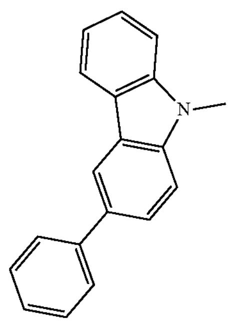
(A1-32)
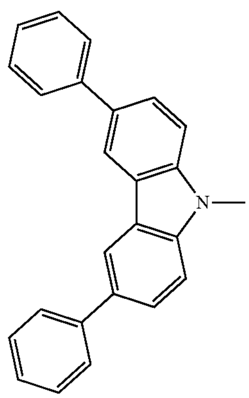
(A1-33)
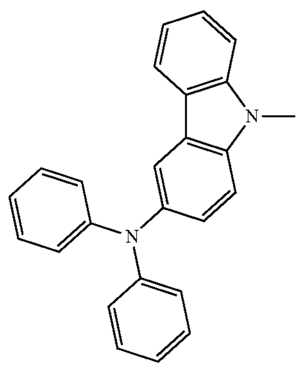
-continued
(A1-34)
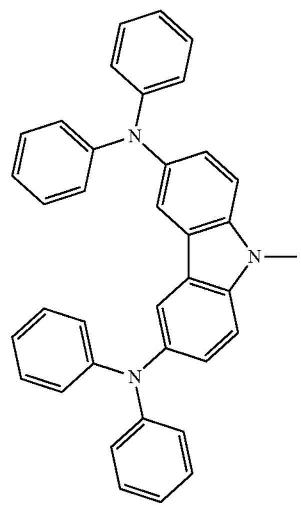
(A1-35)
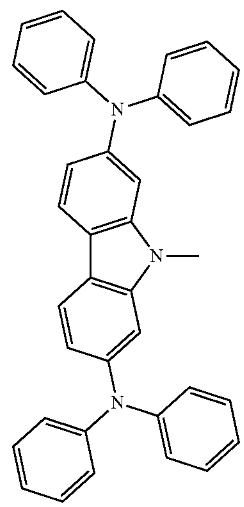
(A1-36)
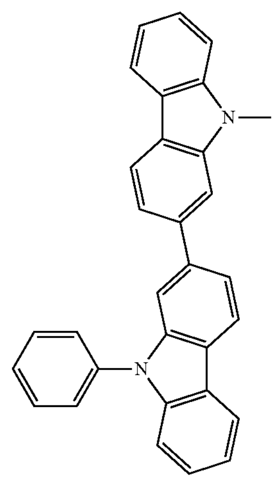

-continued (A1-37)

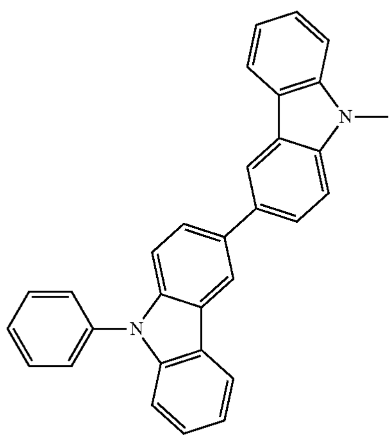

(A1-38)

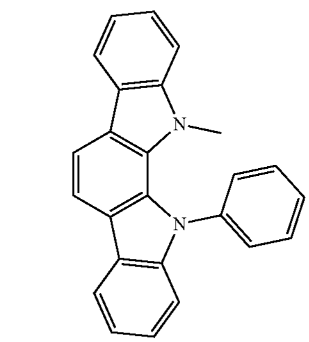

(A1-39)

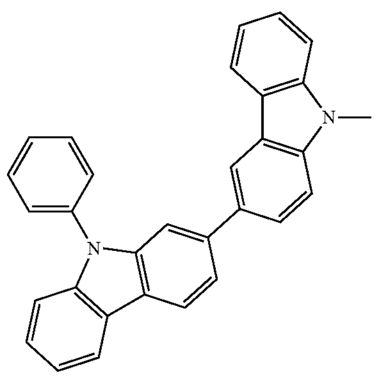

(A1-40)

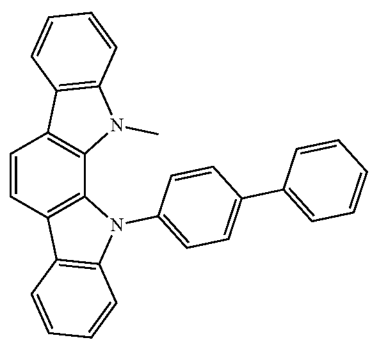

-continued (A1-41)

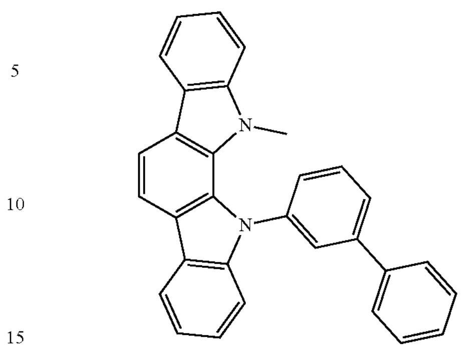

Example of Ar

In General Formula (G0) above, Ar represents a substituted or unsubstituted arylene group having 6 to 25 carbon atoms or a substituted or unsubstituted heteroarylene group having 2 to 25 carbon atoms. Note that Ar may be formed of a plurality of aromatic rings, in which case the plurality of aromatic rings may be bonded to each other to form a condensed ring or a spiro ring.

For example, a substituent having any of structures shown below can be used as Ar.

[Chemical Formulae 9]

(Ar-01)

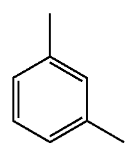

(Ar-02)

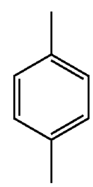

(Ar-03)

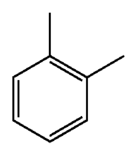

(Ar-04)

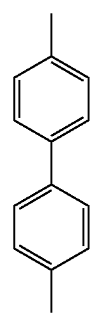

-continued (Ar-05)

(Ar-06)

(Ar-07)

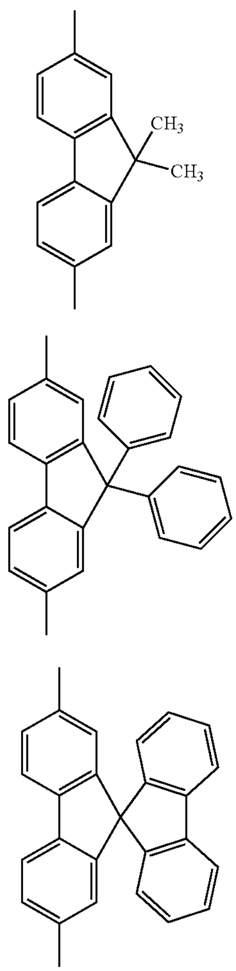

Example 1 of $A^2$

In General Formula (G0) above, $A^2$ represents an arylene group having 6 to 25 carbon atoms. The arylene group includes at least one substituent.

Note that the substituent bonded to the arylene group is a cyano group, a substituted or unsubstituted acyl group, a substituted or unsubstituted alkoxy group, a substituted or unsubstituted haloalkyl group, a substituted or unsubstituted cycloalkoxy group, or a substituted or unsubstituted cycloalkyl group. The alkoxy group has 1 to 6 carbon atoms, the haloalkyl group has 1 to 6 carbon atoms, and the cycloalkoxy group has 3 to 8 carbon atoms.

For example, a substituent having any of structures shown below can be used as $A^2$.

[Chemical Formulae 10]

(A21-01)

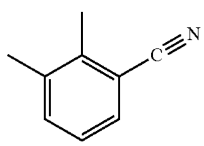

-continued (A21-02)

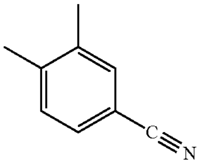

(A21-03)

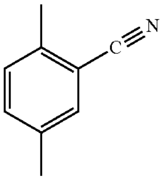

(A21-04)

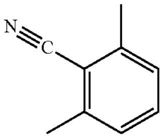

(A21-05)

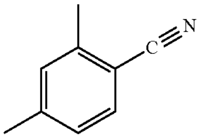

(A21-06)

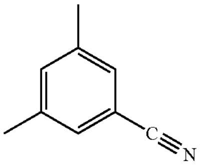

(A21-07)

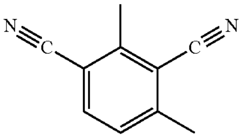

(A21-08)

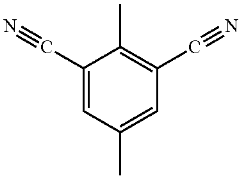

Example 2 of $A^2$

In General Formula (G0) above. $A^2$ represents a substituted or unsubstituted heteroaryl group having 2 to 25 carbon atoms and having a valence of 1 to 6.

As the heteroaryl group or the heteroarylene group, one selected from a triadinyl group, a 2,3-dicyanodibenzo[f,h]quinoxaline-7,10-diyl group, a 4-benzofuro[3,2-d]pyrimidinyl group, a 5,10-dihydroboranethrene-5,10-diyl group, a bis(3-pyridinyl)methanone-4,4'-diyl group, a 9,9-dimethyl-9H-thioxanthene-10,10-dioxide-2,7-diyl group, a 6,7-diphenyl[1,2,5]thiadiazolo[3,4-g]quinoxaline-4,9-diyl group, and the like is used, for example.

For example, a substituent having any of structures shown below can be used as $A^2$.

[Chemical Formulae 11]

(A22-01)

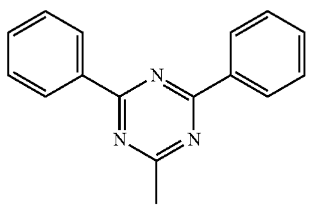

(A22-02)

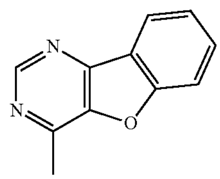

(A22-03)

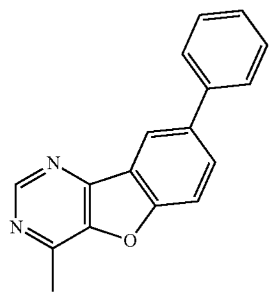

(A22-04)

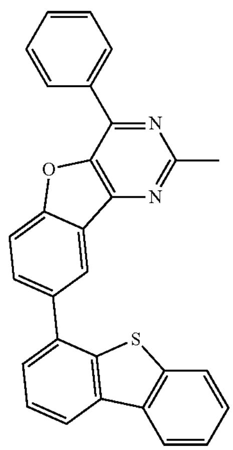

-continued (A22-05)

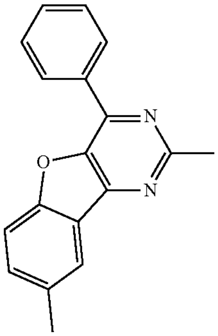

(A22-06)

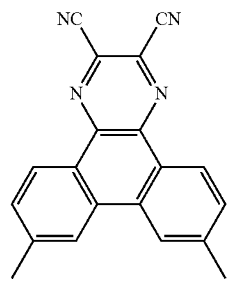

Example of i, j, and k

In General Formula (G0) above, i is an integer greater than or equal to 1 and less than or equal to 5, j is an integer greater than or equal to 0 and less than or equal to 2, and k is an integer greater than or equal to 1 and less than or equal to 6.

Specific Examples of Organic Compound CTM

As the organic compound having the above structure, for example, any of the following substances can be used: 9,9',9'',9'''-(1,3-dicyanobenzene-2,4,5,6-tetraaryl)tetrakis (9H-carbazole) (abbreviation: 4CzIPN); 8-(dibenzothiophen-4-yl)-4-phenyl-2-(9'-phenyl-3,3'-bi-9H-carbazol-9-yl)-[1]benzofuro[3,2-d]pyrimidine (abbreviation: 4Ph-8DBt-2PCCzBfpm); 9,9',9''-(5-(4,6-diphenyl-1,3,5-triazin-2-yl)benzene-1,2,3-triyl)tris(3,6-dimethyl-9H-carbazole) (abbreviation: TmCzTrz): 3',3'''',6',6''''-tetraphenyl-9,9',9'',9''',9''''-(cyanobenzene-2,3,4,5,6-pentayl)pentakis(9H-carbazole) (abbreviation: 3Cz2DPhCzBN); 3,6-bis(diphenylamino)-9-[4-(4,6-diphenyl-1,3,5-triazin-2-yl)phenyl]-9H-carbazole (abbreviation: DACT-II); 4-[3-(N,N-diphenylamino)carbazol-9-yl]benzofuro[3,2-d]pyrimidine (abbreviation: 4DPhACzBfpm); 4-[3,6-bis(N,N-diphenylamino)carbazol-9-yl]benzofuro[3,2-d]pyrimidine (abbreviation: 4DPhA2CzBfpm); 8-phenyl-4-[3,6-bis(N,N-diphenylamino)carbazol-9-yl]benzofuro[3,2-d]pyrimidine (abbreviation: 8Ph-4DPhA2CzBfpm); and the like.

[Chemical Formulae 12]
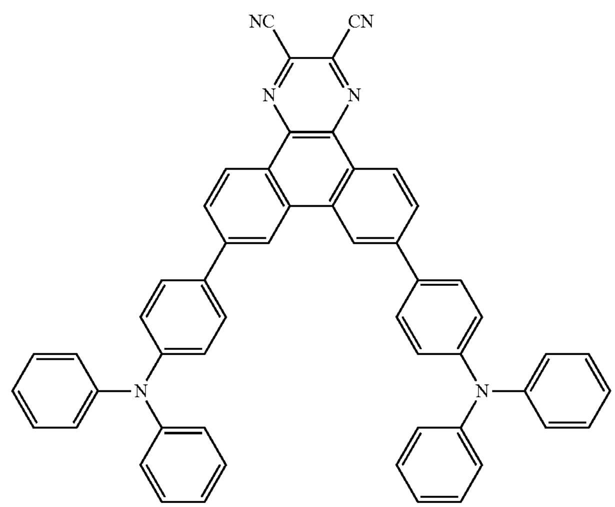
TPA-DCPP
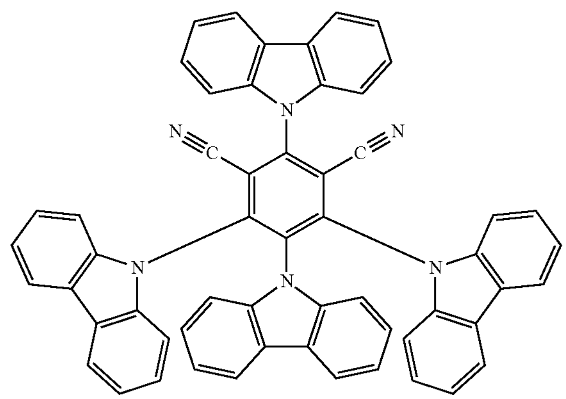
4CzIPN
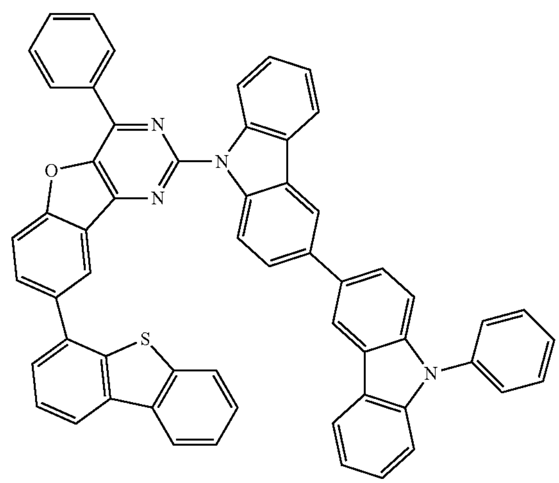
4Ph-8DBt-2PCCzBfpm
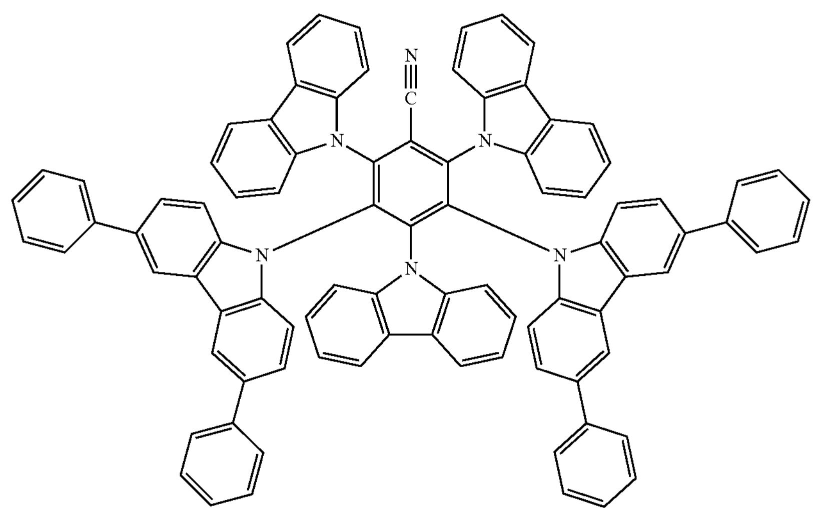
3Cz2DPhCzBN -continued
[Chemical Formulae 13]
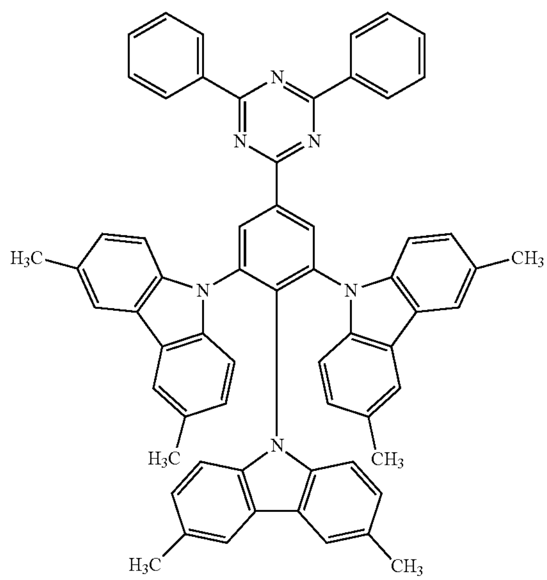
TmCzTrz
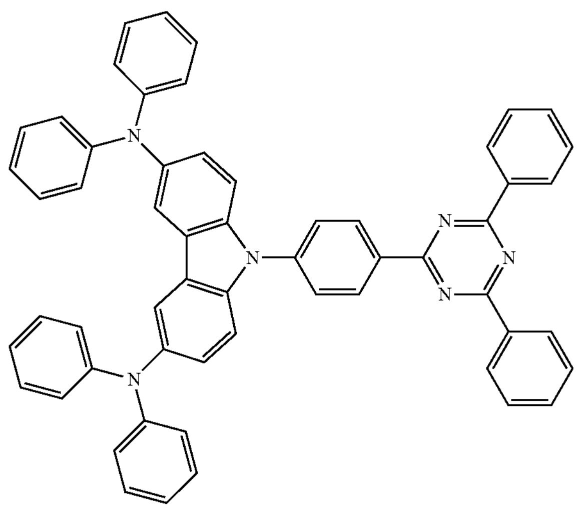
DACT-II
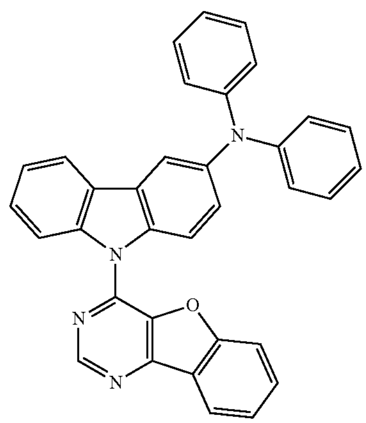
4DPhACzBfpm
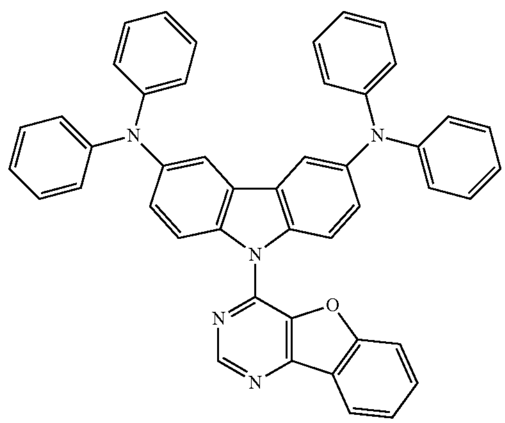
4DPhA2CzBfpm
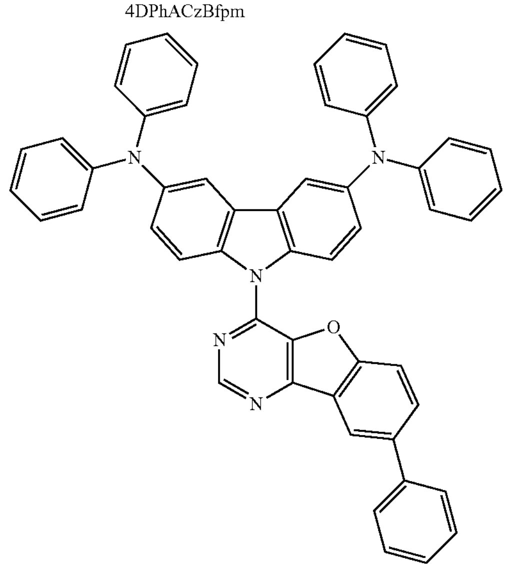
8Ph-4DPhA2CzBfpm Structure Example 2 of Layer 114S The layer 114S contains the organic compound CTM and an organic compound AM, and the organic compound AM has an electron-accepting property with respect to the organic compound CTM.

Thus, charge transfer can be promoted. Generation of excitons due to charge transfer can be promoted. The efficiency of charge separation can be increased. The efficiency of converting irradiated light into current can be increased. A wavelength band of light absorbed by the layer 114S can be widened. The spectral sensitivity characteristic can be adjusted. Irradiated light can be converted into current. Consequently, a novel photoelectric conversion device that is highly convenient, useful, or reliable can be provided.

Note that as the substituent included in the aryl group, the heteroaryl group, the carbazolyl group, the arylene group, the heteroarylene group, the acyl group, the alkoxy group, the haloalkyl group, the cycloalkoxy group, the cycloalkyl group, or the like, an alkyl group, a substituted or unsubstituted cycloalkyl group, a substituted or unsubstituted aromatic hydrocarbon group, a substituted or unsubstituted heteroaromatic hydrocarbon group, or the like can be used, for example.

Note that as the alkyl group, an alkyl group having 1 to 4 carbon atoms can be used. For example, a methyl group, an ethyl group, a propyl group, an isopropyl group, a butyl group, an isobutyl group, a tert-butyl group, an n-hexyl group, or the like can be used.

As the cycloalkyl group, a cycloalkyl group having 3 to 10 carbon atoms can be used. For example, a cyclopropyl group, a cyclobutyl group, a cyclopentyl group, a cyclohexyl group, an adamantyl group, or the like can be used.

As the aromatic hydrocarbon group, an aromatic hydrocarbon group having 6 to 30 carbon atoms can be used. For example, a phenyl group, a naphthyl group, a biphenyl group, a fluorenyl group, a spirofluorenyl group, or the like can be used.

As the heteroaromatic hydrocarbon group, a heteroaromatic hydrocarbon group having 2 to 30 carbon atoms can be used. For example, a pyridine ring, a pyrimidine ring, a pyrazine ring, a pyridazine ring, a triazine ring, a quinoline ring, a quinoxaline ring, a quinazoline ring, a benzoquinazoline ring, a phenanthroline ring, an azafluoranthene ring, an imidazole ring, an oxazole ring, an oxadiazole ring, a triazole ring, or the like can be used.

Example of Material Having Electron-Accepting Property

For example, a fullerene derivative or a non-fullerene electron acceptor can be used as a material having an electron-accepting property.

As the material having an electron-accepting property. $C_{60}$ fullerene, $C_{70}$ fullerene, [6,6]-phenyl-C71-butyric acid methyl ester (abbreviation: PC71BM), [6,6]-phenyl-C61-butyric acid methyl ester (abbreviation: PC61BM), 1',0.1",4',0.4"-tetrahydro-di[1,4]methanonaphthaleno[1,2:2',3',56,60:2",3"][5,6]fullerene-C60 (abbreviation: ICBA), 2,8-dimethylanthra[2,3-b:6,7-b']dithiophene (abbreviation: anti-DMADT), or the like can be used, for example.

As the non-fullerene electron acceptor, a perylene derivative, a compound having a dicyanomethyleneindanone group, or the like can be used, for example. For example, N,N'-dimethyl-3,4,9,10-perylenedicarboximide (abbreviation: Me-PTCDI) can be used.

Structure Example 3 of Layer 114S

The layer 114S can have a stacked-layer structure, for example. Specifically, the layer 114S can have a heterojunction structure.

Example of Heterojunction Structure

A layer 114N and a layer 114P can be used for the layer 114S. The layer 114N is interposed between one electrode and the layer 114P, and the layer 114P is interposed between the layer 114N and the other electrode. For example, the layer 114N is interposed between the electrode 552S and the layer 114P, and the layer 114P is interposed between the layer 114N and the electrode 551S (see FIG. 1B).

The organic compound AM can be used for the layer 114N.

The organic compound CTM can be used for the layer 114P.

Structure Example of Layer 112

For example, a material having a hole-transport property can be used for the layer 112. The layer 112 can be referred to as a hole-transport layer.

[Material Having Hole-Transport Property]

A material having a hole mobility higher than or equal to $1\times10^{-6}$ $cm^2/Vs$ can be suitably used as the material having a hole-transport property.

For example, an amine compound or an organic compound having a π-electron rich heteroaromatic ring skeleton can be used as the material having a hole-transport property. Specifically, a compound having an aromatic amine skeleton, a compound having a carbazole skeleton, a compound having a thiophene skeleton, a compound having a furan skeleton, or the like can be used. In particular, a compound having an aromatic amine skeleton and a compound having a carbazole skeleton are preferable because these have favorable reliability, have high hole-transport properties, and contribute to a reduction in driving voltage.

The following are examples that can be used as the compound having an aromatic amine skeleton: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAIBP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF).

As the compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), or the like can be used.

As the compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBT-FLP-III), 4-[4-(9-phenyl-9H-fluoren-9-yl)phenyl]-6-phenyldibenzothiophene (abbreviation: DBTFLP-IV), or the like can be used.

As the compound having a furan skeleton, for example, 4,4',4"-(benzene-1,3,5-triyl)tri(dibenzofuran) (abbreviation: DBF3P-II), 4-{3-[3-(9-phenyl-9H-fluoren-9-yl)phenyl]phenyl}dibenzofuran (abbreviation; mmDBFFLBi-II), or the like can be used.

Note that this embodiment can be combined with any of the other embodiments described in this specification as appropriate.

Embodiment 2

In this embodiment, a structure of the photoelectric conversion device 550S of one embodiment of the present invention will be described with reference to FIG. 1A and FIG. 1B.

Structure Example of Photoelectric Conversion Device 550S

The photoelectric conversion device 550S described in this embodiment includes the electrode 551S, the electrode 552S, the unit 103S, and a layer 104. The electrode 552S includes a region overlapping with the electrode 551S, and the unit 103S includes a region interposed between the electrode 551S and the electrode 552S. The layer 104 includes a region interposed between the electrode 551S and the unit 103S. For example, the structure described in Embodiment 1 can be used for the unit 103S.

Structure Example of Electrode 551S

A conductive material can be used for the electrode 551S, for example. Specifically, a single layer or a stacked layer of a metal, an alloy, or a film containing a conductive compound can be used for the electrode 551S.

For example, a film that efficiently reflects light can be used as the electrode 551S. Specifically, an alloy containing silver, copper, and the like, an alloy containing silver, palladium, and the like, or a metal film of aluminum or the like can be used for the electrode 551S.

Alternatively, for example, a metal film that transmits part of light and reflects the other part of the light can be used as the electrode 551S.

A film having a property of transmitting visible light can be used as the electrode 551S, for example. Specifically, a single layer or a stacked layer of a metal film, an alloy film, a conductive oxide film, or the like that is thin enough to transmit light can be used as the electrode 551S.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

Furthermore, for example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, graphene can be used.

Structure Example of Layer 104

For example, a material having a hole-injection property can be used for the layer 104.

Specifically, a substance having an acceptor property can be used for the layer 104. A composite material containing a plurality of kinds of substances can be used for the layer 104.

[Substance Having Acceptor Property]

An organic compound and an inorganic compound can be used as the substance having an acceptor property. The substance having an acceptor property can extract electrons from an adjacent hole-transport layer or an adjacent material having a hole-transport property by the application of an electric field.

For example, a compound having an electron-withdrawing group (a halogen group or a cyano group) can be used as the substance having an acceptor property. Note that an organic compound having an acceptor property is easily evaporated and deposited. As a result, the productivity of the photoelectric conversion device 550S can be increased.

Specifically, it is possible to use, for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylen-1,3,4,5,6,8,9,10-octafluoro-7H-pyren-2-ylidene)malononitrile.

A compound in which electron-withdrawing groups are bonded to a condensed aromatic ring having a plurality of heteroatoms, such as HAT-CN, is particularly preferable because it is thermally stable.

Alternatively, a [3]radialene derivative having an electron-withdrawing group (in particular, a cyano group or a halogen group such as a fluoro group) is preferable because it has a very high electron-accepting property.

Specifically, it is possible to use, for example, α,α',α"-1,2,3-cyclopropanetriylidenetris[4-cyano-2,3,5,6-tetrafluorobenzeneacetonitrile], α,α',α"-1,2,3-cvclopropanetriylidenetris[2,6-dichloro-3,5-difluoro-4-(trifluoromethyl)benzeneacetonitrile], or α,α',α"-1,2,3-cyclopropanetriylidenetris[2,3,4,5,6-pentafluorobenzeneacetonitrile].

As the substance having an acceptor property, molybdenum oxide, vanadium oxide, ruthenium oxide, tungsten oxide, manganese oxide, or the like can be used.

Alternatively, it is possible to use phthalocyanine (abbreviation: $H_2Pc$), a phthalocyanine-based complex compound such as copper phthalocyanine (CuPc), and compounds having an aromatic amine skeleton such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD).

Furthermore, it is possible to use, for example, a high molecular compound such as poly(3,4-ethylenedioxythiophene)/poly(styrenesulfonic acid) (PEDOT/PSS).

Structure Example 1 of Composite Material

For example, a composite material containing a substance having an acceptor property and a material having a hole-transport property can be used for the laver 104.

As the material having a hole-transport property in the composite material, for example, a compound having an aromatic amine skeleton, a carbazole derivative, an aromatic hydrocarbon, an aromatic hydrocarbon having a vinyl group, a high molecular compound (such as an oligomer, a dendrimer, or a polymer), or the like can be used. A material having a hole mobility of $1\times10^{-6}$ $cm^2/Vs$ or higher can be suitably used as the material having a hole-transport property in the composite material.

A substance having a relatively deep HOMO level can be suitably used as the material having a hole-transport property in the composite material. Specifically, the HOMO level is preferably higher than or equal to −5.7 eV and lower than or equal to −5.4 eV.

As the compound having an aromatic amine skeleton, for example, N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), or the like can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, or the like can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, or the like can be used.

As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), or the like can be used.

As the high molecular compound, for example, poly(N-vinylcarbazole) (abbreviation: PVK), poly(4-vinyl)triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), or the like can be used.

As another example, a substance having any of a carbazole skeleton, a dibenzofuran skeleton, a dibenzothiophene skeleton, and an anthracene skeleton can be suitably used as the material having a hole-transport property in the composite material. Moreover, as the material having a hole-transport property in the composite material, it is possible to use a substance including any of an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the photoelectric conversion device 550S can be increased.

As these materials, for example, N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyl)triphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyl)triphenylamine (abbreviation: BBAβNB), 4-[4-(2-naphthyl)phenyl]-4',4"-diphenyl)triphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yl)triphenylamine (abbreviation: BBAβNB-03), 4,4'-diphenyl-4"-(6;2'-binaphthyl-2-yl)triphenylamine (abbreviation: BBA(βN2)B), 4,4'-diphenyl-4"-(7,2'-binaphthyl-2-yl)triphenylamine (abbreviation: BBAβN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyl)triphenylamine (abbreviation: TPBiAβNB), 4-(3-biphenylyl)-4'-[4-(2-naphthyl)phenyl]-4"-phenyl)triphenylamine (abbreviation: mTPBiAβNBi), 4-(4-biphenylyl)-4'-[4-(2-naphthyl)phenyl]-4"-phenyl)triphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'4carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9Hcarbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBIBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9- phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis (9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, N,N-bis(9,9-dimethyl-9H-fluoren-2-yl)-9,9'-spirobi-9H-fluoren-1-amine, or the like can be used.

Structure Example 2 of Composite Material

For example, a composite material containing a material having an acceptor property, a material having a hole-transport property, and a fluoride of an alkali metal or a fluoride of an alkaline earth metal can be used as the material having a hole-injection property. In particular, a composite material in which the proportion of fluorine atoms is higher than or equal to 20% can be suitably used. Thus, the refractive index of the layer 104 can be reduced.

Note that this embodiment can be combined with any of the other embodiments described in this specification as appropriate.

Embodiment 3

In this embodiment, a structure of the photoelectric conversion device 550S of one embodiment of the present invention will be described with reference to FIG. 1A and FIG. 1B.

Structure Example of Photoelectric Conversion Device 550S

The photoelectric conversion device 550S described in this embodiment includes the electrode 551S, the electrode 552S, the unit 103S, and a layer 105. The electrode 552S includes the region overlapping with the electrode 551S, and the unit 103S includes the region interposed between the electrode 551S and the electrode 552S. The layer 105 includes a region interposed between the unit 103S and the electrode 552S. For example, the structure described in Embodiment 1 can be used for the unit 103S.

Structure Example of Electrode 552S

A conductive material can be used for the electrode 552S, for example. Specifically, a single layer or a stacked layer of a metal, an alloy, or a material containing a conductive compound can be used for the electrode 552S.

For example, the material that can be used for the electrode 551S described in Embodiment 2 can be used for the electrode 552S. In particular, a material having a lower work function than the electrode 551S can be suitably used for the electrode 552S. Specifically, a material having a work function lower than or equal to 3.8 eV is preferable.

For example, an element belonging to Group 1 of the periodic table, an element belonging to Group 2 of the periodic table, a rare earth metal, or an alloy containing any of these elements can be used for the electrode 552S.

Specifically, lithium (Li), cesium (Cs), or the like; magnesium (Mg), calcium (Ca), strontium (Sr), or the like; europium (Eu), ytterbium (Yb), or the like, or an alloy containing any of these (MgAg or AlLi) can be used for the electrode 552S.

Structure Example of Layer 105

A material having an electron-injection property can be used for the layer 105, for example.

Specifically, a substance having a donor property can be used for the layer 105. Alternatively, a material in which a substance having a donor property and a material having an electron-transport property are combined can be used for the layer 105. Alternatively, electride can be used for the layer 105. Alternatively, besides a material having a low work function, a material having a high work function can also be used for the electrode 552S. Alternatively, a material used for the electrode 552S can be selected from a wide range of materials regardless of its work function. Specifically, Al, Ag, ITO, indium oxide-tin oxide containing silicon or silicon oxide, or the like can be used for the electrode 552S.

[Substance Having Donor Property]

For example, an alkali metal, an alkaline earth metal, a rare earth metal, or a compound thereof (an oxide, a halide, a carbonate, or the like) can be used as the substance having a donor property. Alternatively, an organic compound such as tetrathianaphthacene (abbreviation: TTN), nickelocene, or decamethylnickelocene can be used as the substance having a donor property.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material in which a plurality of kinds of substances are combined can be used as the material having an electron-injection property. For example, a substance having a donor property and a material having an electron-transport property can be used as the composite material.

[Material Having Electron-Transport Property]

For example, a metal complex or an organic compound having a π-electron deficient heteroaromatic ring skeleton can be used as the material having an electron-transport property.

For example, the material having an electron-transport property that can be used for the layer 112 described in Embodiment 1 can be used as the composite material.

Structure Example 2 of Composite Material

For example, a composite material containing a first organic compound having an unshared electron pair and a first metal can be used for the layer 105. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound having an unshared electron pair interacts with the first metal and thus can form a singly occupied molecular orbital (SOMO). The first metal has a low reactivity with water or oxygen; thus, the moisture resistance of the photoelectric conversion device 550S can be improved.

For the layer 105, a composite material that allows the spin density measured by an electron spin resonance method (ESR) to be preferably higher than or equal to $1\times10^{16}$ spins/$cm^3$, further preferably higher than or equal to $5\times10^{16}$ spins/$cm^3$, still further preferably higher than or equal to $1\times10^{7}$ spins/$cm^3$ can be used.

[Organic Compound Having Unshared Electron Pair]

For example, a material having an electron-transport property can be used as the organic compound having an unshared electron pair. For example, a compound having an electron deficient heteroaromatic ring can be used. Specifically, a compound having at least one of a pyridine ring, a diazine ring (a pyrimidine ring, a pyrazine ring, and a pyridazine ring), and a triazine ring can be used. Accordingly, the driving voltage of the photoelectric conversion device 550S can be reduced.

Note that the lowest unoccupied molecular orbital (LUMO) level of the organic compound having an unshared electron pair is preferably greater than or equal to −3.6 eV and less than or equal to −2.3 eV. In general, the HOMO level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

Alternatively, for example, copper phthalocyanine can be used as the organic compound having an unshared electron pair. The number of electrons of the copper phthalocyanine is an odd number.

[First Metal]

For example, when the number of electrons of the first organic compound having an unshared electron pair is an even number, a composite material of a metal that belongs to an odd-numbered group in the periodic table and the first organic compound can be used for the layer 105.

For example, manganese (Mn), which is a metal belonging to Group 7, cobalt (Co), which is a metal belonging to Group 9, copper (Cu), silver (Ag), and gold (Au), which are metals belonging to Group 11, and aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 552S and the layer 105 can increase the adhesion between the layer 105 and the electrode 552S.

When the number of electrons of the first organic compound having an unshared electron pair is an odd number, a composite material of the first metal that belongs to an even-numbered group in the periodic table and the first organic compound can be used for the layer 105. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed, or the like can be used as the material having an electron-injection property.

Note that this embodiment can be combined with any of the other embodiments described in this specification as appropriate.

Embodiment 4

In this embodiment, a structure of a device 700 of one embodiment of the present invention will be described with reference to FIG. 2A and FIG. 2B.

Figure 2A:
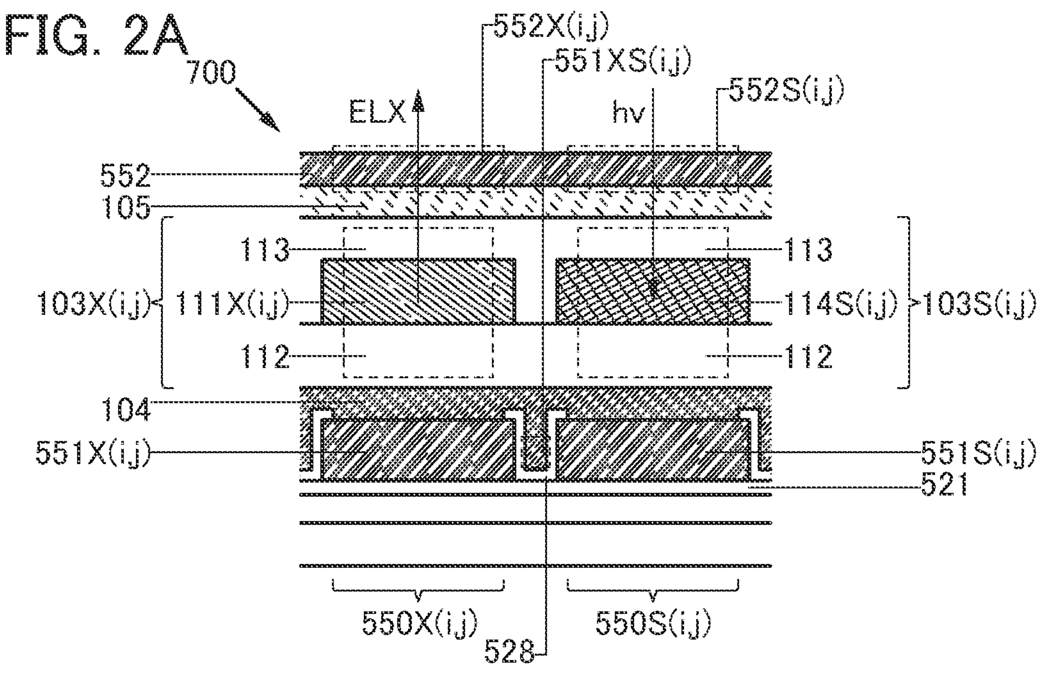
FIG. 2A and FIG. 2B are diagrams illustrating structures of a display device of one embodiment of the present invention.
Figure 2B:
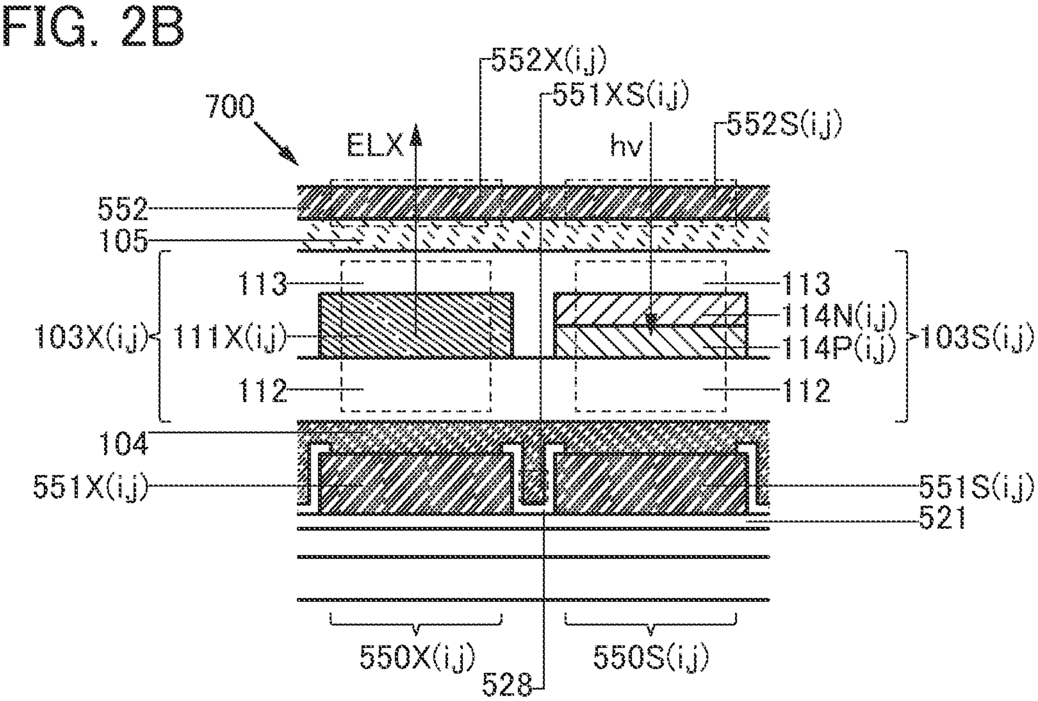

FIG. 2A is a cross-sectional view illustrating a structure of the device 700 of one embodiment of the present invention, and FIG. 2B is a cross-sectional view illustrating a structure of the device 700 of one embodiment of the present invention different from that in FIG. 2A.

Structure Example 1 of Device 700

The device 700 described in this embodiment includes the light-emitting device 550X(*i,j*) and the photoelectric conversion device 550S(*i,j*) (see FIG. 2A). The photoelectric conversion device 550S(*i,j*) is adjacent to the light-emitting device 550X(*i,j*).

The device 700 includes an insulating film 521, and the photoelectric conversion device 550S(*i,j*) and the light-emitting device 550X(*i,j*) are formed over the insulating film 521.

Structure Example 1 of Photoelectric Conversion Device 550S(i,j)

The photoelectric conversion device 550S(*i,j*) includes the electrode 551S(*i,j*), the electrode 552S(*i,j*), and the unit 103S(*i,j*). Furthermore, the photoelectric conversion device 550S(*i,j*) includes the layer 104 and the layer 105.

For example, the photoelectric conversion device described in any of Embodiment 1 to Embodiment 3 can be used as the photoelectric conversion device 550S(*i,j*). Specifically, the structure that can be used for the electrode 551S can be used for the electrode 551S(*i,j*). In particular, a material having a work function of 4.0 eV or higher can be suitably used for the electrode 551S(*i,j*).

The structure that can be used for the unit 103S can be used for the unit 103S(*i,j*).

For example, the structure that can be used for the layer 104 described in Embodiment 2 can be used for the layer 104 of the light-emitting device described in this embodiment.

For example, the structure that can be used for the layer 105 described in Embodiment 3 can be used for the layer 105 of the light-emitting device described in this embodiment. The layer 105 can be referred to as an electron-injection layer.

Structure Example 1 of Light-Emitting Device 550X(i))

The light-emitting device 550X(*i,j*) includes an electrode 551X(*i,j*), an electrode 552X(*i,j*), and a unit 103X(*i,j*) (see FIG. 2A). The electrode 552X(*i,j*) overlaps with the electrode 551X(*i,j*), and the unit 103X(*i,j*) is interposed between the electrode 551X(*i,j*) and the electrode 552X(*i,j*).

The electrode 551X(*i,j*) is adjacent to the electrode 551S(*i,j*), and a gap 551XS(*i,j*) is provided between the electrode 551X(*i,j*) and the electrode 551S(*i,j*).

For example, a material that can be used for the electrode 551S(*i,j*) can be used for the electrode 551X(*i,j*).

Structure Example 1 of Unit 103X(*i,j*)

The unit 103X(*i,j*) has a single-layer structure or a stacked-layer structure. For example, the unit 103X(*i,j*) includes a layer 111X(*i,j*), the layer 112, and the layer 113 (see FIG. 2A). The layer 1*l* IX(*i,j*) is interposed between the layer 112 and the layer 113, the layer 112 is interposed between the electrode 551X(*i,j*) and the layer 111X(*i,j*), and the layer 113 is interposed between the electrode 552X(*i,j*) and the layer 111X(*i,j*).

For example, a layer selected from functional layers such as a light-emitting layer, a hole-transport layer, an electron-transport layer, and a carrier-blocking layer can be used in the unit 103X(*i,j*). Moreover, a layer selected from functional layers such as a hole-injection layer, an electron-injection layer, an exciton-blocking layer, and a charge-generation layer can be used in the unit 103X(*i,j*).

Structure Example 2 of Light-Emitting Device 550X(*i,j*)

The light-emitting device 550X(*i,j*) includes the layer 104 and the layer 105. The layer 104 is interposed between the electrode 551X(*i,j*) and the unit 103X(*i,j*), and the layer 105 is interposed between the unit 103X(*i,j*) and the electrode 552X(*i,j*). Note that a conductive film 552 includes the electrode 552X(*i,j*) and the electrode 552S(*i,j*).

Note that some of the components of the photoelectric conversion device 550S(*i,j*) can be used as some of the components of the light-emitting device 550X(*i,j*). Thus, some of the components can be used in common. Alternatively, the manufacturing step can be simplified.

Structure Example 2 of Device 700

The device 700 described in this embodiment includes an insulating film 528 (see FIG. 2A).

Structure Example of Insulating Film 528

The insulating film 528 has opening portions; one opening portion overlaps with the electrode 551S(*i,j*) and the other opening portion overlaps with the electrode 551X(*i,j*).

Structure Example 3 of Device 700

The device 700 described in this embodiment includes the layer 111X(*i,j*) (see FIG. 2A or FIG. 2B).

Structure Example 1 of Layer 111X(*i,j*)

A light-emitting material or a light-emitting material and a host material can be used for the layer 111X(*i,j*), for example. The layer 111X(*i,j*) can be referred to as a light-emitting layer. The layer 111X(*i,j*) is preferably provided in a region where holes and electrons are recombined. In that case, energy generated by recombination of carriers can be efficiently converted into light and emitted. Furthermore, the layer 111X(*i,j*) is preferably provided apart from a metal used for the electrode or the like. In that case, a quenching phenomenon caused by the metal used for the electrode or the like can be inhibited.

For example, a light-emitting device that emits blue light, a light-emitting device that emits green light, and a light-emitting device that emits red light can be provided in the device 700. Alternatively, a light-emitting device that emits white light, a light-emitting device that emits yellow light, and a light-emitting device that emits infrared rays can be provided in the device 700.

Structure Example 2 of Layer 111X(*i,j*)

For example, a fluorescent substance, a phosphorescent substance, or a substance exhibiting thermally activated delayed fluorescence (TADF) (also referred to as a TADF material) can be used as the light-emitting material. Thus, energy generated by recombination of carriers can be released as light ELX from the light-emitting material (see FIG. 2A or FIG. 2B).

[Fluorescent Substance]

A fluorescent substance can be used for the layer 111X(*i,j*). For example, the following fluorescent substances can be used for the layer 111X(*i,j*). Note that without being limited to the following ones, a variety of known fluorescent substances can be used for the layer 111X(*i,j*).

Specifically, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',NN"N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), NN,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2(2-{2-[4-(dimethylamino)phenyl]ethenyl}-6-methyl-4H-pyran-4-ylidene)propanedinitrile (abbreviation: DCM1), 2-(2- methyl-6-[2-(2,3,6,7-tetrahydro-1H,5H-benzo[i,j]quinolizin-9-yl)ethenyl]-4H-pyran-4-ylidene)propanedinitrile (abbreviation: DCM2), N,N,N',N'-tetrakis(4-methylphenyl)tetracene-5,11-diamine (abbreviation: p-mPhTD), 7,14-diphenyl-N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[i,j]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[i,j]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[i,j]quinolizin-9-yl)ethenyll-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine](abbreviation: 1,6BnfAPm-03), 3,10-bis[N-(9-phenyl-9H-carbazol-2-yl)-N-phenylamino]naphtho[2,3-h; 6,7-b']bisbenzofuran (abbreviation: 3,10PCA2Nbf(IV)-02), or 3,10-bis[N-(dibenzofuran-3-yl)-N-phenylamino]naphtho[2,3-b:6,7-b']bisbenzofuran (abbreviation: 3,10FrA2Nbf(IV)-02).

Condensed aromatic diamine compounds typified by pyrenediamine compounds such as 1,6FLPAPm, 1,6mMemFLPAPm, and 1,6BnfAPm-03 are particularly preferable because of their high hole-trapping properties, high emission efficiency, or high reliability.

[Phosphorescent Substance]

A phosphorescent substance can be used for the layer 111X(*i,j*). For example, any of the following phosphorescent substances can be used for the layer 111X(*i,j*). Note that without being limited to the following ones, any of a variety of known phosphorescent substances can be used for the layer 111X(*i,j*).

For the layer 111X(*i,j*), it is possible to use, for example, an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, or a platinum complex.

[Phosphorescent Substance (Blue)]

As an organometallic iridium complex having a 4H-triazole skeleton or the like, for example, tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, for example, tris[3-methyl-1-(2-methylphenyl)-5-phenyl-1H-1,2,4-triazolato]iridium(III) (abbreviation: [Ir(Mptz1-mp)$_3$]), tris(I-methyl-5-phenyl-3-propyl-1H-1,2,4-triazolato]iridium(III) (abbreviation: [Ir(Prptz1-Me)$_3$]), or the like can be used.

As an organometallic iridium complex having an imidazole skeleton or the like, for example, fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, for example, bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^2$]iridium(III) picolinate (abbreviation: Flrpic), bis{2-[3',5'-bis(trifluoromethyl)phenyl]pyridinato-N,C$^2$}iridium(III) picolinate (abbreviation: [Ir(CF$_3$ppyh$_2$(pic)]), bis[2-(4',6'-difluorophenyl)pyridinato-N,C$^2$]iridium(III) acetylacetonate (abbreviation: Firacac), or the like can be used.

Note that these are compounds exhibiting blue phosphorescence and are compounds having an emission wavelength peak at 440 nm to 520 nm.

[Phosphorescent Substance (Green)]

As an organometallic iridium complex having a pyrimidine skeleton or the like, it is possible to use, for example, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbomyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato)bis(4,6-diphenylpyrimidinato)iridium(III) (abbreviation:[Ir(dppm)$_2$(acac)]).

As an organometallic iridium complex having a pyrazine skeleton or the like, for example, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, it is possible to use, for example, tris(2-phenylpyridinato-N,C$^2$)iridium(III) (abbreviation: [Ir(ppy)$_3$]), bis(2-phenylpyridinato-N,C$^2$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^2$)iridium(III) (abbreviation: [Ir(pq)$_3$]), bis(2-phenylquinolinato-N,C$^2$)iridium(III) acetylacetonate (abbreviation: [Ir(pq)$_2$(acac)]), [2-d3-methyl-8-(2-pyridinyl-κN)benzofuro[2,3-b]pyridine-κC]bis[2-(5-d3-methyl-2-pyridinyl-κN2)phenyl-κC]iridium(III) (abbreviation: [Ir(5mppy-d3)$_2$(mbfpypy-d3)]), or [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]).

An example of a rare earth metal complex is tris(acetylacetonato) (monophenanthroline)terbium(III) (abbreviation: [Tb(acac)$_3$(Phen)]).

Note that these are compounds mainly exhibiting green phosphorescent light and have an emission wavelength peak at 500 nm to 600 nm. An organometallic iridium complex having a pyrimidine skeleton excels particularly in reliability or emission efficiency.

[Phosphorescent Substance (Red)]

As an organometallic iridium complex having a pyrimidine skeleton or the like, for example, (diisobutyrylmethanato)bis[4,6-bis(3-methylphenyl)pyrimidinato]iridium(III)

(abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), or bis[4,6-di(naphthalen-1-yl)pyrimidinato] (dipivaloylmethanato)iridium(III) (abbreviation: [Ir(dlnpm)$_2$(dpm)]) can be used.

As an organometallic iridium complex having a pyrazine skeleton or the like, for example, (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato] iridium(III) (abbreviation: [Ir(Fdpqh(acac)]) can be used.

As an organometallic iridium complex having a pyridine skeleton or the like, for example, tris(I-phenylisoquinolinato-N,C$^2$)iridium(III) (abbreviation: [Ir(piq)$_3$]) or bis(1-phenylisoquinolinato-N,C$^2$)iridium(III) acetylacetonate (abbreviation: [Ir(piq)$_2$(acac)]) can be used.

As a rare earth metal complex or the like, for example, tris(1,3-diphenyl-1,3-propanedionato)(monophenanthroline)europium(III)(abbreviation: [Eu(DBM)$_3$(Phen)]), or tris [1-(2-thenoyl)-3,3,3-trifluoroacetonato] (monophenanthroline)europium(III) (abbreviation: [Eu(TTA)$_3$(Phen)]) can be used.

As a platinum complex or the like, 2,3,7,8,12,13,17,18-octaethyl-21H,23H-porphyrin platinum(II) (abbreviation: PtOEP) can be used, for example.

Note that these are compounds exhibiting red phosphorescent light and have an emission peak at 600 nm to 700 nm. Furthermore, from the organometallic iridium complex having a pyrazine skeleton, red light emission with chromaticity favorably used for display devices can be obtained.

[Substance Exhibiting Thermally Activated Delayed Fluorescence (TADF)]

A TADF material can be used for the layer 111X(*i,j*). For example, any of the TADF materials given below can be used as the light-emitting material. Note that without being limited thereto, any of a variety of known TADF materials can be used as the light-emitting material.

In the TADF material, the difference between the S1 level and the T1 level is small, and reverse intersystem crossing (upconversion) from the triplet excited state into the singlet excited state can be achieved by a little thermal energy. Thus, the singlet excited state can be efficiently generated from the triplet excited state. In addition, the triplet excitation energy can be converted into light emission.

An exciplex whose excited state is formed of two kinds of substances has an extremely small difference between the S1 level and the T1 level and functions as a TADF material capable of converting triplet excitation energy into singlet excitation energy.

A phosphorescence spectrum observed at a low temperature (e.g., 77 K to 10 K) is used for an index of the T1 level, for example. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably smaller than or equal to 0.3 eV, further preferably smaller than or equal to 0.2 eV, for example.

When a TADF material is used as the light-emitting substance, the S1 level of the host material is preferably higher than the S1 level of the TADF material. In addition, the T1 level of the host material is preferably higher than the T1 level of the TADF material.

Examples of the TADF material include fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used as the TADF material.

Specifically, any of the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio 1)), an octaethylporphyrin-platinum chloride complex ($PtCl_2$OEP), and the like.

[Chemical Formulae 14]

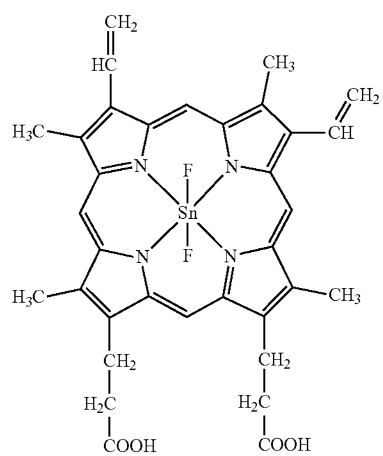

$SnF_2$(Proto IX)

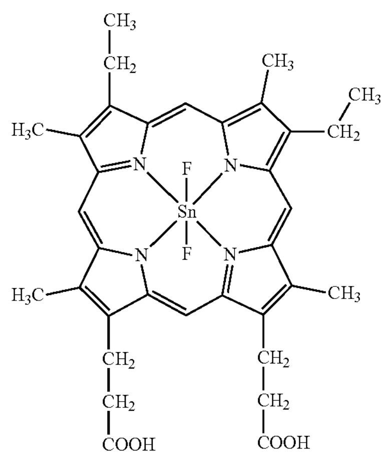

$SnF_2$(Meso IX)

-continued

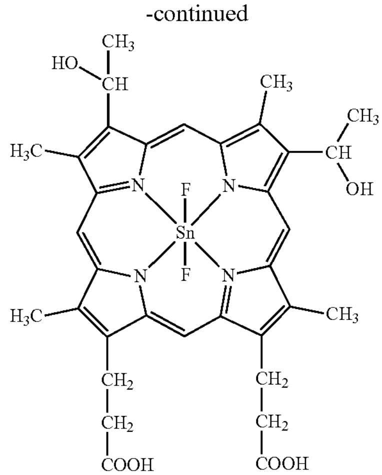

$SnF_2$(Hemato IX)

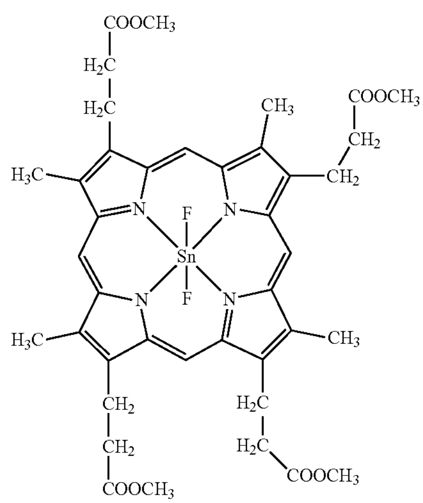

$SnF_2$(Copro III-4Me)

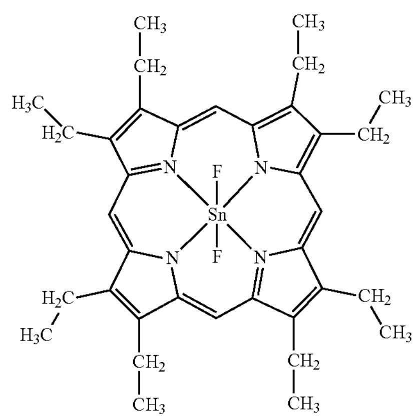

$SnF_2$(OEP)

-continued

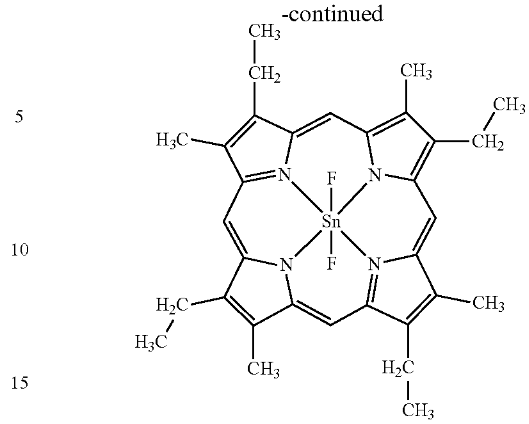

$SnF_2$(EtiO I)

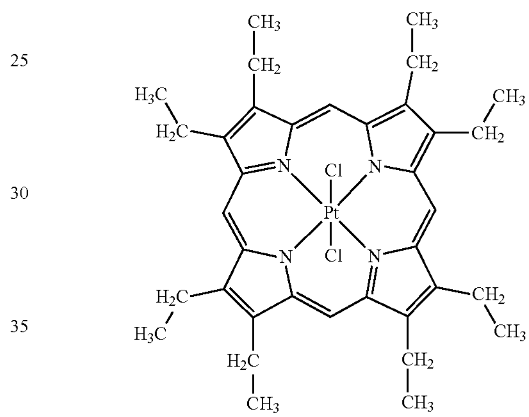

$PtCl_2OEP$

Furthermore, a heterocyclic compound including one or both of a π-electron rich heteroaromatic ring and a n-electron deficient heteroaromatic ring can be used, for example, as the Specifically, any of the following materials whose structural formulae are shown below can be used: 2-(biphenyl-4-yl)-4,6-bis(12-phenylindolo[2,3-a]carbazol-11-yl)-1,3,5-triazine (abbreviation-PIC-TRZ), 9-(4,6-diphenyl-1,3,5-triazin-2-yl)-9'-phenyl-9H,9'H-3,3'-bicarbazole (abbreviation: PCCzTmn), 2-{4-[3-(NV-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-trazine (abbreviation: PXZ-TRZ), 3-[4-(5-phenyl-5,10-dihydrophenann-10-yl) phenyl]-4,5-diphenyl-1,2,4-triazole (abbreviation: PPZ-3TPT), 349,9-dimethyl-9H-acri din-10-yl)-9H-xanthen-9-one (abbreviation: ACRXTN), bis[4-(9,9-dimethyl-9,10-dihydroacridine)phenyl]sulfone (abbreviation; DMAC-DPS), 10-phenyl-10H,10'H-spiro[acridin-9,9'-anthracen]-10'-one (abbreviation; ACRSA), and the like.

[Chemical Formulae 15]
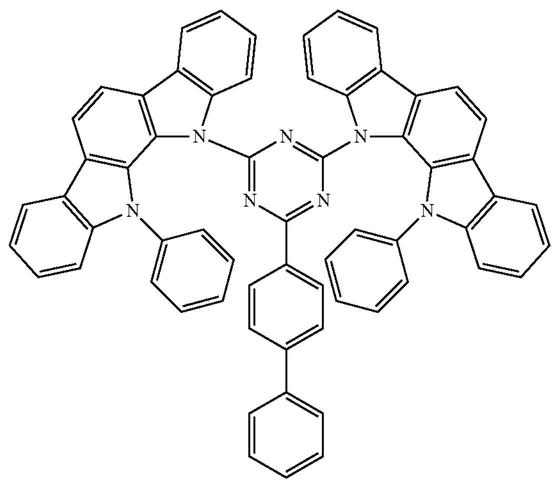
PIC-TRZ
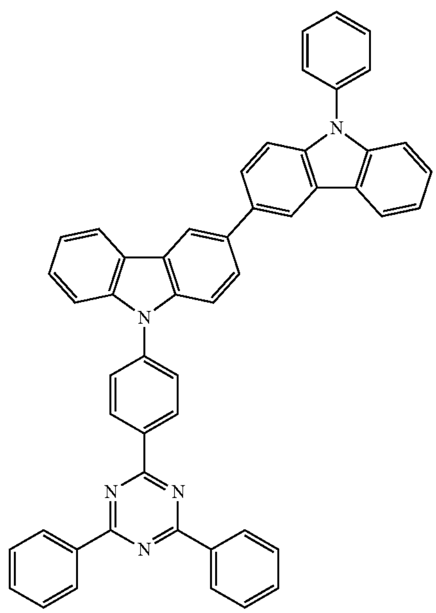
PCCzPTzn
-continued
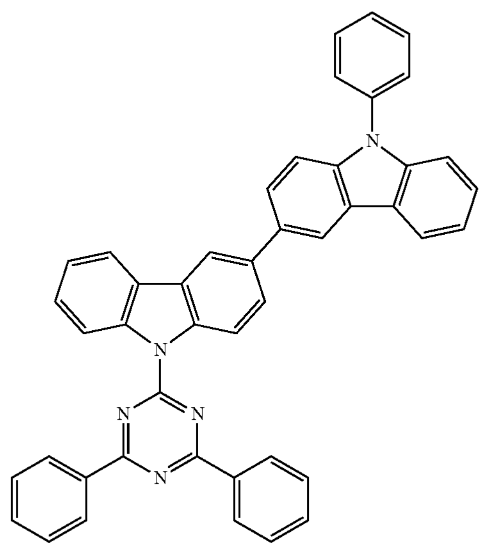
PCCzTzn
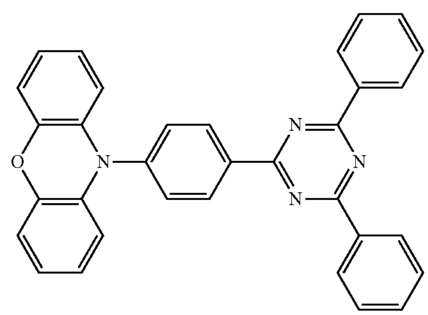
PXZ-TRZ
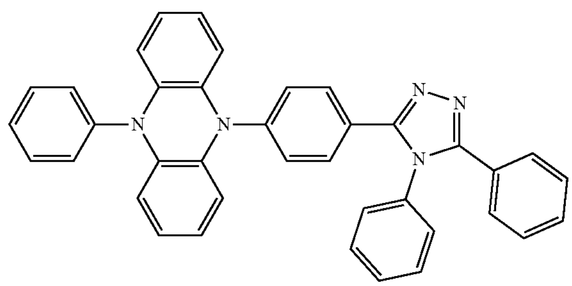
PPZ-3TPT
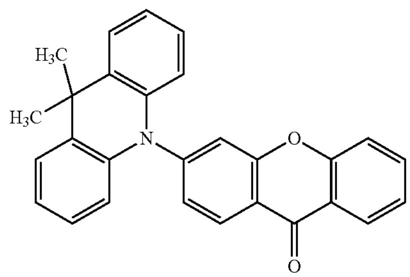
ACRXTN -continued

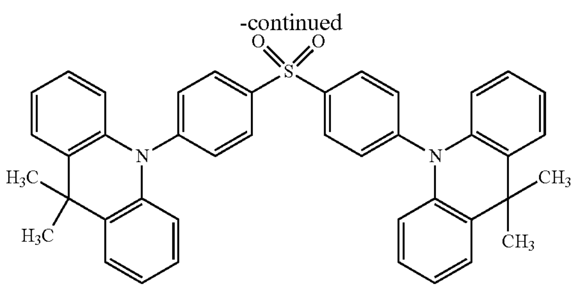

DMAC-DPS

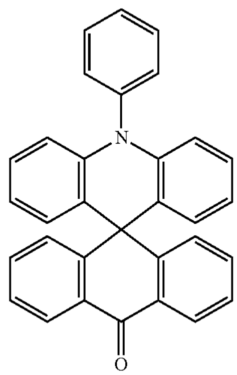

ACRSA

Such a heterocyclic compound is preferable because of having a high electron-transport property and a high hole-transport property owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferable because of their high stability and reliability. In particular, a benzofutropyrimidine skeleton, a benzothienopyrimidine skeleton, a benzofuropyrazine skeleton, and a benzothienopyrazine skeleton, which have high acceptor properties and favorable reliability, are preferable.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton, for example. As a pyrrole skeleton, for example, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a n-electron rich skeleton can be used instead of at least one of the π-electron deficient heteroaromatic ring and the n-electron rich heteroaromatic ring.

Structure Example 3 of Layer 111X(*i,j*)>

A material having a carrier-transport property can be used as the host material. For example, a material having a hole-transport property, a material having an electron-transport property, a substance exhibiting thermally activated delayed fluorescence TADF, a material having an anthracene skeleton, or a mixed material can be used as the host material. A material having a wider band gap than the light-emitting material contained in the layer 111X(*i,j*) is preferably used as the host material. In that case, energy transfer from excitons generated in the layer 111X(*i,j*) to the host material can be inhibited.

[Material Having Hole-Transport Property]

A material having a hole mobility higher than or equal to $1\times10^{-6}$ $cm^2/Vs$ can be suitably used as the material having a hole-transport property.

For example, the material having a hole-transport property that can be used for the layer 112 described in Embodiment 1 can be used for the layer 111X(*i,j*).

[Material Having Electron-Transport Property]

A metal complex or an organic compound having a π-electron deficient heteroaromatic ring skeleton can be used as the material having an electron-transport property.

For example, the material having an electron-transport property that can be used for the layer 113 described in Embodiment 1 can be used for the layer 111X(*i,j*). Specifically, a material having a hole-transport property that can be used for an electron-transport layer can be used for the layer 111X(*i,j*).

[Material Having Anthracene Skeleton]

An organic compound having an anthracene skeleton can be used as the host material. In particular, when a fluorescent substance is used as the light-emitting substance, an organic compound having an anthracene skeleton is suitable. In that case, a light-emitting device with high emission efficiency and high durability can be obtained.

As the organic compound having an anthracene skeleton, for example, an organic compound having a diphenylanthracene skeleton, in particular, a 9,10-diphenylanthracene skeleton is chemically stable and thus is preferable. The host material preferably has a carbazole skeleton, in which case the hole-injection and hole-transport properties are improved. In particular, the host material preferably has a dibenzocarbazole skeleton, in which case the HOMO level thereof is shallower than that of carbazole by approximately 0.1 eV, so that holes enter the host material easily, the hole-transport property is improved, and the heat resistance is increased. Note that in terms of the hole-injection and hole-transport properties, a benzofluorene skeleton or a dibenzofluorene skeleton may be used instead of a carbazole skeleton.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

For example, it is possible to use 6-[3-(9,10-diphenyl-2-anthyl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-βNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), or 3-[4-(1-naphthyl)-phenyl]-9-phenyl-9H-carbazole (abbreviation: PCPN).

In particular, CzPA, cgDBCzPA, 2mBnfPPA, and PCzPA have excellent characteristics.

[Substance Exhibiting Thermally Activated Delayed Fluorescence (TADF)]

A TADF material can be used for the layer 111X(*i,j*). For example, any of the TADF materials given below can be used as the host material. Note that without being limited thereto, a variety of known TADF materials can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than the S1 level of the fluorescent substance in order that high emission efficiency can be achieved. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used, for example. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance, whereby the distance between the TADF material and the luminophore of the fluorescent substance can be made away from each other with little influence on carrier transport or carrier recombination.

Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, a material having an electron-transport property and a material having a hole-transport property can be used in the mixed material. The weight ratio between the material having a hole-transport property and the material having an electron-transport property contained in the mixed material is =1/19 or more and 19 or less. Accordingly, the carrier-transport property of the layer 111X(*i,j*) can be easily adjusted. In addition, a recombination region can be controlled easily.

Structure Example 2 of Mixed Material

A material mixed with a phosphorescent substance can be used as the host material. When a fluorescent substance is used as the light-emitting substance, a phosphorescent substance can be used as an energy donor for supplying excitation energy to the fluorescent substance.

A mixed material containing a material to form an exciplex can be used as the host material. For example, a material forming an exciplex whose emission spectrum overlaps with the wavelength of the absorption band on the lowest energy side of the light-emitting substance can be used as the host material. This enables smooth energy transfer and improves emission efficiency. Alternatively, the driving voltage can be reduced.

A phosphorescent substance can be used as at least one of the materials forming an exciplex. Accordingly, reverse intersystem crossing can be used. Alternatively, triplet excitation energy can be efficiently converted into singlet excitation energy.

A combination of materials forming an exciplex is preferably such that the HOMO level of a material having a hole-transport property is higher than or equal to the HOMO level of a material having an electron-transport property, for example. Alternatively, the LUMO level of the material having a hole-transport property is preferably higher than or equal to the LUMO level of the material having an electron-transport property. In that case, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of a mixed film in which the material having a hole-transport property and the material having an electron-transport property are mixed is shifted to a longer wavelength than the emission spectrum of each of the materials (or has another peak on the longer wavelength side) observed in comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed in comparison of transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed in comparison of the transient EL of the material having a hole-transport property, the transient EL of the material having an electron-transport property, and the transient EL of the mixed film of these materials.

Structure Example of Layer 112

For example, a material having a hole-transport property can be used for the layer 112. The layer 112 can be referred to as a hole-transport layer. A material having a wider band gap than the light-emitting material contained in the layer 111X(*i,j*) is preferably used for the layer 112. In that case, energy transfer from excitons generated in the layer 111X(*i,j*) to the layer 112 can be inhibited. Note that the structure that can be used for the layer 112 described in Embodiment 1 can be used for the layer 112.

Structure Example of Layer 113

A material having an electron-transport property, a material having an anthracene skeleton, or a mixed material can be used for the layer 113, for example. The layer 113 can be referred to as an electron-transport layer. A material having a wider band gap than the light-emitting material contained in the layer 111X(*i,j*) is preferably used for the layer 113. In that case, energy transfer from excitons generated in the layer 111X(*i,j*) to the layer 113 can be inhibited. Note that the structure that can be used for the layer 113 described in Embodiment 1 can be used for the layer 113.

Note that this embodiment can be combined with any of the other embodiments described in this specification as appropriate.

Embodiment 5

In this embodiment, a structure of a device of one embodiment of the present invention will be described with reference to FIG. 3 to FIG. 7.

FIG. 3 is a diagram illustrating a structure of a device of one embodiment of the present invention. FIG. 3A is a top view of the device of one embodiment of the present invention, and FIG. 3B is a top view illustrating part of FIG. 3A. FIG. 3C is a cross-sectional view taken along the cutting line X1-X2, the cutting line X3-X4, the cutting line X9-X10, and the cutting line X11-X12 illustrated in FIG. 3A and in a pixel set 703(*i,j*) illustrated in FIG. 3A.

Figure 4:
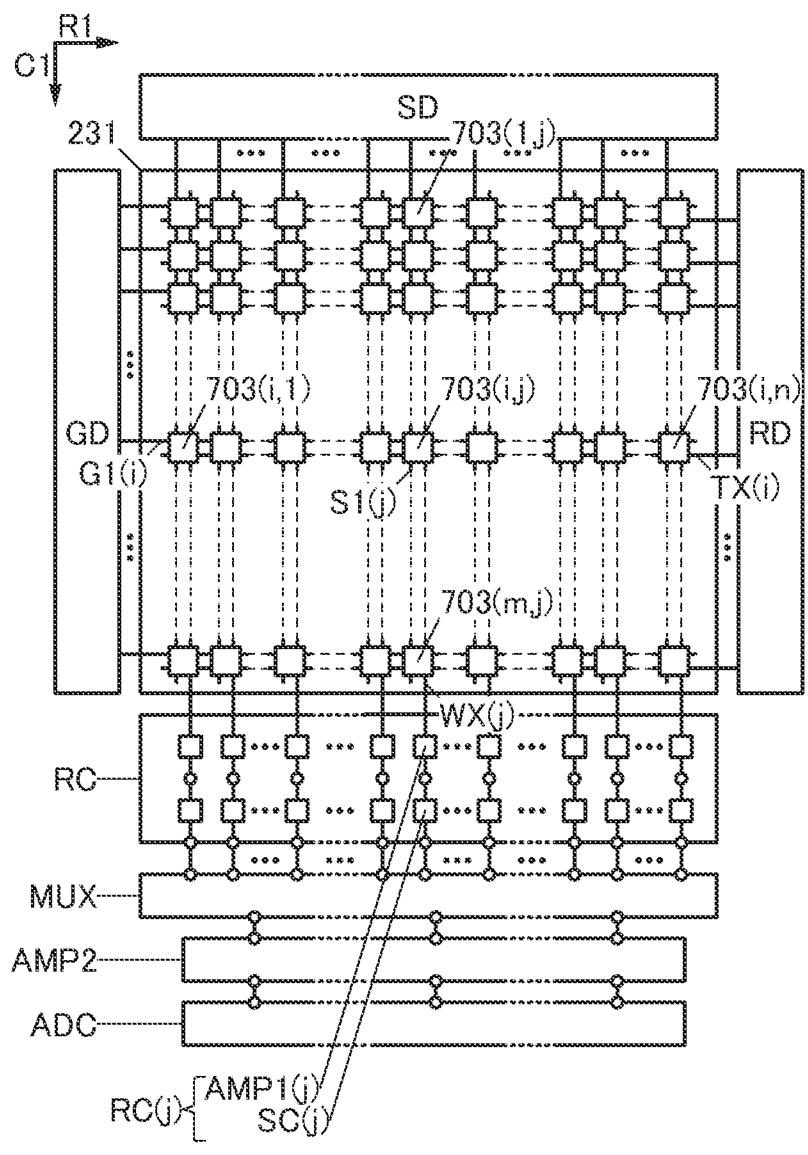
FIG. 4 is a diagram illustrating a structure of a device of one embodiment of the present invention.

FIG. 4 is a block diagram illustrating a structure of a device of one embodiment of the present invention.

Figure 5:
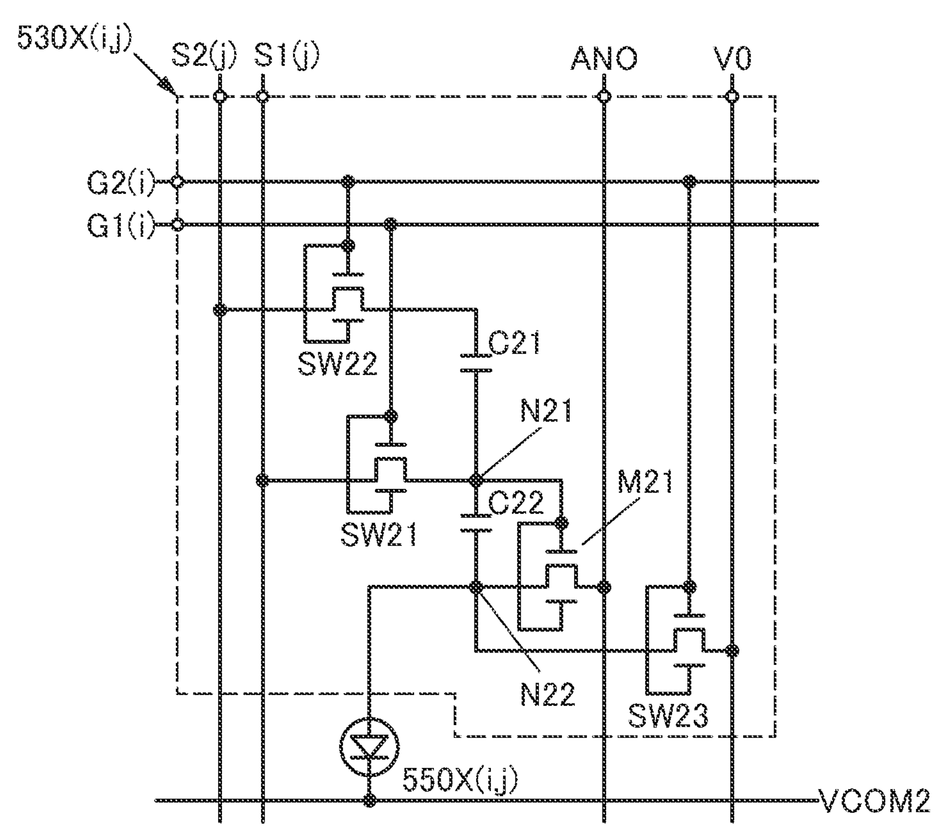
FIG. 5 is a circuit diagram illustrating a structure of a device of one embodiment of the present invention.

FIG. 5 is a circuit diagram illustrating a structure of a device of one embodiment of the present invention.

Figure 6:
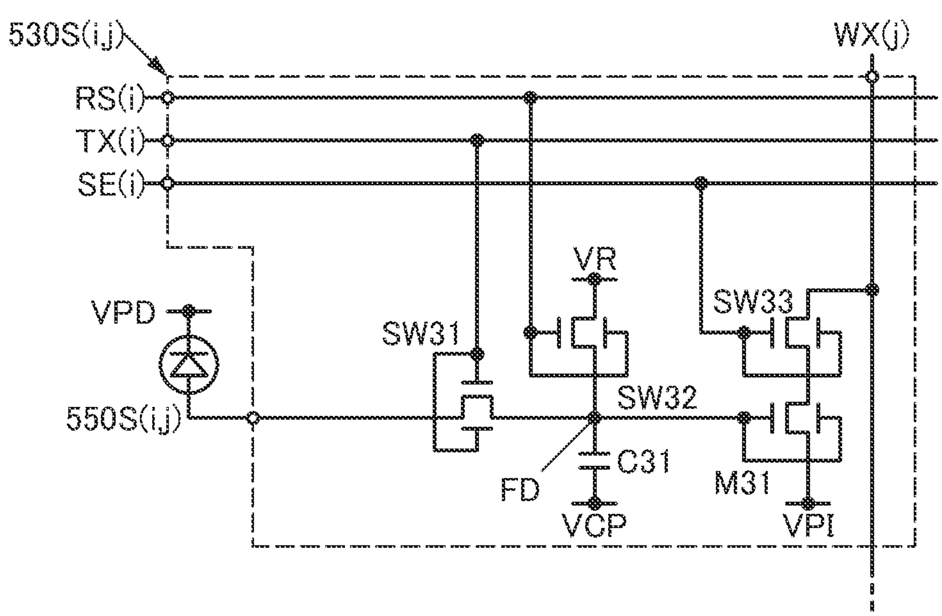
FIG. 6 is a circuit diagram illustrating a structure of a device of one embodiment of the present invention.

FIG. 6 is a circuit diagram illustrating a structure of a device of one embodiment of the present invention.

Figure 7A:
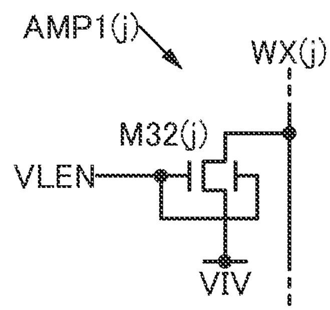
FIG. 7A and FIG. 7B are circuit diagrams illustrating a structure of a device of one embodiment of the present invention.
Figure 7B:
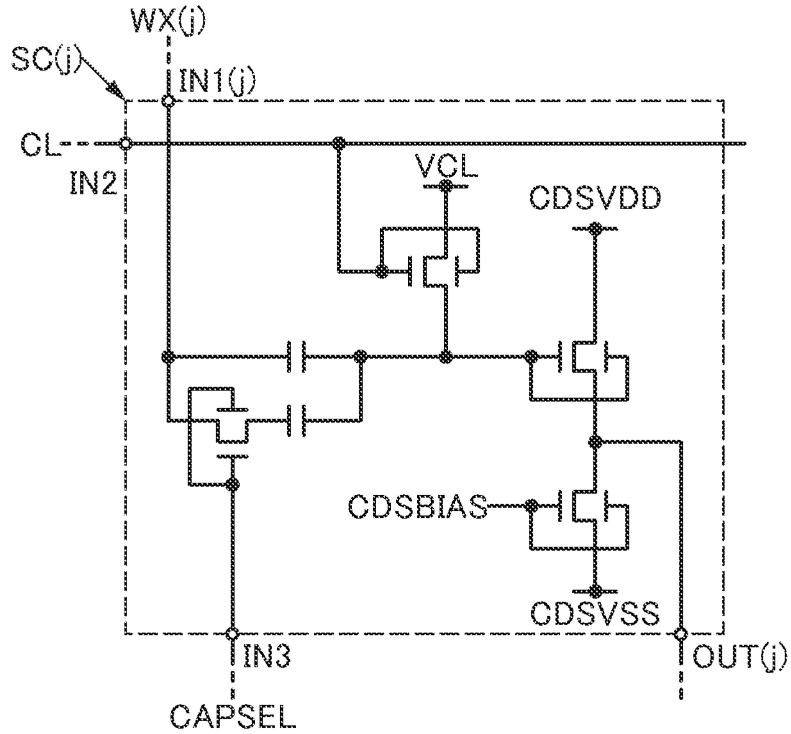

FIG. 7 is a circuit diagram illustrating a structure of a device of one embodiment of the present invention. FIG. 7A is a circuit diagram illustrating an amplifier circuit AMP1(*j*) that can be used in the device of one embodiment of the present invention, and FIG. 7B is a circuit diagram of a sampling circuit SC(j) that can be used in a functional panel of one embodiment of the present invention.

Note that in this specification, an integer variable of 1 or more is sometimes used in reference numerals. For example, (p) where p is an integer variable of 1 or more is sometimes used in part of a reference numeral that specifies any of p components at a maximum. As another example, (m, n) where m and n are each an integer variable of 1 or more is sometimes used in part of a reference numeral that specifies any of m×n components at a maximum.

Structure Example 1 of Device 700

The device 700 of one embodiment of the present invention includes a region 231, a conductive film ANO, and a conductive film VCOM2 (see FIG. 3A). The region 231 includes the pixel set 703(*i,j*).

Structure Example 1 of Pixel Set 703(*i,j*)

The pixel set 703(*i,j*) includes a pixel 702X(*i,j*) (see FIG. 3B and FIG. 3C).

The pixel 702X(*i,j*) includes the light-emitting device 550X(*i,j*) and a pixel circuit 530X(*i,j*). One electrode of the light-emitting device 550X(*i,j*) is electrically connected to the pixel circuit 530X(*i,j*) and the other electrode of the light-emitting device 550X(*i,j*) is electrically connected to the conductive film VCOM2.

For example, the light-emitting device described in Embodiment 4 can be used as the light-emitting device 550X(*i,j*).

The pixel circuit 530X(*i,j*) is electrically connected to the conductive film ANO (see FIG. 5). The device 700 has a function of displaying an image. The device 700 is a display device.

Structure Example 2 of Pixel Set 703(*i,j*)

The pixel set 703(*i,j*) includes a pixel 702S(*i,j*) (see FIG. 3B and FIG. 3C).

The pixel 702S(*i,j*) includes the photoelectric conversion device 550S(*i,j*) and a pixel circuit 530S(*i,j*). One electrode of the photoelectric conversion device 550S(*i,j*) is electrically connected to the pixel circuit 530S(*i,j*) and the other electrode of the photoelectric conversion device 550S(*i,j*) is electrically connected to a conductive film VPD.

For example, the photoelectric conversion device described in any of Embodiment 1 to Embodiment 3 can be used as the photoelectric conversion device 550S(*i,j*).

The pixel circuit 530S(*i,j*) is electrically connected to a conductive film WX(j) and the pixel circuit 530S(*i,j*) has a function of supplying an imaging signal (see FIG. 6). The device 700 has a function of supplying an imaging signal. The device 700 is also an image capturing device.

Structure Example 2 of Device 700

The device 700 of one embodiment of the present invention includes a functional layer 540 and a functional layer 520 (see FIG. 3C). The functional layer 540 overlaps with the functional layer 520.

The functional layer 540 includes the light-emitting device 550X(*i,j*) and the photoelectric conversion device 550S(*i,j*).

The functional layer 520 includes the pixel circuit 530X (*i,j*), the conductive film ANO, and the conductive film VCOM2.

The functional layer 520 includes the pixel circuit 530S (*i,j*), a conductive film WX(i), and the conductive film VPD.

Structure Example 3 of Device 700

The device 700 of one embodiment of the present invention includes a driver circuit GD, a conductive film G1(*i*), and a conductive film G2(*i*) (see FIG. 4 and FIG. 5).

Structure Example of Driver Circuit GD

The driver circuit GD supplies a first selection signal and a second selection signal.

The conductive film G1(*i*) is supplied with the first selection signal, and the conductive film G2(*i*) is supplied with the second selection signal.

Structure Example 4 of Device 700

The device 700 of one embodiment of the present invention includes a driver circuit SD, a conductive film S1(*j*), and a conductive film S2(*j*) (see FIG. 4 and FIG. 5). The device 700 also includes a conductive film V0.

Structure Example of Driver Circuit SD

The driver circuit SD supplies a first control signal and a second control signal.

The conductive film S1(*j*) is supplied with the first control signal, and the conductive film S2(*j*) is supplied with the second control signal.

Structure Example 1 of Pixel Circuit 530X(*i,j*)

The pixel circuit 530X(*i,j*) is electrically connected to the conductive film G1(*i*) and the conductive film S1(*j*). The conductive film G1(*i*) supplies the first selection signal, and the conductive film S1(*j*) supplies the first control signal.

The pixel circuit 530X(*i,j*) drives the light-emitting device 550X(*i,j*) based on the first selection signal and the first control signal. The light-emitting device 550X(*i,j*) emits light.

Structure Example 2 of Pixel Circuit 530X(*i,j*)

The pixel circuit 530X(*i,j*) includes a switch SW21, a switch SW22, a transistor M21, a capacitor C21, and a node N21.

The transistor M21 includes a gate electrode electrically connected to the node N21, a first electrode electrically connected to the light-emitting device 550X(*i,j*), and a second electrode electrically connected to the conductive film ANO.

The switch SW21 includes a first terminal electrically connected to the node N21, a second terminal electrically connected to the conductive film S1(*j*), and a gate electrode having a function of controlling the conduction state or the non-conduction state on the basis of the potential of the conductive film G1(*i*).

The switch SW22 includes a first terminal electrically connected to the conductive film S2(*j*) and a gate electrode having a function of controlling the conduction state or the non-conduction state on the basis of the potential of the conductive film G2(*i*).

The capacitor C21 includes a conductive film electrically connected to the node N21 and a conductive film electrically connected to a second electrode of the switch SW22.

Thus, an image signal can be stored in the node N21. The potential of the node N21 can be changed using the switch SW22. Alternatively, the intensity of light emitted from the light-emitting device 550X(*i,j*) can be controlled with the potential of the node N21. As a result, a novel device that is highly convenient, useful, or reliable can be provided.

Structure Example 3 of Pixel Circuit 530X(*i,j*)

The pixel circuit 530X(*i,j*) includes a switch SW23, a node N22, and a capacitor C22.

The switch SW23 includes a first terminal electrically connected to the conductive film V0, a second terminal electrically connected to the node N22, and a gate electrode having a function of controlling the conduction state or the non-conduction state on the basis of the potential of the conductive film G2(*i*).

The capacitor C22 includes a conductive film electrically connected to the node N21 and a conductive film electrically connected to the node N22.

Note that the first electrode of the transistor M21 is electrically connected to the node N22.

Structure Example 5 of Device 700

The device 700 of one embodiment of the present invention includes a driver circuit RD, a conductive film RS(i), a conductive film TX(i), and a conductive film SE(i) (see FIG. 4 and FIG. 6).

Structure Example of Driver Circuit RD

The driver circuit RD supplies a third selection signal, a fourth selection signal, and a fifth selection signal.

The conductive film RS(i) is supplied with the third selection signal, the conductive film TX(i) is supplied with the fourth selection signal, and the conductive film SE(i) is supplied with the fifth selection signal.

Structure Example 1 of Pixel Circuit 530S(*i,j*)

The pixel circuit 530S(*i,j*) is electrically connected to the conductive film RS(i), the conductive film TX(i), and the conductive film SE(i). The conductive film RS(i) is supplied with the third selection signal, the conductive film TX(i) is supplied with the fourth selection signal, and the conductive film SE(i) is supplied with the fifth selection signal.

The pixel circuit 530S(*i,j*) is initialized on the basis of the third selection signal, the pixel circuit 530S(*i,j*) performs image capturing on the basis of the fourth selection signal, and the pixel circuit 530S(*i,j*) supplies an imaging signal on the basis of the fifth selection signal. Image capturing can be performed in a period during which the light-emitting device 550X(*i,j*) emits light.

Structure Example 2 of Pixel Circuit 530S(*i,j*)

The pixel circuit 530S(*i,j*) includes a switch SW31, a switch SW32, a switch SW33, a transistor M31, a capacitor C31, and a node FD.

The switch SW31 includes a first terminal electrically connected to the photoelectric conversion device 550S(*i,j*), a second terminal electrically connected to the node FD, and a gate electrode having a function of controlling the conduction state or the non-conduction state on the basis of the potential of the conductive film TX(i).

The switch SW32 includes a first terminal electrically connected to the node FD, a second terminal electrically connected to a conductive film VR, and a gate electrode having a function of controlling the conduction state or the non-conduction state on the basis of the potential of the conductive film RS(i).

The capacitor C31 includes a conductive film electrically connected to the node FD and a conductive film electrically connected to a conductive film VCP.

The transistor M31 includes a gate electrode electrically connected to the node FD and a first electrode electrically connected to a conductive film VPI.

The switch SW33 includes a first terminal electrically connected to a second electrode of the transistor M31, a second terminal electrically connected to the conductive film WX(j), and a gate electrode having a function of controlling the conduction state or the non-conduction state on the basis of the potential of the conductive film SE(i).

Thus, an imaging signal generated by the photoelectric conversion device 550S(*i,j*) can be transferred to the node FD using the switch SW31. The imaging signal generated by the photoelectric conversion device 550S(*i,j*) can be stored in the node FD using the switch SW31. Electrical continuity between the pixel circuit 530S(*i,j*) and the photoelectric conversion device 550S(*i,j*) can be broken by the switch SW31. A correlated double sampling method can be used. Noise included in the imaging signal can be reduced. As a result, a novel device that is highly convenient, useful, or reliable can be provided.

Structure Example 6 of Device 700

The device 700 of one embodiment of the present invention includes a reading circuit RC, a conductive film CL, and a conductive film CAPSEL (see FIG. 4, FIG. 7A, and FIG. 7B).

The device 700 also includes a conductive film VLEN and a conductive film VIV.

The device 700 also includes a conductive film VCL, a conductive film CDSVDD, a conductive film CDSVSS, and a conductive film CDSBIAS.

Structure Example of Reading Circuit RC

The reading circuit RC includes the reading circuit RC(j) (see FIG. 4).

The reading circuit RC(j) includes the amplifier circuit AMP1(*j*) and the sampling circuit SC(j).

Structure Example 1 of Amplifier Circuit AMP1(*j*)

The amplifier circuit AMP1(*j*) is electrically connected to the conductive film WX(j) and the amplifier circuit AMP1(*j*) has a function of amplifying an imaging signal.

Structure Example 2 of Amplifier Circuit AMP1(*j*)

The amplifier circuit AMP1(*j*) includes a transistor M32(*j*), and the transistor M32(*j*) includes a gate electrode electrically connected to the conductive film VLEN, a first electrode electrically connected to the conductive film WX(j), and a second electrode electrically connected to the conductive film VIV.

Note that the conductive film WX(j) connects the transistor M31 and the transistor M32(*j*) when the switch SW33 is in a conduction state (see FIG. 6 and FIG. 7A). Thus, a source follower circuit can be configured with the transistor M31 and the transistor M32(*j*). The potential of the conductive film WX(j) can be changed on the basis of the potential of the node FD.

Structure Example of Sampling Circuit SC(j)

The sampling circuit SC(j) includes a terminal IN1(*j*), a terminal IN2, a terminal IN3, and a terminal OUT(j) (see FIG. 7B).

The terminal IN1(*j*) is electrically connected to the conductive film WX(j), the terminal IN2 is electrically connected to the conductive film CL, and the terminal IN3 is electrically connected to the conductive film CAPSEL.

The sampling circuit SC(j) has a function of obtaining an imaging signal on the basis of the potentials of the conductive film CL and the conductive film CAPSEL. The terminal OUT(j) has a function of supplying a signal which changes on the basis of the potential of the terminal IN1(*j*).

Thus, an imaging signal can be obtained from the pixel circuit 530S(*i,j*). A correlated double sampling method can be employed, for example. The sampling circuit SC(j) can be provided for each conductive film WX(j). A differential signal of the pixel circuit 530S(*i,j*) can be obtained by the corresponding conductive film WX(j). The operating frequency of the sampling circuit SC(j) can be low. Noise can be reduced. As a result, a novel device that is highly convenient, useful, or reliable can be provided.

Structure Example 7 of Device 700

The device 700 of one embodiment of the present invention includes the region 231 (see FIG. 4). The region 231 has a function of displaying an image.

The region 231 includes a group of a pixel 703(*i*,1) to a pixel 703(*i,n*) and a different group of a pixel 703(1,*j*) to a pixel 703(*m,j*).

The group of the pixel 703(*i*,1) to the pixel 703(*i,n*) is provided in the row direction (the direction indicated by an arrow R 1 in the drawing), and the group of the pixel 703(*i*,1) to the pixel 703(*i,n*) includes the pixel 703(*i,j*).

The conductive film G1(*i*) is electrically connected to the group of the pixel 703(*i*,1) to the pixel 703(*i,n*).

The different group of the pixel 703(*i,j*) to the pixel 703(*m* j) is provided in the column direction (the direction indicated by an arrow C1 in the drawing) intersecting the row direction, and the different group of the pixel 703(1,*j*) to the pixel 703(*m*,*j*) includes the pixel 703(*i* j).

The different group of the pixel 703(1,*j*) to the pixel 703(*m*,*j*) is electrically connected to a conductive film S1*g* (*j*).

Structure Example 8 of Device 700

The device 700 of one embodiment of the present invention includes a multiplexer MUX, an amplifier circuit AMP2, and an analog-digital converter circuit ADC (see FIG. 4).

The multiplexer MUX has a function of obtaining an imaging signal from one selected from a plurality of sampling circuits SC(j) and supplying the imaging signal to the amplifier circuit AMP2, for example.

Thus, imaging data can be obtained by selecting a predetermined pixel from a plurality of pixels arranged in the row direction. The number of imaging signals obtained at the same time can be limited to a predetermined number. It is possible to use the analog-digital converter circuit ADC in which the number of input channels is smaller than the number of pixels arranged in the row direction. As a result, a novel device that is highly convenient, useful, or reliable can be provided.

The amplifier circuit AMP2 can amplify the imaging signal and supply the amplified signal to the analog-digital converter circuit ADC.

Note that this embodiment can be combined with any of the other embodiments described in this specification as appropriate.

Embodiment 6

In this embodiment, a structure of a device of one embodiment of the present invention will be described with reference to FIG. 8 to FIG. 10.

Figure 8A:
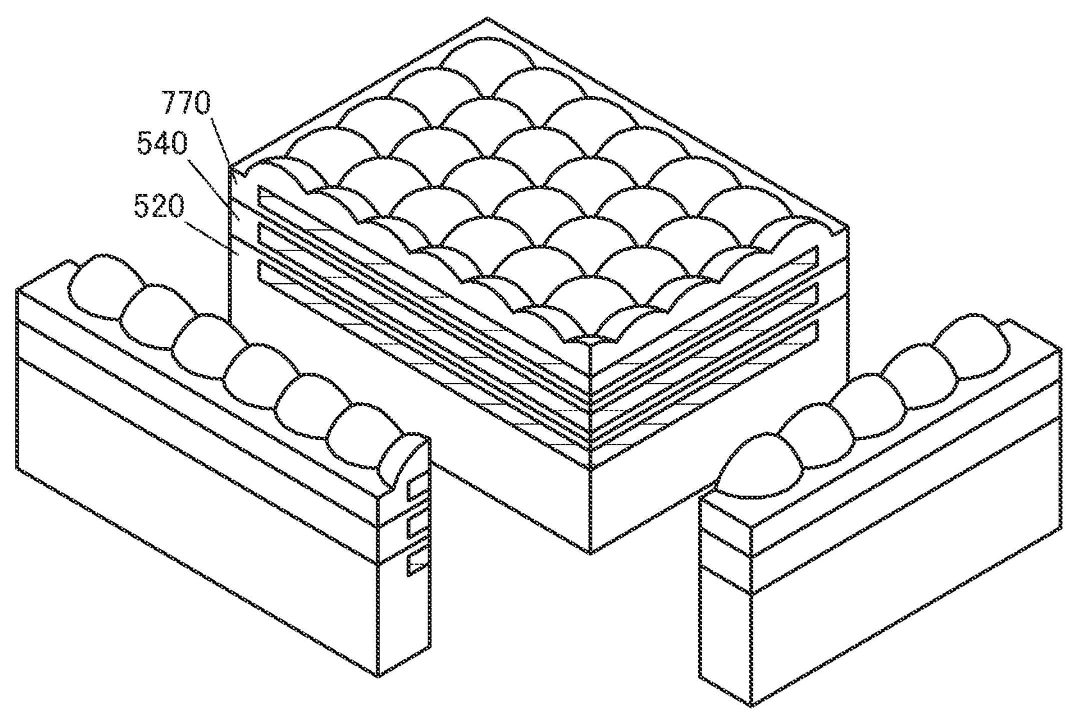
FIG. 8A and FIG. 8B are cross-sectional perspective views illustrating an image capturing device.
Figure 8B:
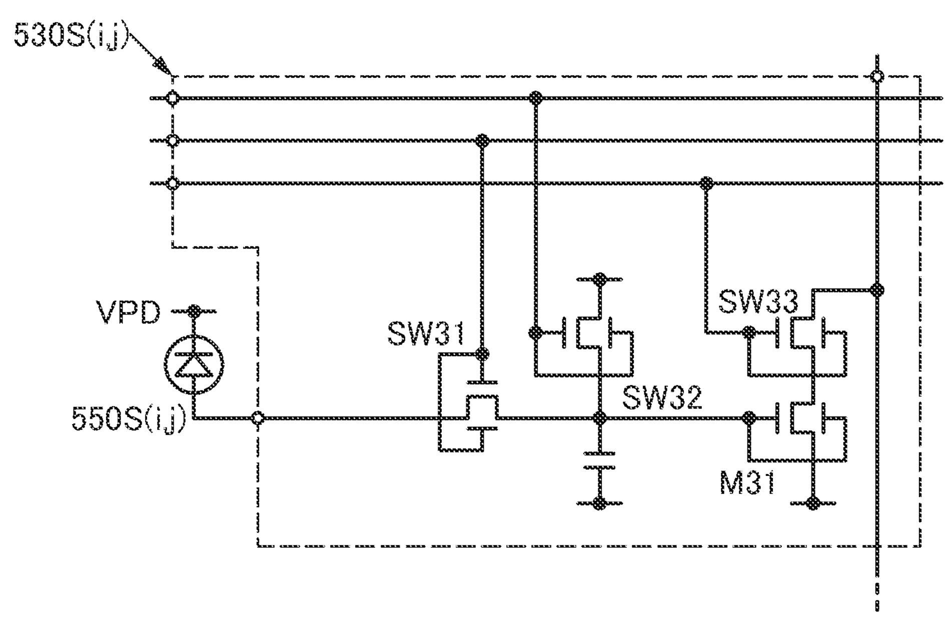

FIG. 8A is a cross-sectional perspective view illustrating an image capturing device, and FIG. 8B is a circuit diagram illustrating the pixel circuit.

Figure 9:
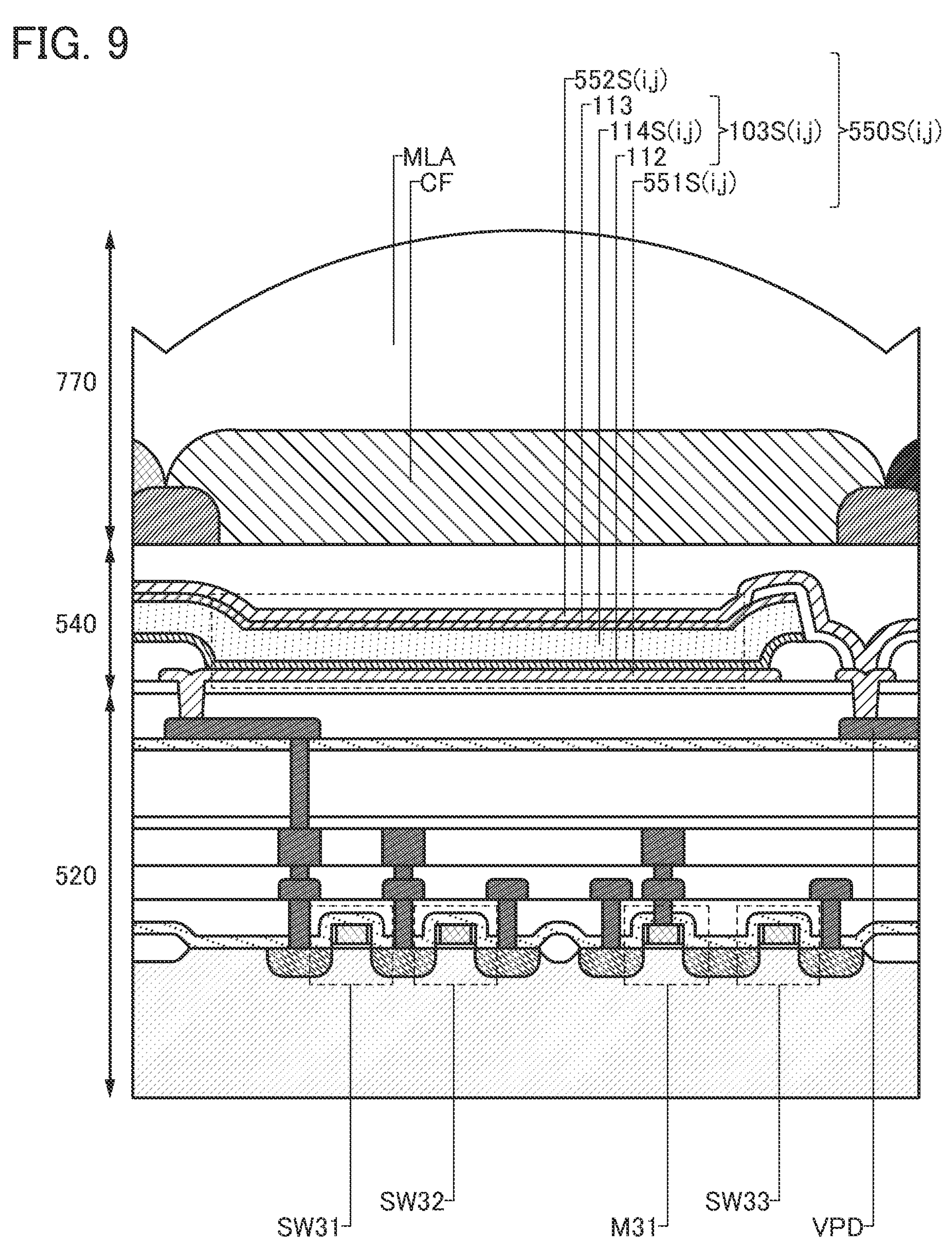
FIG. 9 is a cross-sectional view illustrating a pixel.

FIG. 9 is a cross-sectional view illustrating a structure of a device of one embodiment of the present invention. Specifically, FIG. 9 is a cross-sectional view of a pixel.

FIG. 10A to FIG. 10F are perspective views illustrating a package and a module in each of which an image capturing device is placed.

Structure Example 1 of Image Capturing Device

The device of one embodiment of the present invention includes the functional layer 520, the functional layer 540, and a functional layer 770 (see FIG. 8). The functional layer 540 is interposed between the functional layer 520 and the functional layer 770 (see FIG. 8 and FIG. 9).

The functional layer 540 includes the photoelectric conversion device 550S(*i*,*j*) (see FIG. 9).

The functional layer 520 includes the pixel circuit 530S (*i*,*j*). The device of one embodiment of the present invention has an image capturing function. The device of one embodiment of the present invention can be referred to as an image capturing device.

For example, the functional layer 770 includes a microlens array MLA and a coloring layer CF.

The image capturing device of one embodiment of the present invention includes the pixel and the conductive film VPD (see FIG. 9). The pixel includes the photoelectric conversion device 550S(*i*,*j*) and the pixel circuit 530S(*i*,*j*).

The photoelectric conversion device 550S(*i*,*j*) includes the electrode 551S(*i*,*j*) and the electrode 552S(*i*,*j*). The electrode 551S(*i*,*j*) is electrically connected to the pixel circuit 530S(i j), and the electrode 552S(*i*,*j*) is electrically connected to the conductive film VPD (see FIG. 8B and FIG. 9).

<<Photoelectric Conversion Device 550S(*i*,*j*)>>

The photoelectric conversion device 550S(*i*,*j*) includes the unit 103S(*i*,*j*) (see FIG. 9). The unit 103S(*i*,*j*) is interposed between the electrode 552S(*i*,*j*) and the electrode 551S(*i*,*j*).

The unit 103S(*i*,*j*) includes the layer 114S(*i*,*j*)), the layer 112, and the layer 113. The layer 114S(i j) is interposed between the layer 113 and the layer 112, the layer 113 is interposed between the electrode 552S(*i*,*j*) and the layer 114S(*i*,*j*), and the layer 112 is interposed between the layer 114S(*i*,*j*) and the electrode 551S(*i*,*j*).

For example, the photoelectric conversion device described in any one of Embodiment 1 to Embodiment 3 can be used as the photoelectric conversion device 550S(*i*,*j*).

<<Pixel Circuit 530S(*i*,*j*)>>

The pixel circuit 530S(*i*,*j*) includes the switches SW31 and SW32, the switch SW33, and the transistor M31 (see FIG. 8B and FIG. 9). For example, a transistor formed on a silicon substrate can be used as the transistor M31.

Structure Example 2 of Image Capturing Device

Examples of a package and a camera module in each of which an image sensor chip is placed will be described below.

FIG. 10A is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 10B is an external perspective view of the bottom surface side of the package. A BGA (Ball grid array) in which solder balls are used as bumps 640 on the bottom surface of the package is employed. Note that, without being limited to the BGA, an LGA (Land grid array), a PGA (Pin Grid Array), or the like may be employed.

FIG. 10C is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 10D is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having functions of a driver circuit, a signal conversion circuit, and the like of the image capturing device is provided between the package substrate 611 and the image sensor chip 651; thus, the structure as an SiP (System in package) is included.

FIG. 10E is an external perspective view of the bottom surface side of the camera module. A QFN (Quad flat no-lead package) structure where lands 641 for mounting are provided on the bottom surface and side surfaces of the package substrate 611 is employed. Note that this structure is only an example, and a QFP (Quad flat package) or the above-mentioned BGA may also be provided.

FIG. 10F is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed circuit board and the like; therefore, the image sensor chip can be incorporated into a variety of semiconductor devices and electronic devices.

This embodiment can be combined with any of the other embodiments and examples as appropriate.

Embodiment 7

As electronic devices that can use the image capturing device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 11A to FIG. 11F illustrate specific examples of such electronic devices.

Figure 11A:
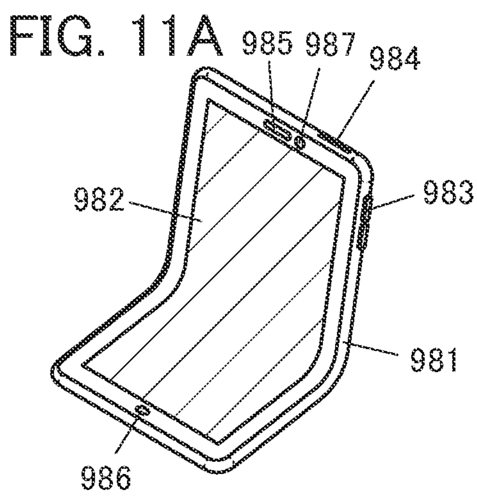
FIG. 11A to FIG. 11F are diagrams illustrating electronic devices.

FIG. 11A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. All operations including making a call and inputting text can be performed by touch on the display portion 982 with a finger, a stylus, or the like. The image capturing device of one embodiment of the present invention and the operation method thereof can be used for obtaining an image in the mobile phone.

Figure 11B:
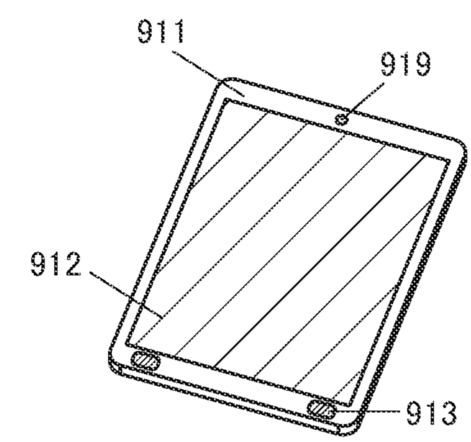

FIG. 11B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The image capturing device of one embodiment of the present invention and the operation method thereof can be used for obtaining an image in the portable data terminal.

Figure 11C:
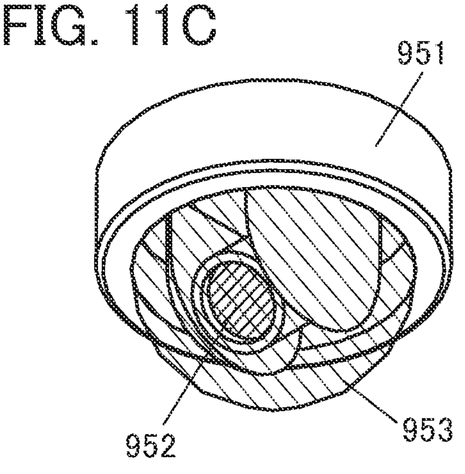

FIG. 11C is a surveillance camera, which includes a support base 951, a camera unit 952, a protection cover 953, and the like. By setting the camera unit 952 provided with a rotating mechanism and the like on a ceiling, an image of all the surroundings can be taken. The image capturing device of one embodiment of the present invention and the operation method thereof can be used for obtaining an image in the camera unit. Note that a surveillance camera is a name in common use and does not limit the use thereof. A device that has a function of a surveillance camera is also called a camera or a video camera, for example.

Figure 11D:
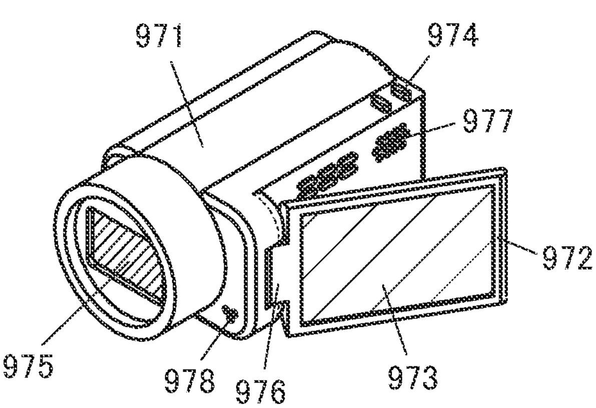

FIG. 11D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The image capturing device of one embodiment of the present invention and the operation method thereof can be used for obtaining an image in the video camera.

Figure 11E:
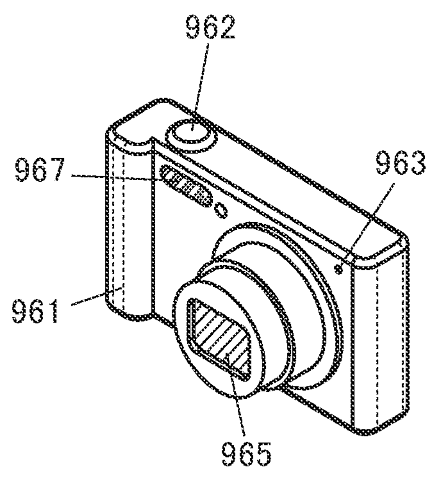

FIG. 11E is a digital camera, which includes a housing 961, a shutter button 962, a microphone 963, a light-emitting portion 967, a lens 965, and the like. The image capturing device of one embodiment of the present invention and the operation method thereof can be used for obtaining an image in the digital camera.

Figure 11F:
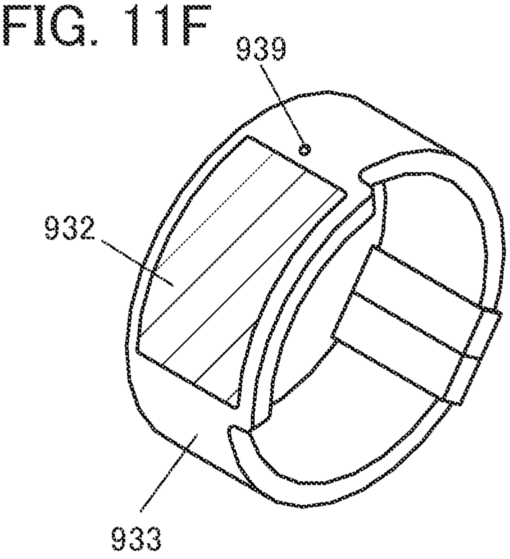

FIG. 11F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The image capturing device of one embodiment of the present invention and the operation method thereof can be used for obtaining an image in the information terminal.

This embodiment can be combined with any of the other embodiments and examples as appropriate.

Example 1

In this example, a photoelectric conversion device 1 of one embodiment of the present invention will be described with reference to FIG. 12 to FIG. 18.

Figure 12A:
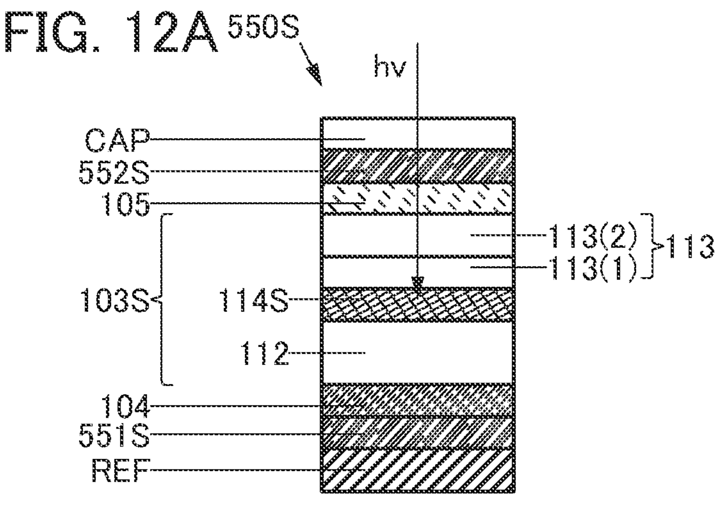
FIG. 12A and FIG. 12B are diagrams illustrating structures of a device in Example.
Figure 12B:
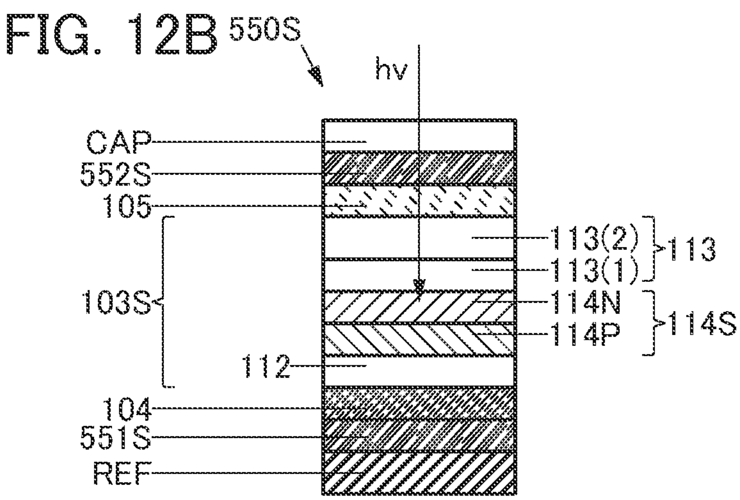

FIG. 12A is a diagram illustrating a structure of the photoelectric conversion device 550S, and FIG. 12B is a diagram illustrating a structure of the photoelectric conversion device 550S which is different from the structure in FIG. 12A.

Figure 13:
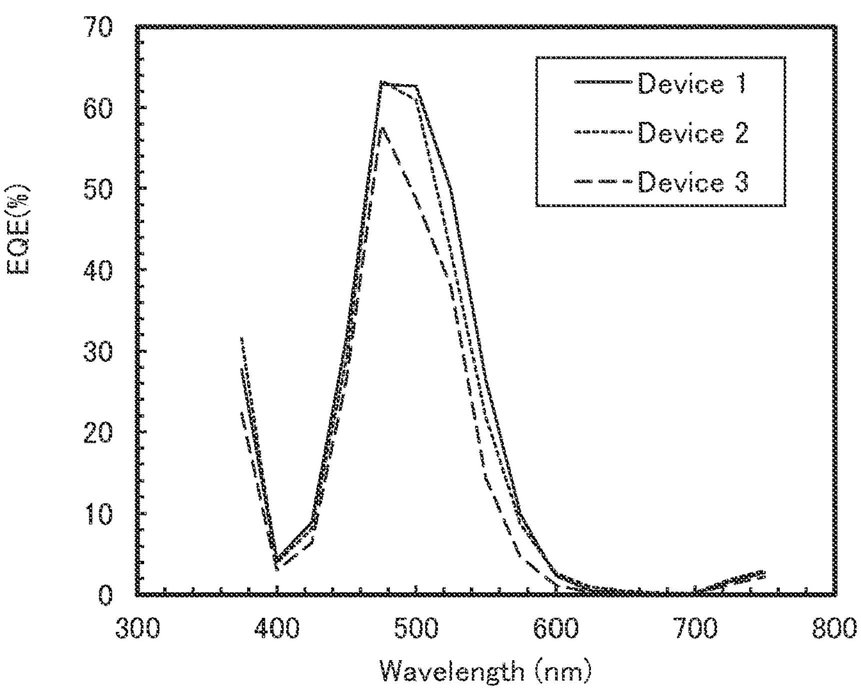
FIG. 13 is a graph showing the spectral sensitivity characteristics of devices in Example.

FIG. 13 is a graph showing the spectral sensitivity characteristics of the photoelectric conversion device 1 to a photoelectric conversion device 3.

Figure 14:
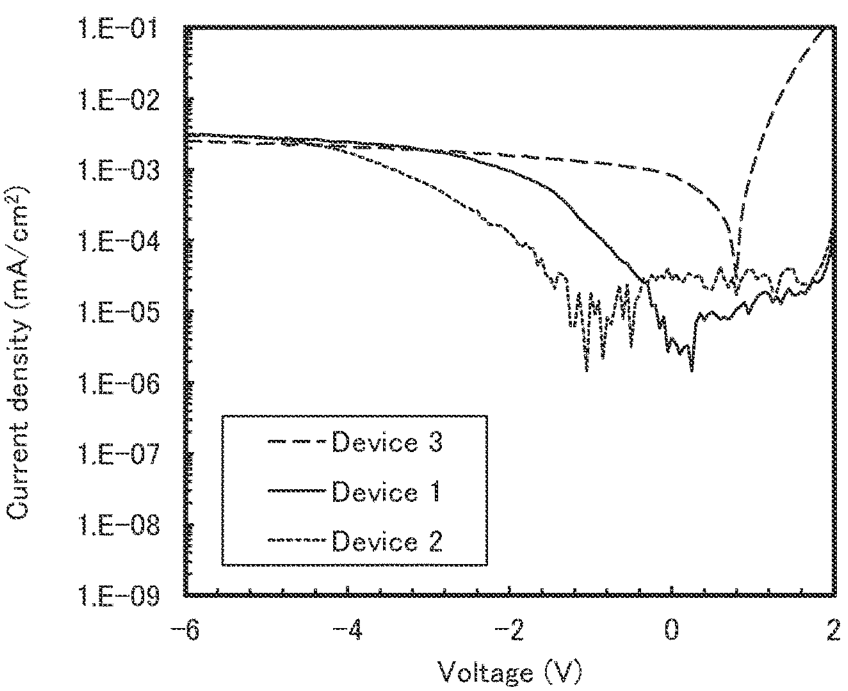
FIG. 14 is a graph showing the voltage-current density characteristics of devices in Example in a state of being irradiated with light.

FIG. 14 is a graph showing the voltage-current density characteristics of the photoelectric conversion device 1 to the photoelectric conversion device 3 in a state of being irradiated with light.

Figure 15:
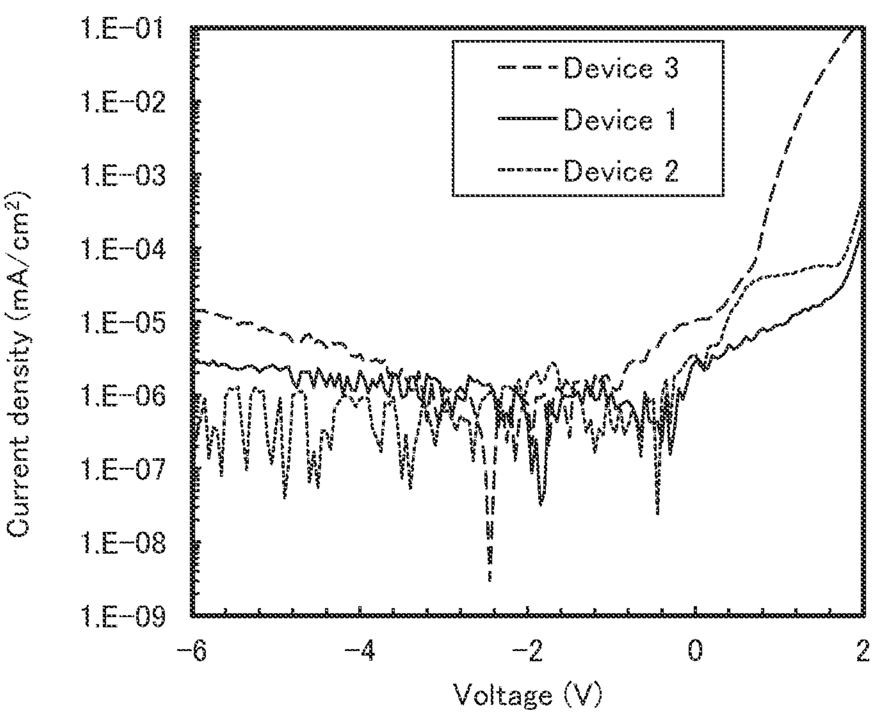
FIG. 15 is a graph showing the voltage-current density characteristics of devices in Example in a state of not being irradiated with light.

FIG. 15 is a graph showing the voltage-current density characteristics of the photoelectric conversion device 1 to the photoelectric conversion device 3 in a state of not being irradiated with light.

Figure 16:
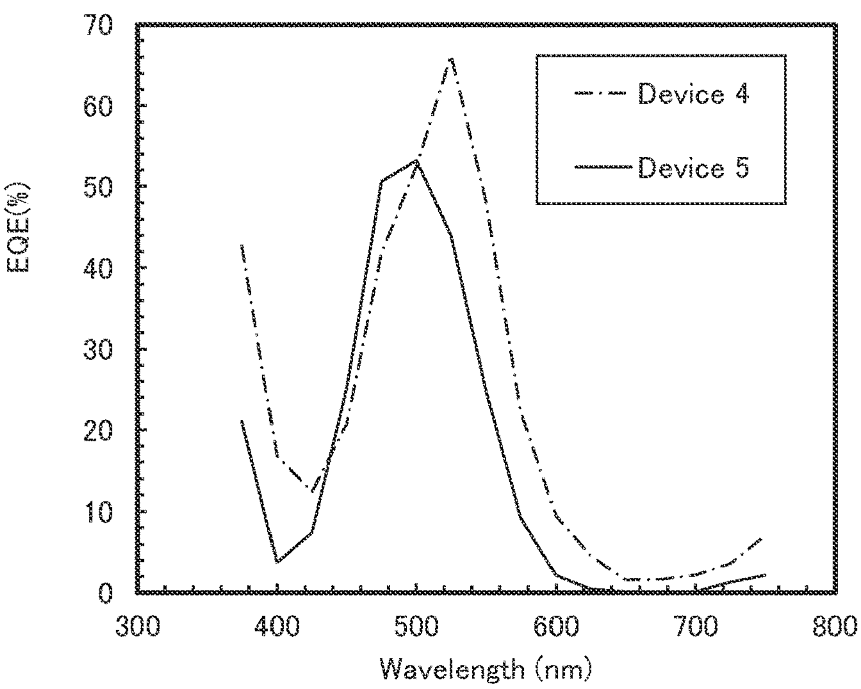
FIG. 16 is a graph showing the spectral sensitivity characteristics of devices in Example.

FIG. 16 is a graph showing the spectral sensitivity characteristics of a photoelectric conversion device 4 and a photoelectric conversion device 5.

Figure 17:
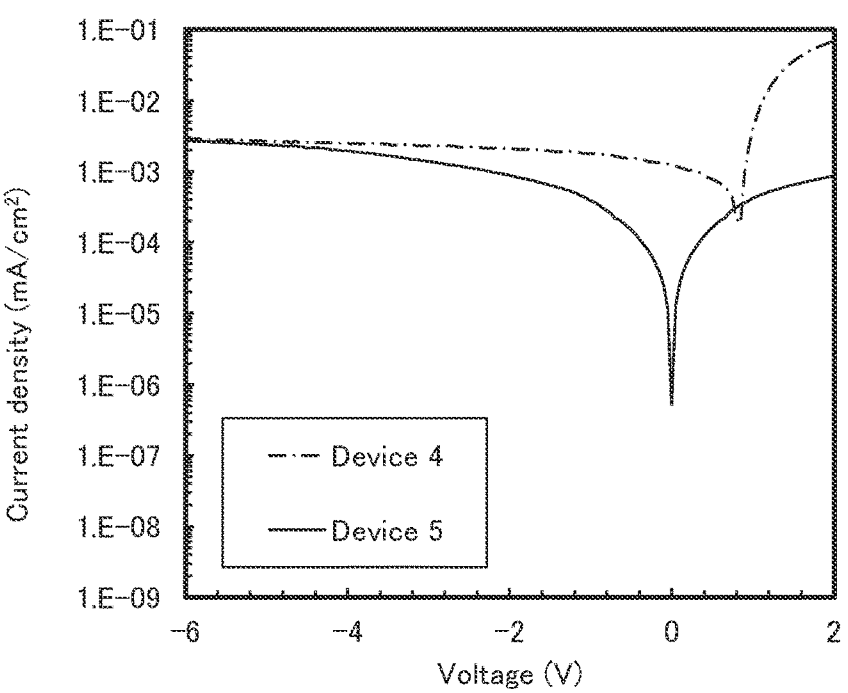
FIG. 17 is a graph showing the voltage-current density characteristics of devices in Example in a state of being irradiated with light.

FIG. 17 is a graph showing the voltage-current density characteristics of the photoelectric conversion device 4 and the photoelectric conversion device 5 in a state of being irradiated with light.

Figure 18:
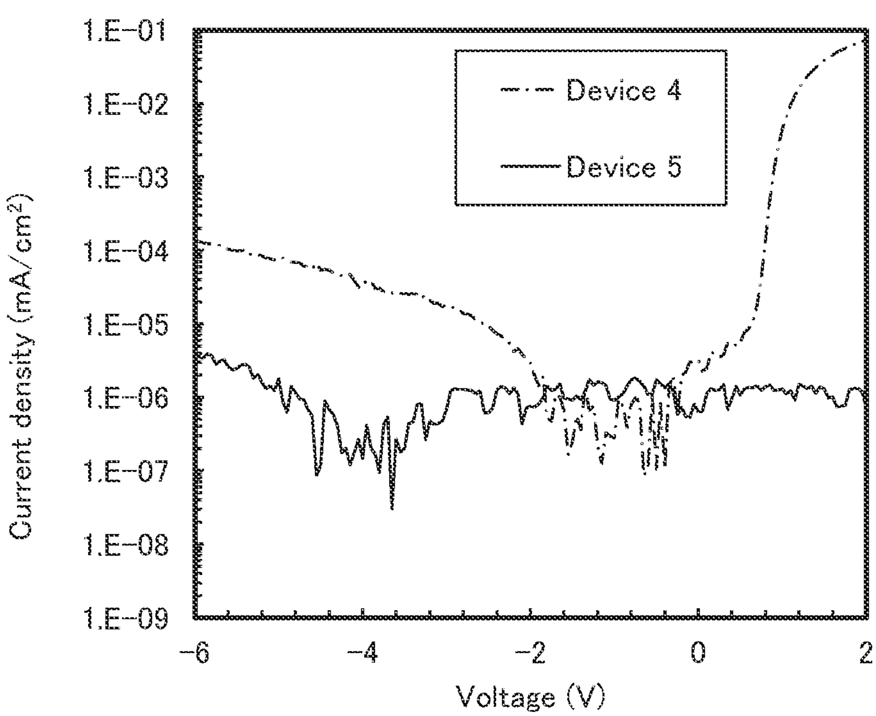
FIG. 18 is a graph showing the voltage-current density characteristics of devices in Example in a state of not being irradiated with light.

FIG. 18 is a graph showing the voltage-current density characteristics of the photoelectric conversion device 4 and the photoelectric conversion device 5 in a state of not being irradiated with light.

<Photoelectric Conversion Device 1>

The fabricated photoelectric conversion device 1 described in this example has a structure similar to that of the photoelectric conversion device 550S (see FIG. 12A).

The photoelectric conversion device 1 includes the electrode 551S, the electrode 552S, and the unit 103S. The unit 103S is interposed between the electrode 551S and the electrode 552S.

The unit 103S includes the layer 113 and the layer 114S. The layer 113 is interposed between the electrode 552S and the layer 114S, and the layer 113 contains the organic compound ETM. Note that the layer 113 includes a layer 113(1) and a layer 113(2). The layer 113(1) is interposed between the layer 113(2) and the layer 114S.

The organic compound ETM has an electron-transport property, and the organic compound ETM has the LUMO level in the first level LUMO1.

The layer 114S contains the second organic compound CTM, and the organic compound CTM emits delayed fluorescent light at room temperature.

The organic compound CTM has the LUMO level in the second level LUMO2. A difference between the second level LUMO2 and the first level LUMO1 is less than or equal to 1.0 eV. Note that in the case where the layer 113 has a stacked-layer structure, the organic compound ETM contained in a layer in contact with the layer 114S is used for comparison of the LUMO levels. Specifically, the LUMO level of the organic compound ETM contained in the layer 113(1) is compared with that of the organic compound CTM.

Specifically, the layer 113(1) contains 2-[3-(3'-dibenzothiophen-4-yl)biphenyl]dibenzo[f,h]quinoxaline (abbreviation: 2mDBTBPDBq-II), and 2mDBTBPDBq-II has a LUMO level of −2.94 eV. The layer 114S contains 7,10-bis(4-(diphenylamino)phenyl)-2,3-dicyanopvrazinophenanthrene (abbreviation: TPA-DCPP), and TPA-DCPP has a LUMO level of −3.70 eV. A difference between the LUMO level of TPA-DCPP and the LUMO level of 2mDBTBPDBq-II is 0.76 eV. Note that the above values of the LUMO levels were derived from cyclic voltammetry (CV).

<<Structure of Photoelectric Conversion Device 1>>

Table 1 shows the structure of the photoelectric conversion device 1. The structural formulae of the materials used for the photoelectric conversion device described in this example are shown below.

TABLE 1

| Structure | Reference numeral | Material | Composition ratio | Thickness/nm |
|---|---|---|---|---|
| Layer | CAP | DBT3P-II | | 80 |
| Electrode | 552S | Ag:Mg | 1:01 | 10 |
| Layer | 105 | LiF | | 1 |
| Layer | 113(2) | NBPhen | | 10 |
| Layer | 113(1) | 2mDBTBPDBq-II | | 10 |
| Layer | 114S | TPA-DCPP | | 30 |
| Layer | 112 | BBABnf | | 40 |
| Layer | 104 | BBABnf:OCHD-003 | 1:0.1 | 11 |
| Electrode | 551S | ITSO | | 100 |
| Reflective film | REF | APC | | 100 |

[Chemical Formulae 16]

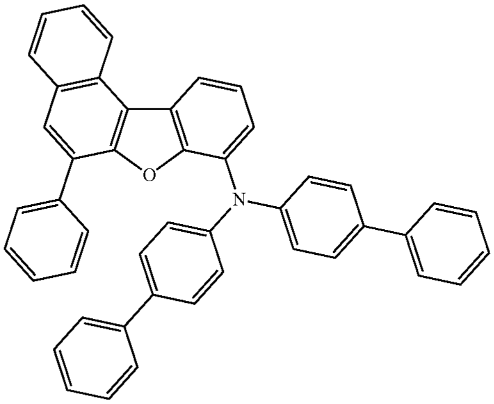

BBABnf

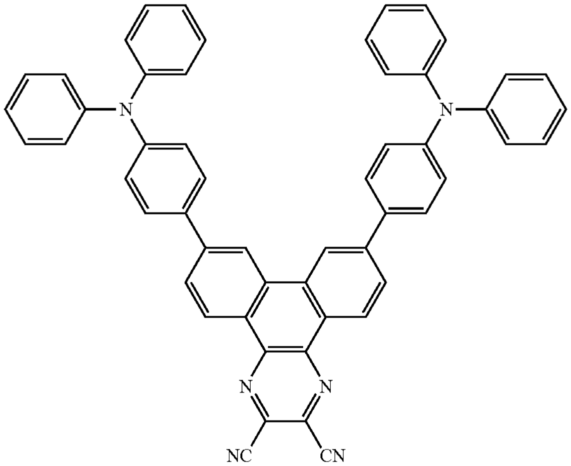

TPA-DCPP

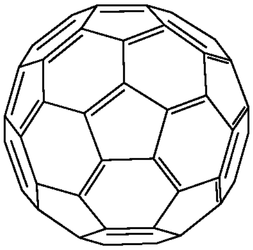

C60

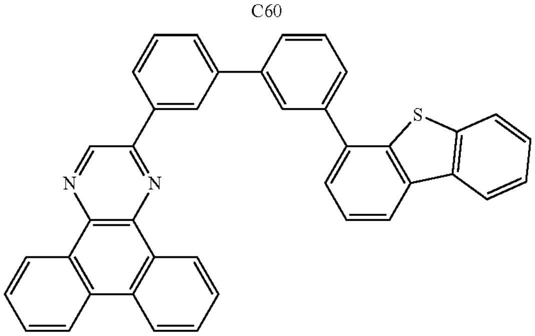

2mDBTBPDBq-II

-continued

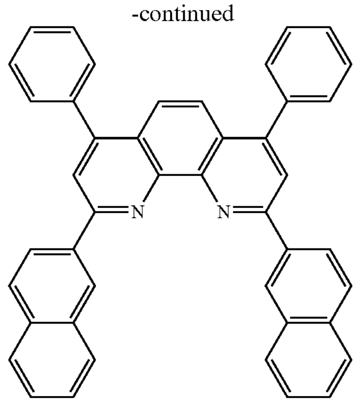

NBPhen

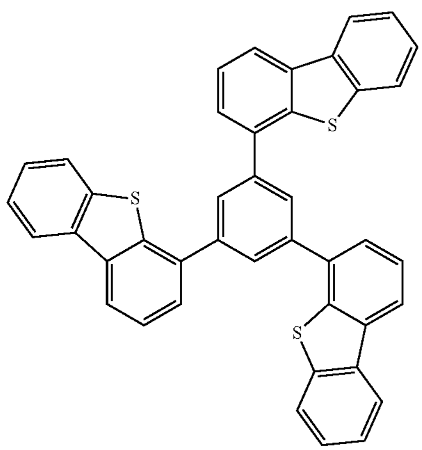

DBT3P-II

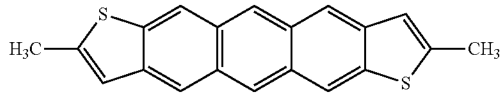

anti-DMADT

<<Method for Fabricating Photoelectric Conversion Device 1>>

The photoelectric conversion device 1 described in this example was fabricated using a method including the following steps.

[Step 1]

In a step 1, a reflective film REF was formed. Specifically, the reflective film REF was formed by a sputtering method using an alloy containing silver (Ag), palladium (Pd), and copper (Cu) (abbreviation: APC) as a target.

The reflective film REF contains APC and has a thickness of 100 nm.

[Step 2]

In a step 2, the electrode 551S was formed over the reflective film REF. Specifically, the electrode 551S was formed by a sputtering method using indium oxide-tin oxide containing silicon or silicon oxide (abbreviation: ITSO) as a target.

Note that the electrode 551S contains ITSO and has a thickness of 100 nm and an area of 4 $mm^2$ (2 mm×2 mm).

Next, a base material over which the electrode 551S was formed was washed with water, baked at 200° C. for an hour, and then subjected to UV ozone treatment for 370 seconds. After that, the base material was transferred into a vacuum evaporation apparatus where the inside pressure was reduced to approximately 10-4 Pa, and vacuum baking was performed at 170° C. for 30 minutes in a heating chamber of the vacuum evaporation apparatus. Then, the base material was cooled down for approximately 30 minutes.

[Step 3]

In a step 3, the layer 104 was formed over the electrode 551S. Specifically, the material was deposited by co-evaporation using a resistance-heating method.

Note that the layer 104 contains N,N-bis(4-biphenyl)-6-phenylbenzo[b]naphtho[1,2-d]furan-8-amine (abbreviation: BBABnf) and an electron-acceptor material (abbreviation: OCHD-003) at BBABnf:OCHD-003=1:0.1 (weight ratio) and has a thickness of 11 nm. Note that the electron-acceptor material OCHD-003 contains fluorine, and has a molecular weight of 672.

[Step 4]

In a Step 4, the layer 112 was formed over the layer 104. Specifically, the material was deposited by evaporation using a resistance-heating method.

The layer 112 contains BBABnf and has a thickness of 40 nm.

[Step 5]

In a step 5, the layer 114S was formed over the layer 112. Specifically, the material was deposited by co-evaporation using a resistance-heating method.

Note that the layer 114S contains 7,10-bis(4-(diphenylamino)phenyl)-2,3-dicyanopyrazino-phenanthrene (abbreviation: TPA-DCPP) and has a thickness of 30 nm.

[Step 6]

In a step 6, the layer 113(1) was formed over the layer 114S. Specifically, the material was deposited by evaporation using a resistance-heating method.

Note that the layer 113(1) contains 2-[3-(3'-dibenzothiophen-4-yl)biphenyl]dibenzo[f,h]quinoxaline(abbreviation: 2mDBTBPDBq-II) and has a thickness of 10 nm.

[Step 7]

In a step 7, the layer 113(2) was formed over the layer 113(1). Specifically, the material was deposited by evaporation using a resistance-heating method.

The layer 113(2) contains 2,9-di(2-naphthyl)-4,7-diphenyl-1,10-phenanthroline (abbreviation: NBPhen) and has a thickness of 10 nm.

[Step 8]

In a step 8, the layer 105 was formed over the layer 113(2). Specifically, the material was deposited by evaporation using a resistance-heating method.

The layer 105 contains LiF and has a thickness of 1 nm.

[Step 9]

In a step 9, the electrode 552S was formed over the layer 105. Specifically, the material was deposited by co-evaporation using a resistance-heating method.

Note that the electrode 552S contains Ag and Mg at Ag:Mg=1:0.1 (weight ratio) and has a thickness of 10 nm.

[Step 10]

In a step 10, a layer CAP was formed over the electrode 552S. Specifically, the material was deposited by evaporation using a resistance-heating method.

The layer CAP contains 4,4',4"-(benzene-1,3,5-triyl)tri(dibenzothiophene) (abbreviation: DBT3P-II) and has a thickness of 80 nm.

<<Operation Characteristics of Photoelectric Conversion Device 1>>

The operation characteristics of the photoelectric conversion device 1 were measured at room temperature.

Irradiation of monochromatic light was performed in a state where a potential of −6 V with reference to the potential of the electrode 552S was supplied to the electrode 551S.

The current with respect to the amount of irradiation light was measured and the external quantum efficiency (EQE) was calculated from the conversion efficiency (see FIG. 13). Note that the monochromatic light in a wavelength range of greater than or equal to 375 nm and less than or equal to 750 nm was selected in steps of 25 nm.

The density of current flowing through the device was measured while the potential of the electrode 551S was swept from −6 V to +4 V with reference to the potential of the electrode 552S in a state where the irradiation of the monochromatic light with a wavelength of 500 nm was performed with an intensity of 12.5 $\mu W/cm^2$ (see FIG. 14).

In addition, the density of dark current flowing through the device was measured while the potential of the electrode 551S was swept from −6 V to +4 V with reference to the potential of the electrode 552S in a state where light irradiation was not performed (see FIG. 15).

Table 2 shows the characteristics of the photoelectric conversion device 1 and the other devices to be described later. Specifically, the density of current and EQE in a state where the monochromatic light with a wavelength of 500 nm is irradiated with an intensity of 12.5 $\mu W/cm^2$ are described.

TABLE 2

| | Current density@−6 V ($mA/cm^2$) | EQE (%) |
|---|---|---|
| Device1 | 0.0032185 | 62.6 |
| Device2 | 0.003128 | 60.9 |
| Device3 | 0.002513795 | 48.7 |
| Device4 | 0.002831 | 52.5 |
| Device5 | 0.0027345 | 53.2 |

The photoelectric conversion device 1 was found to exhibit favorable characteristics. For example, photoelectric conversion was able to be performed using the layer 114S containing only TPA-DCPP. The photoelectric conversion device 1 had a favorable EQE with respect to green light. Thus, the photoelectric conversion device 1 can be utilized for a wide variety of uses such as the biosensing field. The photoelectric conversion device 2 was found to exhibit favorable characteristics like the photoelectric conversion device 1. Dark current was able to be further reduced. Thus, the photoelectric conversion device 2 can be suitably utilized for optical sensing. The photoelectric conversion device 3 had a higher EQE with respect to green display light used for display. Power consumption can be reduced because current increases at low driving voltage. The photoelectric conversion device 4 exhibited favorable characteristics. Note that anti-DMADT was able to be evaporated at a lower temperature than C60. Power consumption can be reduced because current increases at low driving voltage. The photoelectric conversion device 5 was found to exhibit favorable characteristics. The photoelectric conversion device 5 having a stacked-layer structure containing anti-DMADT was able to have higher sensitivity to green light than the device 4 having a mixed structure. Owing to this, the photoelectric conversion device 5 had a favorable EQE with respect to green light. Thus, the photoelectric conversion device 5 can be utilized for a wide variety of uses such as the biosensing field.

<Photoelectric Conversion Device 2>

The fabricated photoelectric conversion device 2 described in this example has a structure similar to that of the photoelectric conversion device 550S (see FIG. 12A). The structure of the photoelectric conversion device 2 is different from that of the photoelectric conversion device 1 in the layer 114S. Specifically, the photoelectric conversion device 2 is different from the photoelectric conversion device 1 in that the layer 114S contains TPA-DCPP and (C60-Ih)[5,6]fullerene (abbreviation: C60).

<<Method for Fabricating Device 2>>

The device 2 described in this example was fabricated using a method including the following steps.

Note that a method for fabricating the photoelectric conversion device 2 is different from the method for fabricating the photoelectric conversion device 1 in that TPA-DCPP and C60 were deposited by co-evaporation instead of TPA-DCPP in the step 5. Different portions are described in detail here, and the above description is referred to for portions formed by a similar method.

[Step 5]

In the step 5, the layer 114S was formed over the layer 112. Specifically, the material was deposited by co-evaporation using a resistance-heating method.

Note that the layer 114S contains TPA-DCPP and C60 at TPA-DCPP:C60=0.7:0.3 (weight ratio) and has a thickness of 30 nm.

<<Operation Characteristics of Photoelectric Conversion Device 2>>

The operation characteristics of the photoelectric conversion device 2 were measured at room temperature. Table 2 shows the characteristics of the photoelectric conversion device 2.

<Photoelectric Conversion Device 3>

The fabricated photoelectric conversion device 3 described in this example has a structure similar to that of the photoelectric conversion device 550S (see FIG. 12A). A structure of the photoelectric conversion device 3 is different from that of the photoelectric conversion device 1 in the layer 114S. Specifically, the photoelectric conversion device 3 is different from the photoelectric conversion device 1 in that the layer 114S contains TPA-DCPP and 2,8-dimethyl-anthra[2,3-b:6,7-b']dithiophene (abbreviation: anti-DMADT).

<<Method for Fabricating Device 3>>

The device 3 described in this example was fabricated using a method including the following steps.

Note that a method for fabricating the photoelectric conversion device 3 is different from the method for fabricating the photoelectric conversion device 1 in that TPA-DCPP and anti-DMADT were deposited by co-evaporation instead of TPA-DCPP in the step 5. Different portions are described in detail here, and the above description is referred to for portions formed by a similar method.

[Step 5]

In the step 5, the layer 114S was formed over the layer 112. Specifically, the material was deposited by co-evaporation using a resistance-heating method.

Note that the layer 114S contains TPA-DCPP and anti-DMADT at TPA-DCPP:anti-DMADT=0.7:0.3 (weight ratio) and has a thickness of 30 nm.

<<Operation Characteristics of Photoelectric Conversion Device 3>>

The operation characteristics of the photoelectric conversion device 3 were measured at room temperature. Table 2 shows the characteristics of the photoelectric conversion device 3.

<Photoelectric Conversion Device 4>

The fabricated photoelectric conversion device 4 described in this example has a structure similar to that of the photoelectric conversion device 550S (see FIG. 12B). A structure of the photoelectric conversion device 4 is different from that of the photoelectric conversion device 1 in the layer 114S. Specifically, the photoelectric conversion device 4 is different from the photoelectric conversion device 1 in that the layer 114S has a stacked-layer structure of the layer 114P and the layer 114N instead of a single-layer structure.

<<Structure of Photoelectric Conversion Device 4>>

Table 3 shows the structure of the photoelectric conversion device 4.

TABLE 3

| Structure | Reference numeral | Material | Composition ratio | Thickness/ nm |
|---|---|---|---|---|
| Layer | CAP | DBT3P-II | | 80 |
| Electrode | 552S | Ag:Mg | 1:01 | 10 |
| Layer | 105 | LiF | | 1 |
| Layer | 113(2) | NBPhen | | 10 |
| Layer | 113(1) | 2mDBTBPDBq-II | | 10 |
| Layer | 114N | C60 | | 20 |
| Layer | 114P | TPA-DCPP | | 30 |
| Layer | 112 | BBABnf | | 40 |
| Layer | 104 | BBABnf:OCHD-003 | 1:0.1 | 11 |
| Electrode | 551S | ITSO | | 100 |
| Reflective film | REF | APC | | 100 |

<<Method for Fabricating Device 4>>

The device 4 described in this example was fabricated using a method including the following steps.

Note that a method for fabricating the photoelectric conversion device 4 is different from the method for fabricating the photoelectric conversion device 1 in that the layer 114P was formed in the step 5, a step 5-2 was included between the step 5 and the step 6, and the layer 114N was formed in the step 5-2. Different portions are described in detail here, and the above description is referred to for portions formed by a similar method.

[Step 5]

In the step 5, the layer 114P was formed over the layer 112. Specifically, the material was deposited by evaporation using a resistance-heating method.

Note that the layer 114P contains TPA-DCPP and has a thickness of 30 nm.

[Step 5-2]

In the step 5-2, the layer 114N was formed over the layer 114P. Specifically, the material was deposited by evaporation using a resistance-heating method.

Note that the layer 114N contains C60 and has a thickness of 20 nm.

[Step 6]

In the step 6, the layer 113(1) was formed over the laver 114N. Specifically, the material was deposited by evaporation using a resistance-heating method.

Note that the layer 113(1) contains 2mDBTBPDBq-II and has a thickness of 10 nm.

<<Operation Characteristics of Photoelectric Conversion Device 4>>

The operation characteristics of the photoelectric conversion device 4 were measured at room temperature. Table 2 shows the characteristics of the photoelectric conversion device 4.

<Photoelectric Conversion Device 5>

The fabricated photoelectric conversion device 5 described in this example has a structure similar to that of the photoelectric conversion device 550S (see FIG. 12B). The structure of the photoelectric conversion device 5 is different from that of the photoelectric conversion device 4 in the layer 114N. Specifically, the photoelectric conversion device 5 is different from the photoelectric conversion device 4 in that the layer 114N contains anti-DMADT instead of C60.

<<Method for Fabricating Device 5>>

The device 5 described in this example was fabricated using a method including the following steps.

Note that a method for fabricating the photoelectric conversion device 5 is different from the method for fabricating the photoelectric conversion device 4 in that anti-DMADT was used instead of C60 in the step 5-2. Different portions are described in detail here, and the above description is referred to for portions formed by a similar method.

[Step 5-2]

In the step 5-2, the layer 114N was formed over the layer 114P. Specifically, the material was deposited by co-evaporation using a resistance-heating method.

Note that the layer 114N contains anti-DMADT and has a thickness of 3 nm.

<<Operation Characteristics of Photoelectric Conversion Device 5>>

The operation characteristics of the photoelectric conversion device 5 were measured at room temperature. Table 2 shows the characteristics of the photoelectric conversion device 5.

REFERENCE NUMERALS

ANO: conductive film, AMP1: amplifier circuit, AMP2: amplifier circuit, CF: coloring layer, C21: capacitor, C22: capacitor, C31: capacitor, CAPSEL: conductive film, CDSVDD: conductive film, CDSVSS: conductive film, CDSBIAS: conductive film, CL: conductive film, FD: node, G1: conductive film, G2: conductive film, Ni: terminal, IN2: terminal, IN3: terminal, M21: transistor, M31: transistor, M32: transistor, N21: node, N22: node, OUT: terminal, RS: conductive film, S1: conductive film, S1*g*: conductive film, S2: conductive film, SE: conductive film. SW21: switch, SW22: switch, SW23: switch, SW31: switch, SW32: switch. SW33: switch. TX: conductive film, V0: conductive film, VCOM2: conductive film, VCL: conductive film, VCP: conductive film, VIV: conductive film. VLEN: conductive film, VPD: conductive film, VPI: conductive film, VR: conductive film, WX: conductive film, 103S: unit, 103X: unit, 104: layer, 105: layer, 111X: layer, 112: layer, 113: layer, 114N: layer, 114P: layer, 114S: layer, 231: region, 520: functional layer, 521: insulating film, 528: insulating film, 530S: pixel circuit, 530X: pixel circuit, 540: functional layer, 550S: photoelectric conversion device, 550X: light-emitting device, 551S: electrode, 551X: electrode, 551XS: gap, 552S: electrode, 552X: electrode, 610: package substrate. 611: package substrate. 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 700: device, 702S: pixel, 702X: pixel, 703: pixel, 770: functional layer, 911: housing, 912: display portion. 913: speaker. 919: camera, 932: display portion. 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion. 983: operation button, 984: external connection port, 985: speaker, 986: microphone, 987: camera

The invention claimed is:

1. A photoelectric conversion device comprising:

a first electrode;

a second electrode; and a first unit, wherein the first unit is interposed between the first electrode and the second electrode, wherein the first unit comprises a first layer and a second layer, wherein the first layer is interposed between the second electrode and the second layer, wherein the first layer comprises a first organic compound, wherein the first organic compound has an electron-transport property, wherein the first organic compound has a LUMO level in a first level LUMO1, wherein the second layer comprises a second organic compound, wherein the second organic compound emits delayed fluorescent light at room temperature, wherein the second organic compound has a LUMO level in a second level LUMO2, and wherein a difference between the second level LUMO2 and the first level LUMO1 is less than or equal to 1.0 eV.

2. The photoelectric conversion device according to claim 1, wherein the second layer comprises a third organic compound, and wherein the third organic compound has an electron-accepting property with respect to the second organic compound.

3. The photoelectric conversion device according to claim 2, wherein the second layer comprises a third layer and a fourth layer, wherein the third layer is interposed between the first layer and the fourth layer, wherein the third layer is in contact with the fourth layer, wherein the third layer comprises the third organic compound, and wherein the fourth layer comprises the second organic compound.

4. The photoelectric conversion device according to claim 1, wherein the second organic compound has a structure represented by General Formula (G0):

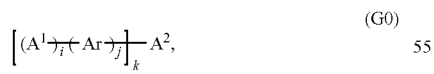

wherein $A^1$ represents an amine skeleton or a carbazolyl group, wherein the amine skeleton comprises at least one of an aryl group and a heteroaryl group, wherein the aryl group is a substituted or unsubstituted aryl group, wherein the heteroaryl group is a substituted or unsubstituted heteroaryl group, wherein the carbazolyl group is a substituted or unsubstituted carbazolyl group, wherein Ar represents a substituted or unsubstituted arylene group having 6 to 25 carbon atoms or a substituted or unsubstituted heteroarylene group having 2 to 25 carbon atoms, wherein $A^2$ represents an arylene group having 6 to 25 carbon atoms, wherein the arylene group comprises at least one substituent, wherein the substituent is a cyano group, a substituted or unsubstituted acyl group, a substituted or unsubstituted alkoxy group, a substituted or unsubstituted haloalkyl group, a substituted or unsubstituted cycloalkoxy group, or a substituted or unsubstituted cycloalkyl group, wherein the alkoxy group has 1 to 6 carbon atoms, wherein the haloalkyl group has 1 to 6 carbon atoms, wherein the cycloalkoxy group has 3 to 8 carbon atoms, wherein i is an integer greater than or equal to 1 and less than or equal to 5, wherein j is an integer greater than or equal to 0 and less than or equal to 2, and wherein k is an integer greater than or equal to 1 and less than or equal to 6.

5. The photoelectric conversion device according to claim 4, wherein the amine skeleton comprises a plurality of aryl groups or a plurality of heteroaryl groups.

6. The photoelectric conversion device according to claim 5, wherein the plurality of aryl groups are bonded to each other to form a condensed ring, and wherein the plurality of heteroaryl groups are bonded to each other to form a condensed ring.

7. The photoelectric conversion device according to claim 4, wherein the amine skeleton comprises an aryl group and a heteroaryl group.

8. The photoelectric conversion device according to claim 7, wherein the aryl group and the heteroaryl group are bonded to each other to form a condensed ring.

9. The photoelectric conversion device according to claim 4, wherein the Ar is formed of a plurality of aromatic rings, and wherein the plurality of aromatic rings are bonded to each other to form a condensed ring.

10. The photoelectric conversion device according to claim 1, wherein the second organic compound has a structure represented by General Formula (G0):

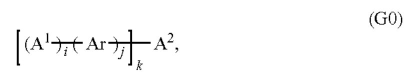

wherein $A^1$ represents an amine skeleton or a carbazolyl group, wherein the amine skeleton comprises at least one of an aryl group and a heteroaryl group, wherein the aryl group is a substituted or unsubstituted aryl group, wherein the heteroaryl group is a substituted or unsubstituted heteroaryl group, wherein the carbazolyl group is a substituted or unsubstituted carbazolyl group, wherein Ar represents a substituted or unsubstituted arylene group having 6 to 25 carbon atoms or a substituted or unsubstituted heteroarylene group having 2 to 25 carbon atoms, wherein $A^2$ represents a substituted or unsubstituted heteroaryl group having 2 to 25 carbon atoms or a substituted or unsubstituted heteroarylene group having 2 to 25 carbon atoms, wherein i is an integer greater than or equal to 1 and less than or equal to 5, wherein j is an integer greater than or equal to 0 and less than or equal to 2, and wherein k is an integer greater than or equal to 1 and less than or equal to 6.

11. The photoelectric conversion device according to claim 10, wherein the amine skeleton comprises a plurality of aryl groups or a plurality of heteroaryl groups.

12. The photoelectric conversion device according to claim 11, wherein the plurality of aryl groups are bonded to each other to form a condensed ring, and wherein the plurality of heteroaryl groups are bonded to each other to form a condensed ring.

13. The photoelectric conversion device according to claim 10, wherein the amine skeleton comprises an aryl group and a heteroaryl group.

14. The photoelectric conversion device according to claim 13, wherein the aryl group and the heteroaryl group are bonded to each other to form a condensed ring.

15. The photoelectric conversion device according to claim 10, wherein the Ar is formed of a plurality of aromatic rings, and wherein the plurality of aromatic rings are bonded to each other to form a condensed ring.

16. A display device comprising a pixel set, wherein the pixel set comprises a first pixel and a second pixel, wherein the first pixel comprises a light-emitting device, wherein the second pixel comprises the photoelectric conversion device according to claim 1, and wherein the light-emitting device is adjacent to the photoelectric conversion device.

17. The display device according to claim 16, further comprising a first functional layer and a second functional layer, wherein the first functional layer overlaps with the second functional layer, wherein the first pixel comprises a first pixel circuit, wherein the first pixel circuit is electrically connected to the light-emitting device, wherein the second pixel comprises a second pixel circuit, wherein the second pixel circuit is electrically connected to the photoelectric conversion device, wherein the first functional layer comprises the photoelectric conversion device and the light-emitting device, and wherein the second functional layer comprises the first pixel circuit and the second pixel circuit.

18. The display device according to claim 16, wherein the light-emitting device comprises a third electrode, a fourth electrode, and a second unit, wherein the second unit is interposed between the third electrode and the fourth electrode, wherein the second unit comprises a fifth layer, a sixth layer, and the first layer, wherein the fifth layer is interposed between the sixth layer and the first layer, wherein the fifth layer comprises a light-emitting material, wherein the sixth layer is interposed between the fifth layer and the third electrode, wherein the sixth layer comprises a material with a hole-transport property, and wherein the first layer is interposed between the fourth electrode and the fifth layer.

* * * * *